(12) United States Patent
Petrov

(10) Patent No.: US 9,130,814 B2
(45) Date of Patent: Sep. 8, 2015

(54) INTERLEAVING METHOD AND DEINTERLEAVING METHOD

(75) Inventor: Mihail Petrov, Langen (DE)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 13/824,791

(22) PCT Filed: Aug. 9, 2012

(86) PCT No.: PCT/JP2012/005085
§ 371 (c)(1),
(2), (4) Date: Mar. 18, 2013

(87) PCT Pub. No.: WO2013/024584
PCT Pub. Date: Feb. 21, 2013

(65) Prior Publication Data
US 2013/0216001 A1    Aug. 22, 2013

(30) Foreign Application Priority Data

Aug. 17, 2011 (EP) .................................... 11177841
Oct. 28, 2011 (EP) .................................... 11008671

(51) Int. Cl.
| | |
|---|---|
| H04L 27/36 | (2006.01) |
| H04L 27/34 | (2006.01) |
| H03M 13/03 | (2006.01) |
| H03M 13/11 | (2006.01) |

(Continued)

(52) U.S. Cl.
CPC ............. *H04L 27/34* (2013.01); *H03M 13/036* (2013.01); *H03M 13/116* (2013.01); *H03M 13/1165* (2013.01); *H03M 13/255* (2013.01); *H03M 13/271* (2013.01); *H03M 13/2707* (2013.01); *H04L 1/007* (2013.01); *H04L 1/0071* (2013.01); *H04L 1/0058* (2013.01)

(58) Field of Classification Search
USPC .......................................................... 375/295
See application file for complete search history.

(56) References Cited

U.S. PATENT DOCUMENTS

2006/0013250 A1* 1/2006 Howard et al. ................ 370/465
2006/0223460 A1* 10/2006 Himayat et al. .............. 455/101

(Continued)

FOREIGN PATENT DOCUMENTS

| EP | 2 254 249 | 11/2010 |
|---|---|---|
| EP | 2 254 250 | 11/2010 |

(Continued)

OTHER PUBLICATIONS

Fossorier, Quasi-Cyclic Low-Density Parity-Check Codes From Circulant Permutation Matrices, Aug. 2004, IEEE Transactions on Infermation Therory, vol. 50.*

(Continued)

*Primary Examiner* — Chieh M Fan
*Assistant Examiner* — Wednel Cadeau
(74) *Attorney, Agent, or Firm* — Wenderoth, Lind & Ponack, L.L.P.

(57) ABSTRACT

An interleaving method performed by a transmitter for a communication system with quasi-cyclic low-density parity-check codes, spatial multiplexing, and T transmit antennas is used for applying permutation to N cyclic blocks of a codeword in order to map bits of the permutated cyclic blocks onto T constellation words constituting multiple spatial-multiplexing blocks from the codeword. Each cyclic block consists of Q bits.

12 Claims, 46 Drawing Sheets

(51) Int. Cl.
  *H03M 13/25* (2006.01)
  *H03M 13/27* (2006.01)
  *H04L 1/00* (2006.01)

(56) References Cited

U.S. PATENT DOCUMENTS

| | | |
|---|---|---|
| 2009/0125780 A1 | 5/2009 | Taylor et al. |
| 2010/0257426 A1 | 10/2010 | Yokokawa et al. |
| 2010/0269019 A1 | 10/2010 | Yokokawa et al. |
| 2010/0275100 A1 | 10/2010 | Yokokawa et al. |
| 2010/0275101 A1 | 10/2010 | Yokokawa et al. |
| 2010/0281329 A1 | 11/2010 | Yokokawa et al. |
| 2010/0299572 A1 | 11/2010 | Yokokawa et al. |
| 2010/0325512 A1 | 12/2010 | Yokokawa et al. |

FOREIGN PATENT DOCUMENTS

| | | |
|---|---|---|
| JP | 2008-125085 | 5/2008 |
| WO | 2009/116204 | 9/2009 |

OTHER PUBLICATIONS

International Search Report issued Oct. 23, 2012 in corresponding International Application No. PCT/JP2012/005085.
Catherine Douillard et al., "The Bit Interleaved Coded Modulation Module for DVB-NGH: Enhanced features for mobile reception", Telecommunications (ICT), 19$^{th}$ International Conference, Apr. 23, 2012.
ETSI EN 302 755, V1.2.1, "Digital Video Broadcasting (DVB); Frame structure channel coding and modulation for a second generation digital terrestrial television broadcasting system (DVB-T2)", Feb. 2011.
ETSI EN 302 307, V1.2.1, "Digital Video Broadcasting (DVB); Second generation framing structure, channel coding and modulation systems for Broadcasting, Interactive Services, News Gathering and other broadband satellite applications (DVB-S2)", Aug. 2009.
ETSI EN 302 769, V1.2.1, "Digital Video Broadcasting (DVB); Frame structure channel coding and modulation for a second generation digital transmission system for cable systems (DVB-C2)", Apr. 2011.
Frank Kienle et al., "Macro Interleaver Design for Bit Interleaved Coded Modulation with Low-Density Parity-Check Codes", Vehicular Technology Conference, 2008, VTC Spring 2008 IEEE, IEEE, Piscataway, NJ, USA, May 11, 2008, pp. 763-766, XP031255631, ISBN: 978-1-4244-1644-8 *sections I and IV*.
Song-Nam Hong et al., "Quasi-Cyclic Low-Density Parity-Check Codes for Space-Time Bit-Interleaved Coded Modulation", IEEE Communications Letters, IEEE Service Center, Piscataway, NJ, US, vol. 10, No. 10, Oct. 1, 2008, pp. 767-769, XP011236170, ISSN: 1089-7798, DOI: 10.1109/LCOMM.2008.080902 *section II*.
"IEEE Standard for Local and metropolitan area networks Part 16: Air Interface for Broadband Wireless Access Systems; IEEE Std 802.16/2009 (Revision of IEEE Std 802.16-2004)", Standard No. IEEE Std 802.16-2009, May 29, 2009, IEEE, New York, USA, pp. C1-2004, XP017604205, ISBN: 978-0-7381-5919-5 *sections 8.4. 9.3 and 8.4.9.4*.
Extended European Search Report issued Mar. 12, 2012 in corresponding European Application No. 11177841.1.
Extended European Search Report issued Mar. 12, 2012 in corresponding European Application No. 11008671.7.
Extended European Search Report issued Mar. 12, 2014 in corresponding European Application No. 12824056.1.

* cited by examiner

FIG. 4

| QB | Check-node indices for the first bit in each cyclic block QB | | | | |
|---|---|---|---|---|---|
| 1 | 13 | 24 | 27 | 31 | 47 |
| 2 | 4 | 7 | 8 | 22 | 43 |
| 3 | 2 | 15 | 20 | 33 | 35 |
| 4 | 3 | 26 | 29 | | |
| 5 | 12 | 20 | 22 | | |
| 6 | 11 | 22 | 30 | | |
| 7 | 15 | 24 | 38 | | |
| 8 | 13 | 28 | 47 | | |
| 9 | 31 | 42 | 44 | | |
| 10 | 5 | 21 | 39 | | |
| 11 | 16 | 28 | 30 | | |
| 12 | 6 | 19 | 23 | | |

FIG. 8

LDPC code of rate 5/15 (1/3)

| QB | Check-node indices for the first bit in each cyclic block QB |
|---|---|
| 1 | 416 2560 2912 3112 3216 4156 4969 6405 6723 6912 8593 8909 |
| 2 | 2226 2957 3011 3575 4339 5485 6031 6396 7288 8978 9312 10218 |
| 3 | 434 1114 1965 2291 3383 3536 4290 5139 9384 10008 10059 10147 |
| 4 | 743 1941 2797 3693 3840 4582 5140 5420 6215 7077 7615 8716 |
| 5 | 1515 1831 3441 4306 4879 4946 5383 6110 7404 8551 9569 10472 |
| 6 | 1505 5682 7778 |
| 7 | 6623 6830 7172 |
| 8 | 3505 3941 7281 |
| 9 | 914 8669 10270 |
| 10 | 3622 7563 9388 |
| 11 | 4554 5058 9930 |
| 12 | 2707 4844 9609 |
| 13 | 1714 3237 6883 |
| 14 | 3878 4768 10017 |
| 15 | 3334 8267 10127 |

FIG. 9

LDPC code of rate 6/15 (2/5)

| QB | Check-node indices for the first bit in each cyclic block QB |
|---|---|
| 1 | 583 635 738 1344 1767 4143 5650 6658 6720 6922 8071 8750 |
| 2 | 415 857 1685 1770 2605 3207 5023 5608 5696 6915 7019 8016 |
| 3 | 771 886 1802 1866 1931 2190 3992 6137 7258 7792 8841 8970 |
| 4 | 2254 3781 4108 4428 5396 5867 6810 7577 7766 8226 8827 9322 |
| 5 | 227 324 888 4247 4367 4774 5864 6405 7889 8821 8963 9660 |
| 6 | 500 806 1811 1928 2227 2520 3134 4030 4824 5140 9330 9693 |
| 7 | 1435 1652 8171 |
| 8 | 3366 3745 6543 |
| 9 | 4645 8509 9286 |
| 10 | 5790 7397 8972 |
| 11 | 1799 4422 6597 |
| 12 | 3847 4041 9276 |
| 13 | 4946 7378 8683 |
| 14 | 1993 5384 9186 |
| 15 | 5646 6724 9015 |
| 16 | 4439 4502 8474 |
| 17 | 5107 7342 9442 |
| 18 | 1387 2660 8910 |

FIG. 10

LDPC code of rate 7/15

Check-node indices for the first bit in each cyclic block QB

| QB | Check-node indices |
|---|---|
| 1 | 3 137 314 327 983 1597 2028 3043 3217 4109 6020 6178 6535 6560 7146 7180 7408 7790 7893 8123 8313 8526 8616 8638 |
| 2 | 356 1197 1208 1839 1903 2712 3088 3537 4091 4301 4919 5068 6025 6195 6324 6378 6686 6829 7558 7745 8042 8382 8587 8602 |
| 3 | 18 187 1115 1417 2300 2328 3502 3805 4677 4827 5551 5968 6394 6412 6753 7169 7524 7695 7976 8069 8118 8522 8539 8562 |
| 4 | 714 2713 2726 2964 3055 3220 3459 5557 5765 5841 6290 6419 6573 6856 7786 7937 8156 8286 8327 8384 8448 8539 |
| 5 | 3452 7935 8092 8623 |
| 6 | 56 1955 3000 8242 |
| 7 | 1809 4094 7991 8489 |
| 8 | 2220 6455 7849 8548 |
| 9 | 1006 2576 3247 6976 |
| 10 | 2177 6048 7795 8295 |
| 11 | 1413 2595 7446 8594 |
| 12 | 2101 3714 7541 8531 |
| 13 | 10 5961 7484 |
| 14 | 3144 4636 5282 |
| 15 | 5708 5875 8390 |
| 16 | 3322 5223 7975 |
| 17 | 197 4653 8283 |
| 18 | 598 5393 8624 |
| 19 | 906 7249 7542 |
| 20 | 1223 2148 8195 |
| 21 | 976 2001 5005 |

FIG. 11

LDPC code of rate 8/15

| QB | Check-node indices for the first bit in each cyclic block QB |
|----|---|
| 1  | 32 384 430 591 1296 1976 1999 2137 2175 3638 4214 4304 4486 4662 4999 5174 5700 6969 7115 7138 7189 |
| 2  | 1788 1881 1910 2724 4504 4928 4973 5616 5686 5718 5846 6523 6893 6994 7074 7100 7277 7399 7476 7480 7537 |
| 3  | 2791 2824 2927 4196 4298 4800 4948 5361 5401 5688 5818 5862 5969 6029 6244 6645 6962 7203 7302 7454 7534 |
| 4  | 574 1461 1826 2069 2387 3349 3366 4951 5688 5826 5834 5903 5903 6640 6762 6786 6859 7043 7418 7431 7554 |
| 5  | 14 178 675 823 890 930 1209 1311 2898 4239 4600 5203 6485 6549 6970 7208 7218 7298 7454 7457 7462 |
| 6  | 4075 4188 7313 7553 |
| 7  | 5145 6018 7148 7507 |
| 8  | 3198 4858 6983 7033 |
| 9  | 3170 5126 5625 6901 |
| 10 | 2839 6093 7071 7450 |
| 11 | 11 3735 5413 |
| 12 | 2497 5400 7238 |
| 13 | 2067 5172 5714 |
| 14 | 1889 7173 7329 |
| 15 | 1795 2773 3499 |
| 16 | 2695 2944 6735 |
| 17 | 3221 4625 5897 |
| 18 | 1690 6122 6816 |
| 19 | 5013 6639 7358 |
| 20 | 1601 6849 7415 |
| 21 | 2180 7389 7543 |
| 22 | 2121 6838 7054 |
| 23 | 1948 3109 5046 |
| 24 | 272 1015 7464 |

FIG. 12

LDPC code of rate 9/15(3/5)

| QB | Check-node indices for the first bit in each cyclic block QB |
|---|---|
| 1  | 71   1478 1901 2240 2649 2725 3592 3708 3965 4080 5733 6198 |
| 2  | 393  1384 1435 1878 2773 3182 3586 5465 6091 6110 6114 6327 |
| 3  | 160  1149 1281 1526 1566 2129 2929 3095 3223 4250 4276 4612 |
| 4  | 289  1446 1602 2421 3559 3796 5590 5750 5763 6168 6271 6340 |
| 5  | 947  1227 2008 2020 2266 3365 3588 3867 4172 4250 4865 6290 |
| 6  | 3324 3704 4447 |
| 7  | 1206 2565 3089 |
| 8  | 529  4027 5891 |
| 9  | 141  1187 3206 |
| 10 | 1990 2972 5120 |
| 11 | 752  796  5976 |
| 12 | 1129 2377 4030 |
| 13 | 6077 6108 6231 |
| 14 | 61   1053 1781 |
| 15 | 2820 4109 5307 |
| 16 | 2088 5834 5988 |
| 17 | 3725 3945 4010 |
| 18 | 1081 2780 3389 |
| 19 | 659  2221 4822 |
| 20 | 3033 6060 6160 |
| 21 | 756  1489 2350 |
| 22 | 3350 3624 5470 |
| 23 | 357  1825 5242 |
| 24 | 585  3372 6062 |
| 25 | 561  1417 2348 |
| 26 | 971  3719 5567 |
| 27 | 1005 1675 2062 |

FIG. 13

LDPC code of rate 10/15 (2/3)

| QB | Check-node indices for the first bit in each cyclic block QB |
|---|---|
| 1  | 0  1286 1460 1548 1613 2084 2481 2622 3196 3369 3451 4297 4620 |
| 2  | 1  122  373  971 1407 1516 1847 2880 3108 3448 3529 3799 4358 |
| 3  | 2  107  164  259  864  929 2350 2650 3125 3399 3833 3996 5287 |
| 4  | 3  342 3529 |
| 5  | 4 2147 4198 |
| 6  | 5 1880 4836 |
| 7  | 6 3864 4910 |
| 8  | 7  243 1542 |
| 9  | 8 1436 3011 |
| 10 | 9 2167 2512 |
| 11 | 10 1003 4606 |
| 12 | 11  705 2835 |
| 13 | 12 2365 3426 |
| 14 | 13 2474 3848 |
| 15 | 14 1360 1743 |
| 16 | 0  163 2536 |
| 17 | 1 1180 2583 |
| 18 | 2  509 1542 |
| 19 | 3 1005 4418 |
| 20 | 4 5117 5212 |
| 21 | 5 2155 2922 |
| 22 | 6  347 2696 |
| 23 | 7  226 4296 |
| 24 | 8  487 1560 |
| 25 | 9 1640 3926 |
| 26 | 10  149 2928 |
| 27 | 11  563 2364 |
| 28 | 12  635  688 |
| 29 | 13  231 1684 |
| 30 | 14 1129 3894 |

FIG. 14

LDPC code of rate 11/15

| QB | Check-node indices for the first bit in each cyclic block QB |
|---|---|
| 1 | 3 478 554 683 1009 1481 1801 1924 2616 3198 3437 4207 |
| 2 | 4 2135 2681 |
| 3 | 5 3107 4027 |
| 4 | 6 2637 3373 |
| 5 | 7 3449 3830 |
| 6 | 8 2060 4129 |
| 7 | 9 2742 4184 |
| 8 | 10 1070 3946 |
| 9 | 11 984 2239 |
| 10 | 0 1458 3031 |
| 11 | 1 1328 3003 |
| 12 | 2 1137 1716 |
| 13 | 3 132 3725 |
| 14 | 4 638 1817 |
| 15 | 5 1774 3447 |
| 16 | 6 1257 3632 |
| 17 | 7 542 3694 |
| 18 | 8 1015 1945 |
| 19 | 9 412 1948 |
| 20 | 10 995 2238 |
| 21 | 11 1907 4141 |
| 22 | 0 2480 3079 |
| 23 | 1 1088 3021 |
| 24 | 2 713 1379 |
| 25 | 3 997 3903 |
| 26 | 4 2323 3361 |
| 27 | 5 986 1110 |
| 28 | 6 142 2532 |
| 29 | 7 1690 2405 |
| 30 | 8 1298 1881 |
| 31 | 9 174 615 |
| 32 | 10 1648 3112 |
| 33 | 11 1415 2808 |

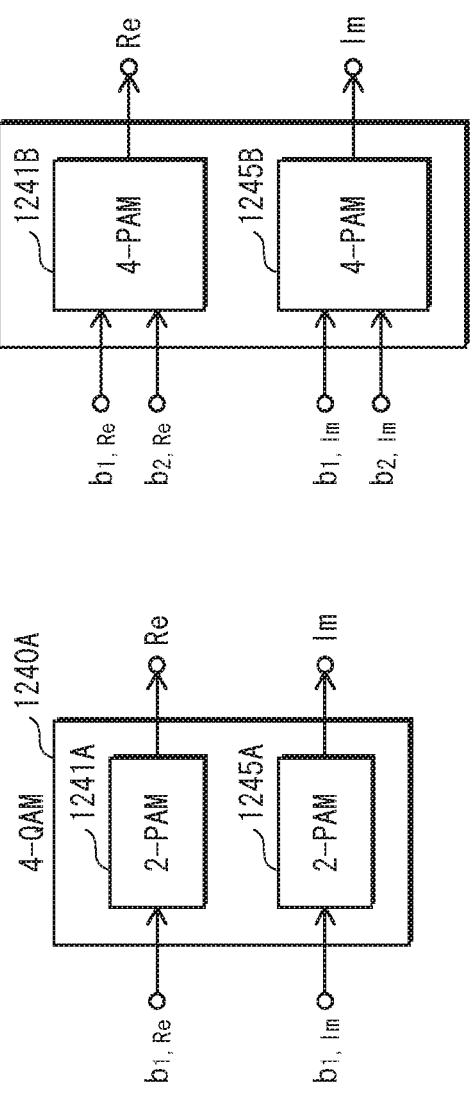

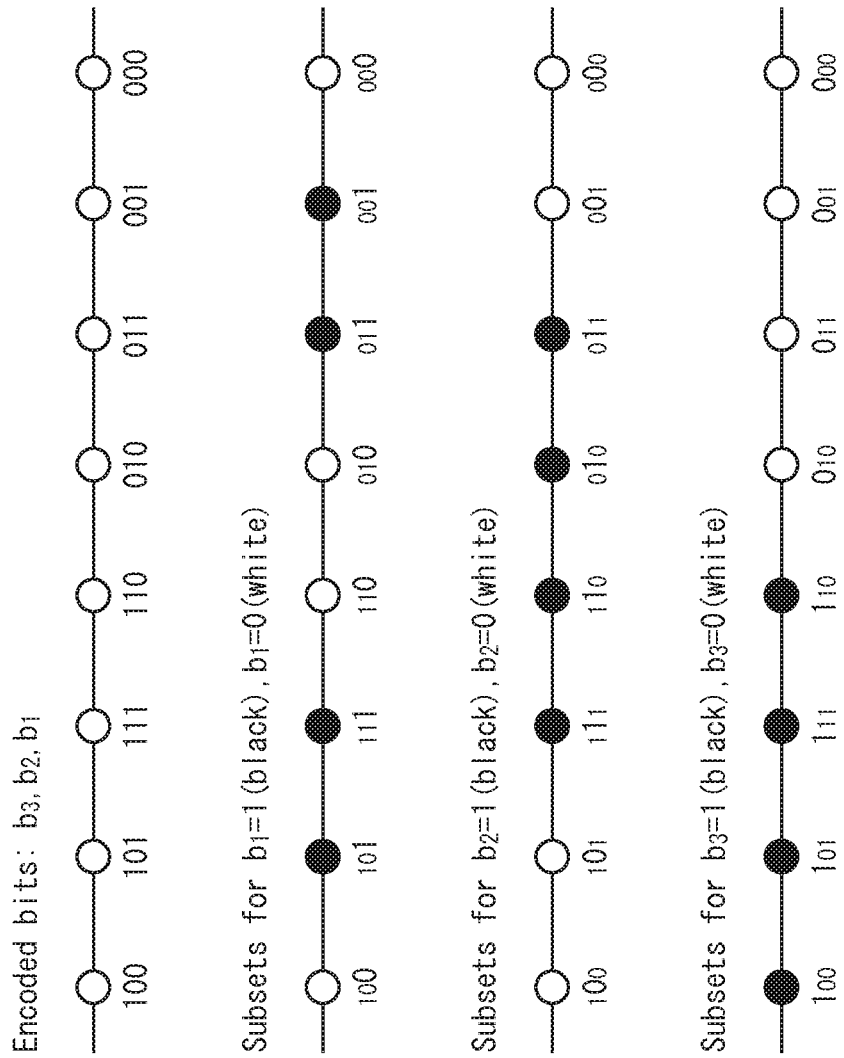

| | | | | | | | | | |
|---|---|---|---|---|---|---|---|---|---|
| QB$_1$ | b$_{1,Re}$ | b$_{1,Im}$ | | | | | | | ⎫ S$_1$ ⎬ ⎫
| QB$_2$ | b$_{2,Re}$ | b$_{2,Im}$ | | | | | | | ⎭ ⎪
| QB$_3$ | b$_{1,Re}$ | b$_{1,Im}$ | | | | | | | ⎫ ⎬ Section 1
| QB$_4$ | b$_{2,Re}$ | b$_{2,Im}$ | | | | | | | ⎬ S$_2$ ⎪
| QB$_5$ | b$_{3,Re}$ | b$_{3,Im}$ | | | | | | | ⎭ ⎭
| QB$_6$ | | | | | | | | | ⎫
| QB$_7$ | | | | | | | | | ⎬ S$_1$ ⎫
| QB$_8$ | | | | | | | | | ⎭ ⎬ Section 2
| QB$_9$ | | | | | | | | | ⎫ S$_2$ ⎪
| QB$_{10}$ | | | | | | | | | ⎭ ⎭
| QB$_{11}$ | | | | | | | | | ⎫ S$_1$ ⎫
| QB$_{12}$ | | | | | | | | | ⎭ ⎬
| QB$_{13}$ | | | | | | | | | ⎫ ⎬ Section 3
| QB$_{14}$ | | | | | | | | | ⎬ S$_2$ ⎪
| QB$_{15}$ | | | | | | | | | ⎭ ⎭

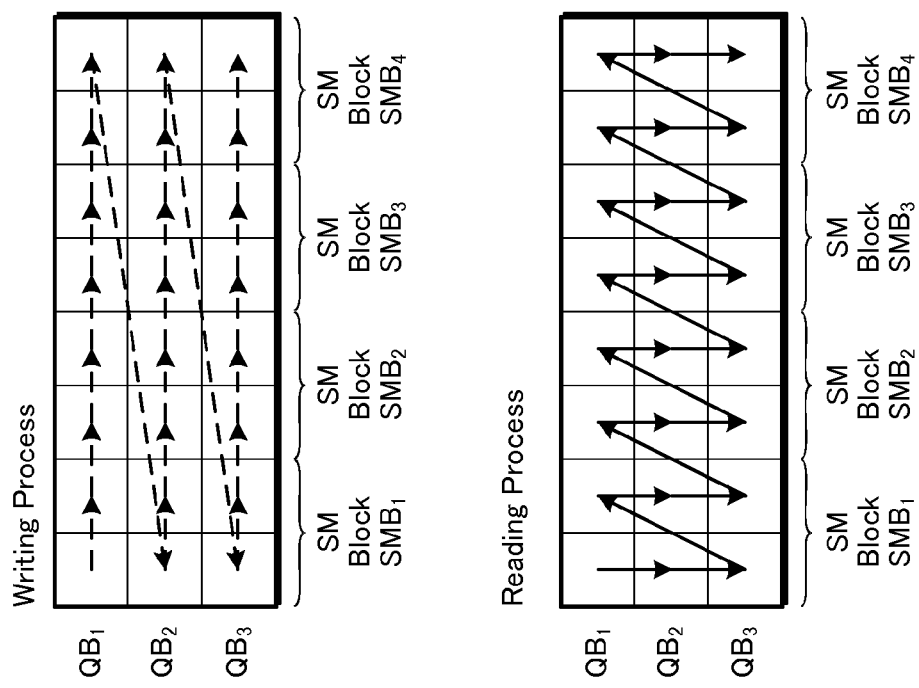

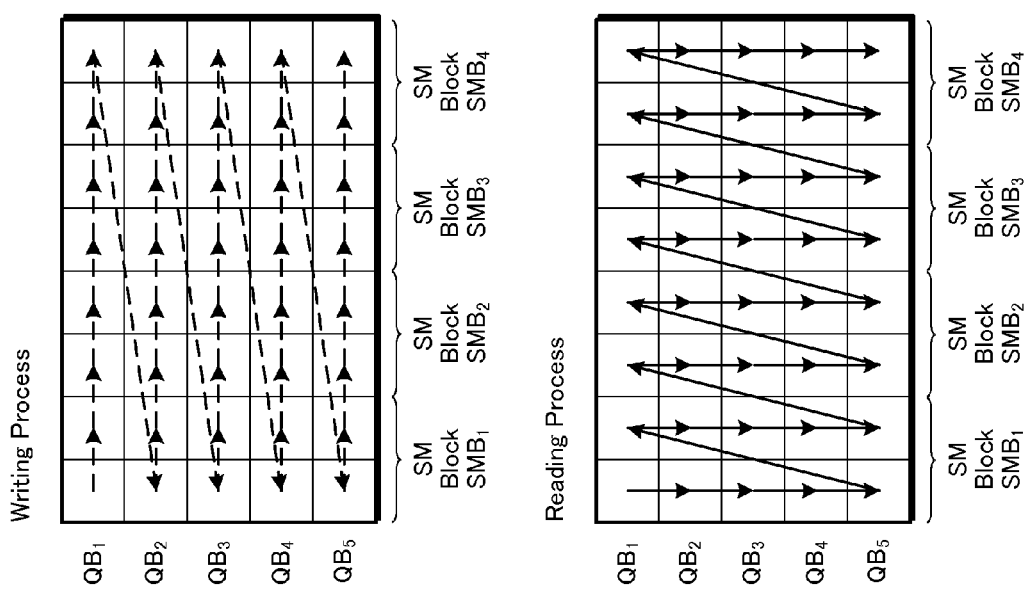

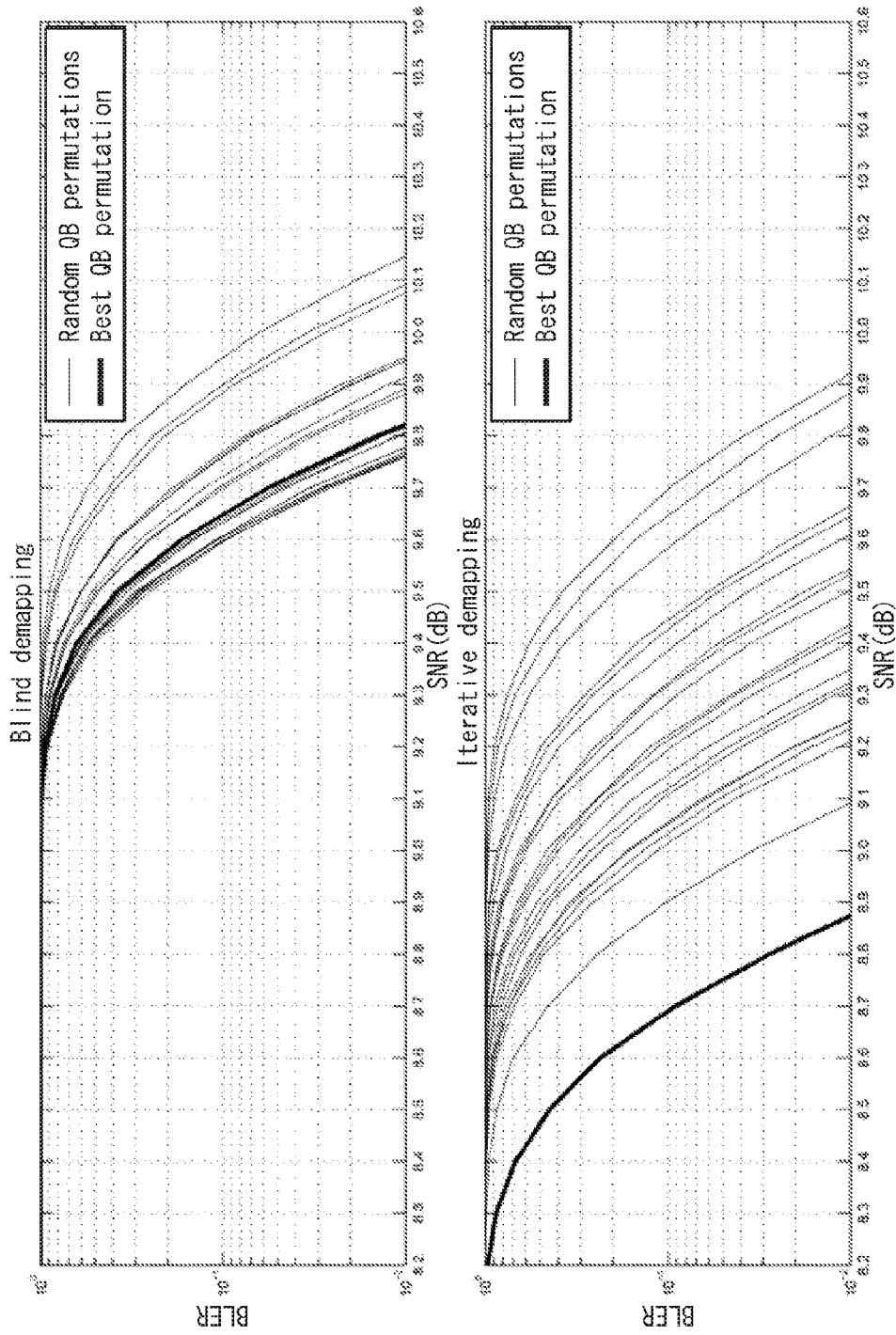

FIG. 28A

|  |  | Section |  |  |  |  |  |  |  |  |  |  |
|---|---|---|---|---|---|---|---|---|---|---|---|---|
|  |  | 1 | 2 | 3 | 4 | 5 | 6 | 7 | 8 | 9 | 10 | 11 |
| $S_1$ | $b_{1,Re}, b_{1,Im}$ | 6 | 34 | 43 | 12 | 40 | 8 | 7 | 44 | 29 | 23 | 27 |
| | $b_{2,Re}, b_{2,Im}$ | 3 | 20 | 25 | 21 | 13 | 30 | 11 | 39 | 19 | 33 | 14 |
| $S_2$ | $b_{1,Re}, b_{1,Im}$ | 38 | 2 | 28 | 35 | 37 | 9 | 10 | 24 | 36 | 17 | 31 |
| | $b_{2,Re}, b_{2,Im}$ | 4 | 26 | 32 | 41 | 15 | 16 | 42 | 22 | 1 | 18 | 5 |

FIG. 28B

|  |  | Section |  |  |  |  |  |  |  |  |  |  |
|---|---|---|---|---|---|---|---|---|---|---|---|---|
|  |  | 1 | 2 | 3 | 4 | 5 | 6 | 7 | 8 | 9 | 10 | 11 |
| $S_1$ | $b_{1,Re}, b_{1,Im}$ | 6 | 34 | 43 | 12 | 40 | 8 | 10 | 44 | 29 | 23 | 27 |
| | $b_{2,Re}, b_{2,Im}$ | 3 | 20 | 25 | 21 | 13 | 30 | 11 | 39 | 19 | 33 | 14 |
| $S_2$ | $b_{1,Re}, b_{1,Im}$ | 38 | 2 | 28 | 35 | 37 | 9 | 42 | 24 | 36 | 17 | 31 |
| | $b_{2,Re}, b_{2,Im}$ | 4 | 26 | 32 | 41 | 15 | 16 | 7 | 22 | 1 | 18 | 5 |

FIG. 28C

|  |  | Section |  |  |  |  |  |  |  |  |  |  |
|---|---|---|---|---|---|---|---|---|---|---|---|---|
|  |  | 1 | 2 | 3 | 4 | 5 | 6 | 7 | 8 | 9 | 10 | 11 |
| $S_1$ | $b_{1,Re}, b_{1,Im}$ | 10 | 40 | 43 | 29 | 23 | 6 | 44 | 27 | 8 | 34 | 12 |
| | $b_{2,Re}, b_{2,Im}$ | 11 | 19 | 3 | 14 | 30 | 33 | 20 | 25 | 39 | 21 | 13 |
| $S_2$ | $b_{1,Re}, b_{1,Im}$ | 37 | 35 | 31 | 36 | 28 | 38 | 24 | 42 | 17 | 2 | 9 |
| | $b_{2,Re}, b_{2,Im}$ | 41 | 5 | 7 | 15 | 4 | 22 | 32 | 18 | 1 | 16 | 26 |

FIG. 29A

Tx power ratio: 1/1    Bits per channel: 6

QB Permutations

| CR | Section 1 | Section 2 | Section 3 | Section 4 | Section 5 | Section 6 | Section 7 | Section 8 | Section 9 | Section 10 | Section 11 | Section 12 | Section 13 | Section 14 | Section 15 |
|---|---|---|---|---|---|---|---|---|---|---|---|---|---|---|---|
| 1/3 | 17 5 34 | 33 28 22 | 13 32 14 | 44 7 27 | 23 18 41 | 10 35 9 | 21 15 45 | 42 26 31 | 39 29 12 | 4 1 2 | 40 36 19 | 20 43 9 | 16 3 24 | 11 37 25 | 30 8 6 |
| 2/5 | 20 16 34 | 41 28 36 | 45 42 32 | 2 1 8 | 30 12 9 | 14 6 35 | 38 10 8 | 6 5 22 | 24 13 31 | 27 23 40 | 39 18 33 | 3 25 7 | 21 36 44 | 17 26 37 | 11 4 |
| 7/15 | 13 11 44 | 24 12 16 | 45 22 39 | 2 32 5 | 39 29 10 | 9 6 35 | 37 10 8 | 3 38 1 | 7 42 26 | 15 28 41 | 43 4 44 | 25 20 30 | 7 21 36 | 31 33 18 | 19 11 |
| 8/15 | 12 27 14 | 41 35 13 | 28 16 27 | 5 17 29 | 14 19 12 | 45 21 17 | 4 2 28 | 17 15 41 | 42 22 6 | 28 41 42 | 11 18 26 | 2 1 37 | 26 29 3 | 23 5 20 | 1 45 |
| 3/5 | 32 38 25 | 18 28 34 | 7 39 33 | 19 43 40 | 29 44 12 | 4 17 21 | 33 5 24 | 4 36 41 | 31 6 27 | 45 8 37 | 43 11 26 | 22 16 2 | 1 3 38 | 9 23 4 | 35 37 |
| 2/3 | 19 33 10 | 14 34 27 | 3 40 20 | 36 32 16 | 17 43 7 | 9 26 15 | 44 11 40 | 42 31 24 | 6 41 8 | 13 25 24 | 18 23 1 | 45 30 2 | 38 12 29 | 22 35 28 | 37 31 |
| 11/15 | 5 35 39 | 16 44 4 | 25 17 4 | 32 13 12 | 26 45 10 | 6 15 21 | 43 27 40 | 33 24 27 | 2 28 41 | 38 19 29 | 36 7 20 | 34 23 1 | 18 22 42 | 9 37 37 | 31 |

FIG. 29B

Tx power ratio: 1/1   Bits per channel: 8

| CR | QB Permutations ||||||||||||
| --- | --- | --- | --- | --- | --- | --- | --- | --- | --- | --- | --- |
| | Section 1 | Section 2 | Section 3 | Section 4 | Section 5 | Section 6 | Section 7 | Section 8 | Section 9 | Section 10 | Section 11 |
| 1/3 | 9 37 33 39 | 3 38 28 14 | 4 7 12 6 | 13 35 8 23 | 19 32 42 25 | 41 10 44 30 | 24 31 40 27 | 15 26 21 29 | 5 17 11 34 | 22 16 2 45 | 
| 2/5 | 7 21 43 35 | 27 4 24 5 | 1 20 36 | 16 20 30 10 | 17 42 41 3 | 31 36 22 9 | 23 12 37 18 | 1 19 40 22 | 29 9 38 8 | 6 34 14 26 | 39 3 25 32 33 11 2 45 |
| 7/15 | 8 12 38 21 | 28 19 24 6 | 31 17 27 20 | 15 13 31 22 | 26 15 7 30 | 29 18 16 3 | 44 23 37 43 9 | 14 10 34 36 22 13 40 45 |
| 8/15 | 17 39 38 26 | 41 10 33 6 | 42 22 5 14 | 37 1 4 44 | 24 38 25 | 11 12 2 36 | 29 15 7 20 | 23 30 7 | 16 11 9 | 32 21 35 18 19 45 |
| 3/5 | 24 3 15 2 | 40 11 29 18 | 3 16 34 | 25 40 38 25 | 28 5 10 | 32 7 23 9 6 17 | 30 26 43 8 | 20 27 45 |
| 2/3 | 40 38 36 35 | 1 23 18 9 | 27 2 19 43 | 44 14 19 10 | 25 20 6 37 | 7 41 39 42 17 14 22 12 | 13 39 5 34 26 13 30 33 44 45 |
| 11/15 | 15 5 37 20 | 33 1 43 | 24 34 21 | 30 27 7 | 41 41 36 | 40 11 19 32 28 23 8 22 38 35 | 2 42 13 14 26 39 3 31 6 10 9 45 |

FIG. 29C

Tx power ratio: 1/1    Bits per channel: 10

| CR | QB Permutations | | | | | | | | |
|---|---|---|---|---|---|---|---|---|---|
| | Section 1 | Section 2 | Section 3 | Section 4 | Section 5 | Section 6 | Section 7 | Section 8 | Section 9 |
| 1/3 | 27 17 42 8 30 | 38 6 15 32 36 | 22 18 40 26 14 | 41 45 29 23 9 | 20 4 44 37 2 | 43 12 11 10 28 | 21 16 5 13 31 | 33 3 1 35 7 | 39 34 24 19 25 |
| 2/5 | 23 27 11 16 42 | 19 25 44 39 33 | 34 32 22 35 12 | 10 2 24 1 29 | 9 14 28 37 29 | 36 20 7 8 13 | 3 17 40 41 31 | 30 5 6 15 21 | 45 26 38 43 18 |
| 7/15 | 9 1 33 4 20 | 16 29 41 38 6 | 19 14 35 30 39 | 43 15 27 44 10 | 11 3 24 18 7 | 45 8 37 34 22 | 2 40 36 12 17 | 42 25 13 32 26 | 28 21 26 5 23 |
| 8/15 | 27 3 43 12 17 | 18 8 40 22 15 | 31 7 41 29 21 | 30 6 26 28 36 | 39 9 19 16 32 | 5 13 24 1 4 | 10 23 14 35 2 | 42 37 44 38 34 | 11 45 25 20 33 |
| 3/5 | 17 28 39 7 14 | 29 16 35 41 45 | 2 5 18 1 32 | 21 13 37 34 20 | 6 25 40 12 6 | 30 31 24 8 42 | 3 9 11 27 22 | 44 15 38 43 10 | 19 43 36 26 |
| 2/3 | 38 30 11 27 17 | 16 22 45 21 44 | 23 2 35 19 15 | 12 39 13 40 17 | 42 36 14 18 34 | 28 31 24 30 43 | 15 26 9 20 12 | 38 29 25 32 16 | 33 4 43 41 23 |
| 11/15 | 27 4 28 37 39 | 44 8 1 18 41 | 45 29 42 19 15 | 9 40 17 33 31 | 36 14 35 7 25 | 14 3 6 20 22 | 36 38 18 5 | 13 24 26 11 23 |

FIG. 30A

Tx power ratio: 1/2    Bits per channel: 6

QB Permutations

| CR | Section 1 | Section 2 | Section 3 | Section 4 | Section 5 | Section 6 | Section 7 | Section 8 | Section 9 | Section 10 | Section 11 | Section 12 | Section 13 | Section 14 | Section 15 |
|---|---|---|---|---|---|---|---|---|---|---|---|---|---|---|---|
| 1/3 | 23 40 | 15 19 | 21 44 | 9 10 11 | 36 18 38 | 32 35 39 | 31 16 33 | 42 30 1 | 7 34 43 | 45 17 28 | 22 8 4 | 2 14 24 | 41 37 25 | 7 21 26 | 5 3 6 | 13 29 |
| 2/5 | 20 16 | 34 41 | 28 36 | 19 35 43 | 2 1 8 | 30 12 9 | 14 38 10 | 15 6 5 | 24 13 31 | 32 23 27 | 40 39 18 | 33 3 29 | 25 7 44 | 17 26 37 | 11 4 |
| 7/15 | 34 13 | 24 16 | 40 23 | 38 2 1 | 36 9 6 | 42 44 8 | 45 24 10 | 43 33 5 | 41 32 15 | 29 45 26 | 37 18 26 | 17 10 | 30 11 14 | 20 7 3 | 35 4 | 39 25 12 |
| 8/15 | 8 25 | 22 18 | 28 20 | 3 21 9 | 27 6 42 | 45 32 11 | 6 2 13 | 5 41 32 | 2 10 | 40 29 13 | 9 38 14 | 1 34 5 | 35 36 21 | 42 17 41 | 12 16 30 | 35 4 | 15 44 43 |
| 3/5 | 31 43 | 20 44 | 5 39 | 37 12 36 | 34 42 40 | 11 34 | 9 13 45 | 29 13 22 | 6 16 | 8 30 19 | 38 6 | 4 2 10 | 5 23 | 14 17 | 41 24 | 35 3 23 | 15 33 25 |
| 2/3 | 10 24 | 31 4 | 43 22 34 | 21 12 | 11 4 35 | 41 15 | 20 29 8 | 16 2 | 27 25 | 33 45 30 | 28 37 | 1 14 7 | 3 26 | 42 44 | 19 17 | 32 |
| 11/15 | 5 35 | 39 3 | 25 16 | 44 17 | 8 26 45 | 10 6 15 | 21 40 | 43 27 24 | 33 28 41 | 29 19 38 | 14 20 30 | 36 7 | 23 34 | 1 18 | 22 42 11 | 9 37 | 31 |

FIG. 30B

Tx power ratio: 1/2    Bits per channel: 8

| CR | Section 1 | | | | Section 2 | | | | Section 3 | | | | Section 4 | | | | Section 5 | | | | Section 6 | | | | Section 7 | | | | Section 8 | | | | Section 9 | | | | Section 10 | | | | Section 11 | | | |
|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|
| 1/3 | 4 | 16 | 25 | 1 | 19 | 42 | 36 | 8 | 13 | 34 | 41 | 6 | 17 | 9 | 12 | 3 | 35 | 32 | 22 | 2 | 39 | 11 | 21 | 33 | 15 | 23 | 44 | 18 | 26 | 40 | 43 | 24 | 10 | 5 | 28 | 20 | 29 | 31 | 7 | 27 | 30 | 38 | 45 |
| 2/5 | 7 | 21 | 43 | 35 | 27 | 4 | 24 | 5 | 16 | 20 | 30 | 10 | 44 | 41 | 12 | 37 | 31 | 36 | 13 | 39 | 12 | 37 | 18 | 1 | 19 | 40 | 22 | 29 | 38 | 8 | 6 | 34 | 14 | 26 | 3 | 43 | 25 | 32 | 28 | 33 | 11 | 2 | 45 |
| 7/15 | 41 | 14 | 33 | 22 | 27 | 10 | 21 | 12 | 35 | 19 | 34 | 8 | 20 | 28 | 24 | 29 | 32 | 31 | 36 | 13 | 4 | 3 | 30 | 44 | 6 | 7 | 23 | 9 | 38 | 16 | 2 | 36 | 15 | 39 | 43 | 38 | 16 | 40 | 9 | 31 | 18 | 45 |
| 8/15 | 28 | 29 | 19 | 32 | 35 | 43 | 44 | 16 | 21 | 38 | 41 | 5 | 42 | 41 | 5 | 37 | 15 | 9 | 20 | 25 | 10 | 40 | 4 | 34 | 3 | 31 | 2 | 23 | 42 | 25 | 17 | 26 | 2 | 36 | 13 | 1 | 33 | 39 | 23 | 36 | 11 | 32 | 24 | 45 |
| 3/5 | 27 | 20 | 32 | 18 | 41 | 33 | 6 | 12 | 35 | 21 | 14 | 9 | 16 | 40 | 43 | 13 | 26 | 34 | 8 | 11 | 28 | 1 | 8 | 19 | 44 | 3 | 38 | 11 | 39 | 10 | 24 | 30 | 1 | 24 | 29 | 25 | 17 | 7 | 5 | 15 | 4 | 2 | 45 |
| 2/3 | 2 | 23 | 3 | 16 | 1 | 12 | 19 | 17 | 30 | 41 | 43 | 24 | 42 | 34 | 13 | 5 | 40 | 5 | 6 | 29 | 36 | 10 | 22 | 32 | 29 | 36 | 10 | 38 | 39 | 21 | 14 | 44 | 18 | 7 | 26 | 4 | 31 | 9 | 6 | 37 | 27 | 25 | 20 | 45 |
| 11/15 | 15 | 5 | 37 | 20 | 18 | 43 | 1 | 33 | 12 | 29 | 30 | 27 | 21 | 24 | 34 | 7 | 44 | 41 | 36 | 25 | 16 | 40 | 11 | 28 | 19 | 32 | 28 | 8 | 22 | 38 | 35 | 17 | 2 | 42 | 13 | 14 | 26 | 39 | 3 | 31 | 6 | 10 | 9 | 45 |

QB Permutations

FIG. 30C

Tx power ratio: 1/2    Bits per channel: 10

| CR | Section 1 | Section 2 | Section 3 | Section 4 | Section 5 | Section 6 | Section 7 | Section 8 | Section 9 |
|---|---|---|---|---|---|---|---|---|---|
| | | | | | QB Permutations | | | | |
| 1/3 | 27 17 42 8 30 | 22 18 40 26 14 | 41 45 29 23 9 | 20 4 44 37 2 | 43 12 11 10 28 | 21 16 5 13 31 | 33 3 1 35 7 | 39 34 24 19 25 | |
| 2/5 | 23 27 11 16 42 | 6 15 32 36 38 | 4 2 24 1 10 | 9 14 28 37 29 | 36 20 7 8 13 | 3 17 40 41 31 | 30 5 6 15 21 | 45 26 38 43 18 | |
| 7/15 | 43 20 44 31 7 | 19 25 44 39 33 | 34 21 27 17 4 | 33 32 2 38 1 | 39 10 36 11 8 | 6 24 41 15 5 | 18 25 45 13 29 | 45 14 9 30 37 12 | |
| 8/15 | 31 43 28 25 10 | 26 23 3 38 13 | 12 16 30 15 5 | 7 14 34 18 6 | 39 17 42 27 24 | 3 9 11 26 23 | 32 3 22 41 6 | 8 19 29 37 2 | |
| 3/5 | 17 28 39 7 14 | 35 16 35 29 45 | 37 13 21 30 18 | 33 12 42 21 8 | 6 20 31 24 8 | 4 3 9 11 20 | 15 27 19 37 44 22 | 43 26 36 10 19 | |
| 2/3 | 38 30 11 27 17 | 22 45 21 44 1 | 2 35 15 45 29 | 9 13 28 24 14 | 36 31 7 30 22 | 27 32 29 16 5 | 25 33 4 43 41 | |
| 11/15 | 27 4 28 37 39 | 44 8 1 18 41 | 42 19 15 34 9 | 10 33 31 25 35 | 43 14 20 22 36 | 12 32 38 16 5 | 13 24 26 11 23 | |

FIG. 31A

Tx power ratio: 1/4    Bits per channel: 6

QB Permutations

| CR | Section 1 | | | Section 2 | | | Section 3 | | | Section 4 | | | Section 5 | | | Section 6 | | | Section 7 | | | Section 8 | | | Section 9 | | | Section 10 | | | Section 11 | | | Section 12 | | | Section 13 | | | Section 14 | | | Section 15 | | |
|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|
| 1/3 | 5 | 40 | 3 | 26 | 2 | 9 | 4 | 20 | 17 | 11 | 43 | 16 | 19 | 24 | 39 | 37 | 10 | 44 | 8 | 14 | 22 | 21 | 41 | 45 | 1 | 31 | 35 | 29 | 13 | 34 | 28 | 42 | 32 | 12 | 25 | 18 | 23 | 33 | 38 | 6 | 15 | 27 | 7 | 30 | 36 |
| 2/5 | 20 | 16 | 34 | 41 | 28 | 36 | 19 | 35 | 42 | 43 | 2 | 1 | 8 | 30 | 12 | 9 | 14 | 8 | 10 | 38 | 15 | 22 | 6 | 5 | 24 | 13 | 31 | 32 | 23 | 27 | 40 | 39 | 18 | 33 | 3 | 29 | 25 | 7 | 21 | 44 | 17 | 26 | 37 | 11 | 4 |
| 7/15 | 34 | 13 | 24 | 16 | 40 | 19 | 23 | 38 | 1 | 45 | 43 | 2 | 1 | 6 | 2 | 12 | 44 | 8 | 43 | 33 | 5 | 32 | 6 | 5 | 29 | 45 | 40 | 23 | 18 | 26 | 10 | 17 | 31 | 30 | 11 | 14 | 20 | 7 | 3 | 35 | 4 | 39 | 25 | 12 |
| 8/15 | 13 | 24 | 16 | 15 | 18 | 23 | 32 | 38 | 1 | 28 | 36 | 21 | 9 | 6 | 2 | 42 | 44 | 8 | 37 | 33 | 5 | 22 | 19 | 14 | 29 | 40 | 45 | 26 | 43 | 27 | 31 | 10 | 17 | 11 | 38 | 20 | 7 | 3 | 35 | 4 | 39 | 25 | 12 |
| 3/5 | 23 | 5 | 22 | 42 | 45 | 20 | 23 | 32 | 43 | 18 | 36 | 27 | 41 | 9 | 6 | 24 | 16 | 30 | 40 | 12 | 35 | 21 | 31 | 13 | 36 | 10 | 44 | 4 | 38 | 14 | 3 | 42 | 9 | 15 | 25 | 1 | 27 | 28 | 26 | 17 | 2 | 7 |
| 2/3 | 39 | 28 | 38 | 16 | 20 | 8 | 43 | 18 | 11 | 4 | 44 | 35 | 12 | 37 | 6 | 32 | 15 | 2 | 30 | 22 | 11 | 43 | 21 | 19 | 6 | 2 | 5 | 37 | 31 | 13 | 42 | 9 | 7 | 40 | 18 | 25 | 1 | 27 | 23 | 29 | 33 | 41 | 36 |
| 11/15 | 45 | 1 | 39 | 13 | 34 | 18 | 22 | 3 | 19 | 20 | 37 | 17 | 36 | 30 | 27 | 16 | 31 | 2 | 42 | 35 | 8 | 38 | 33 | 6 | 23 | 9 | 21 | 43 | 4 | 28 | 29 | 32 | 15 | 40 | 24 | 14 | 10 | 41 | 5 | 44 | 25 | 11 | 26 |

FIG. 31B

Tx power ratio: 1/4    Bits per channel: 8

| CR | QB Permutations | | | | | | | | | | |
|---|---|---|---|---|---|---|---|---|---|---|---|
| | Section 1 | Section 2 | Section 3 | Section 4 | Section 5 | Section 6 | Section 7 | Section 8 | Section 9 | Section 10 | Section 11 |
| 1/3 | 4 16 25 1 | 19 42 36 8 | 13 34 41 6 | 37 9 12 17 | 3 35 32 22 | 2 39 11 21 | 14 33 15 23 | 44 18 26 40 | 43 24 10 5 | 28 20 29 31 | 7 27 30 38 45 |
| 2/5 | 23 9 28 41 | 43 27 17 34 | 42 31 10 5 | 40 22 15 32 | 39 30 33 16 | 44 37 18 30 | 3 14 20 27 | 6 2 4 1 | 19 25 21 12 | 8 29 13 26 | 16 24 38 11 45 |
| 7/15 | 35 15 6 5 | 2 11 31 9 | 41 37 6 10 | 7 39 34 28 | 29 17 20 19 | 22 12 30 26 | 17 10 13 14 | 23 43 9 4 | 38 18 24 21 | 32 16 13 39 | 33 19 25 7 45 |
| 8/15 | 16 24 44 3 | 39 34 8 11 | 37 25 26 7 | 29 43 42 1 | 35 22 21 17 | 4 2 33 5 | 27 10 8 19 | 41 6 23 9 | 40 32 20 24 | 28 18 31 15 | 30 12 6 38 45 |
| 3/5 | 27 20 32 18 | 41 33 6 12 | 31 14 29 9 | 31 37 23 16 | 22 40 43 13 | 36 34 26 22 | 26 13 7 3 | 1 44 3 38 | 11 39 10 24 | 29 25 17 7 | 5 15 4 2 45 |
| 2/3 | 2 23 7 1 | 12 19 17 14 | 30 41 43 24 | 22 42 34 4 | 5 40 41 13 | 32 28 8 11 | 29 36 10 38 | 21 14 44 18 | 40 32 7 26 | 4 31 9 6 | 37 27 25 20 45 |
| 11/15 | 15 5 37 20 | 18 43 1 33 | 12 29 30 27 | 24 34 7 21 | 36 44 41 36 | 40 11 16 25 | 19 32 28 23 | 8 22 38 35 | 17 2 42 13 | 14 26 39 3 | 31 6 10 9 45 |

FIG. 31C

Tx power ratio: 1/4    Bits per channel: 10

QB Permutations

| CR | Section 1 | Section 2 | Section 3 | Section 4 | Section 5 | Section 6 | Section 7 | Section 8 | Section 9 |
|---|---|---|---|---|---|---|---|---|---|
| 1/3 | 42 30 27 | 38 32 36 | 26 14 40 | 23 41 29 | 44 37 2 | 43 12 11 | 21 16 5 | 33 3 1 | 24 25 39 34 19 |
| 2/5 | 8 17 | 6 15 | 18 22 | 20 4 | 10 28 | 13 31 | 35 7 | 39 37 15 32 |
| 7/15 | 44 23 13 45 | 2 21 14 4 25 | 41 20 22 19 1 | 17 42 33 27 5 | 36 11 3 | 40 8 18 7 35 | 16 10 38 31 28 | 43 34 6 12 9 | 26 37 |
| 8/15 | 39 32 44 31 10 | 19 36 11 28 7 | 18 22 7 13 | 14 13 29 2 3 9 | 5 36 2 3 24 | 25 30 6 23 | 42 37 5 15 | 21 26 17 | 45 20 15 8 |
| 3/5 | 28 25 44 37 8 | 38 2 10 33 3 6 | 42 39 35 1 | 16 41 9 17 4 | 19 43 27 11 | 33 24 30 23 7 | 12 14 45 32 15 | 40 21 36 22 29 | 43 20 26 31 5 |
| 2/3 | 35 12 38 24 | 45 23 28 11 42 14 40 | 6 31 3 | 8 2 15 22 | 37 20 4 6 42 36 | 5 18 1 9 4 | 44 25 36 34 26 | 29 39 16 27 |
| | 30 11 27 17 16 | 22 45 21 44 | 2 35 7 | 12 39 13 40 | 34 31 28 24 | 41 21 13 26 9 | 19 37 32 29 | 33 4 43 41 |
| 11/15 | 4 28 37 39 | 8 1 18 41 | 29 19 15 34 2 | 40 17 9 10 33 31 25 | 7 30 43 14 | 3 6 20 22 36 | 12 32 38 16 5 | 13 24 11 26 23 |

INTERLEAVING METHOD AND DEINTERLEAVING METHOD

TECHNICAL FIELD

The present invention relates to the field of digital communications, and more specifically to an interleaving method, an interleaver, a transmitter provided with the interleaver, a deinterleaving method corresponding to the interleaving method, a deinterleaver corresponding to the interleaver, and a receiver provided with the deinterleaver, which are used in bit-interleaved coding and modulation (BICM) systems with quasi-cyclic low-density parity-check (QC-LDPC) codes, quadrature amplitude modulation (QAM) and spatial multiplexing for multiple transmit antennas.

BACKGROUND ART

In recent years, communication systems including a transmitter provided with a bit-interleaved coding and modulation (BICM) encoder have been proposed (e.g. Non Patent Literature 1).

A BICM encoder performs the following steps, for example:

(1) encoding data blocks by using quasi-cyclic low-density parity-check (QC-LDPC) codes, for example;

(2) bit-interleaving the codeword bits obtained by the encoding, which includes parity interleaving and column-row interleaving;

(3) demultiplexing the bit-interleaved codewords to obtain constellation words. The demultiplexing includes processing equivalent to permutation of columns of an interleaver matrix used in the column-row interleaving when 16QAM, 64QAM or 256QAM, for example, are adopted as the modulation scheme; and (4) mapping the constellation words onto constellations.

CITATION LIST

Non Patent Literature

Non Patent Literature 1

ETSI EN 302 755 V1.2.1 (DVB-T2 standards)

Non Patent Literature 2

ETSI EN 302 307 V1.2.1 (DVB-S2 standards)

SUMMARY OF INVENTION

Technical Problem

The reception performance of a communication system can be improved by appropriately mapping codeword bits, which are based on QC-LDPC codes, onto constellation words.

Similarly, in a communication system including a transmitter provided with a BICM encoder using spatial multiplexing, the reception performance of the communication system can be improved by appropriately mapping codeword bits, which are based on QC-LDPC codes, onto constellation words of a spatial-multiplexing block.

The present invention aims to provide an interleaving method, an interleaver, a transmitter provided with the interleaver which are used for applying bit permutation to codeword bits based on QC-LDPC codes and appropriately mapping the codeword bits onto constellation words of spatial-multiplexing blocks and thereby improving the reception performance of a communication system, a deinterleaving method corresponding to the interleaving method, a deinterleaver corresponding to the interleaver, and a receiver provided with the deinterleaver.

Solution to Problem

In Order to Solve the Above Problems, the Present Invention Provides an Interleaving Method An interleaving method performed by a transmitter for a communication system with quasi-cyclic low-density parity-check codes, spatial multiplexing, and T transmit antennas, T being an integer greater than 1, the interleaving method being used for applying bit permutation to bits of a codeword of a quasi-cyclic low-density parity-check code in order to generate a plurality of constellation words constituting a plurality of spatial-multiplexing blocks from the codeword, the codeword consisting of N cyclic blocks, and each cyclic block consisting of Q bits, each spatial-multiplexing block consisting of B bits and consisting of T constellation words, the interleaving method comprising: a first permutation step of permuting the N cyclic blocks of the codeword; and a second permutation step of permuting the bits of the codeword, whose N cyclic blocks have been permuted, so as to map the bits to the T constellation words constituting each spatial-multiplexing block.

Advantageous Effects of Invention

With the interleaving method described above, it is possible to appropriately map codeword bits based on QC-LDPC codes onto constellation words and thereby improve the reception performance of a communication system.

BRIEF DESCRIPTION OF DRAWINGS

FIG. 4 shows an exemplary repeat-accumulate LDPC code definition.

FIG. 8 shows the definition of the LDPC code for a codeword length of 16200 bits and code rate 5/15 (1/3).

FIG. 9 shows the definition of the LDPC code for a codeword length of 16200 bits and code rate 6/15 (2/5).

FIG. 10 shows the definition of the LDPC code for a codeword length of 16200 bits and code rate 7/15.

FIG. 11 shows the definition of the LDPC code for a codeword length of 16200 bits and code rate 8/15.

FIG. 12 shows the definition of the LDPC code for a codeword length of 16200 bits and code rate 9/15 (3/5).

FIG. 13 shows the definition of the LDPC code for a codeword length of 16200 bits and code rate 10/15 (2/3).

FIG. 14 shows the definition of the LDPC code for a codeword length of 16200 bits and code rate 11/15.

FIGS. 16A to 16C are a block diagram of a QAM mapper for 4-QAM (QPSK) constellation, a block diagram of a QAM mapper for 16-QAM constellation, and a block diagram of a QAM mapper for 64-QAM constellation, respectively.

FIG. 17 is a schematic illustration of the different robustness levels in an 8-PAM symbol with Gray encoding.

FIG. 18B is a schematic representation of a spatial-multiplexing system with 2 antennas and a number of bits per spatial multiplexing block equal to 8.

FIG. 18C is a schematic representation of a spatial-multiplexing system with 2 antennas and a number of bits per spatial multiplexing block equal to 10.

FIG. 23A shows an example operation for bit permutation performed by a section permutation unit shown in FIG. 22A.

FIG. 23C shows an example operation for bit permutation performed by a section permutation unit shown in FIG. 22C.

FIG. 27 shows results of Monte-Carlo simulations with blind and iterative demapping for code rate 8/15 and 8 bits per channel slot.

FIGS. 28A to 28C illustrate a method for finding optimum QB permutations.

FIG. 29A shows optimized QB permutations for B=6 and transmitter power ratio 1/1.

FIG. 29B shows optimized QB permutations for B=8 and transmitter power ratio 1/1.

FIG. 29C shows optimized QB permutations for B=10 and transmitter power ratio 1/1.

FIG. 30A shows optimized QB permutations for B=6 and transmitter power ratio 1/2.

FIG. 30B shows optimized QB permutations for B=8 and transmitter power ratio 1/2.

FIG. 30C shows optimized QB permutations for B=10 and transmitter power ratio 1/2.

FIG. 31A shows optimized QB permutations for B=6 and transmitter power ratio 1/4.

FIG. 31B shows optimized QB permutations for B=8 and transmitter power ratio 1/4.

FIG. 31C shows optimized QB permutations for B=10 and transmitter power ratio 1/4.

DESCRIPTION OF EMBODIMENTS

[Background of the Invention]

Figure 1:
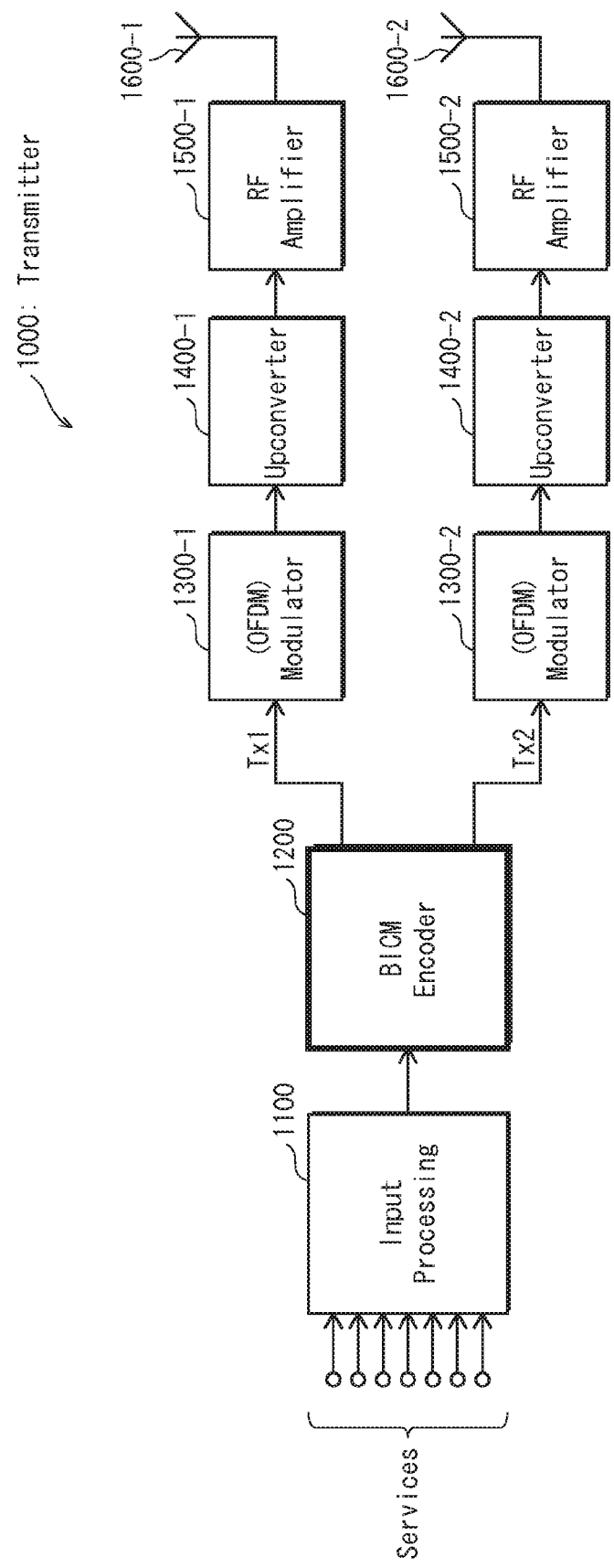
FIG. 1 is a block diagram of a general transmitter performing bit-interleaved coding and modulation with spatial multiplexing over multiple antennas.

FIG. 1 is a block diagram showing a structure of a general transmitter 1000. The transmitter 1000 includes an input processing unit 1100, a bit-interleaved coding and modulation (BICM) encoder 1200, modulators 1300-1 through 1300-2, up-converters 1400-1 through 1400-2, radio frequency (RF) power amplifiers 1500-1 through 1500-2, and transmit antennas 1600-1 through 1600-2.

The input processing unit 1100 formats input bitstreams relating to a broadcast service into blocks of a predetermined length. These blocks are called base-band frames.

The BICM encoder 1200 converts the base-band frames into a plurality of data streams consisting of complex values. The number of data streams is equal to the number of antennas.

Each stream is further processed by a modulation chain, which comprises at least the modulators 1300-1 through 1300-2, the up-converters 1400-1 through 1400-2 and the RF power amplifier 1500-1 through 1500-2, and is output from the transmit antennas 1600-1 through 1600-2.

Each of the modulators 1300-1 through 1300-2 performs processing such as Orthogonal Frequency Division Multiplexing (OFDM) modulation on the input from the BICM encoder 1200, and typically includes time and frequency interleaving for increased diversity.

The up-converters 1400-1 through 1400-2 respectively performs frequency conversion on the input from the modulators 1300-1 through 1300-2 from the digital base-band to analog RF.

Each of the RF power amplifiers 1500-1 through 1500-2 performs power amplification on the input from the up-converters 1400-1 through 1400-2, respectively.

Figure 2:
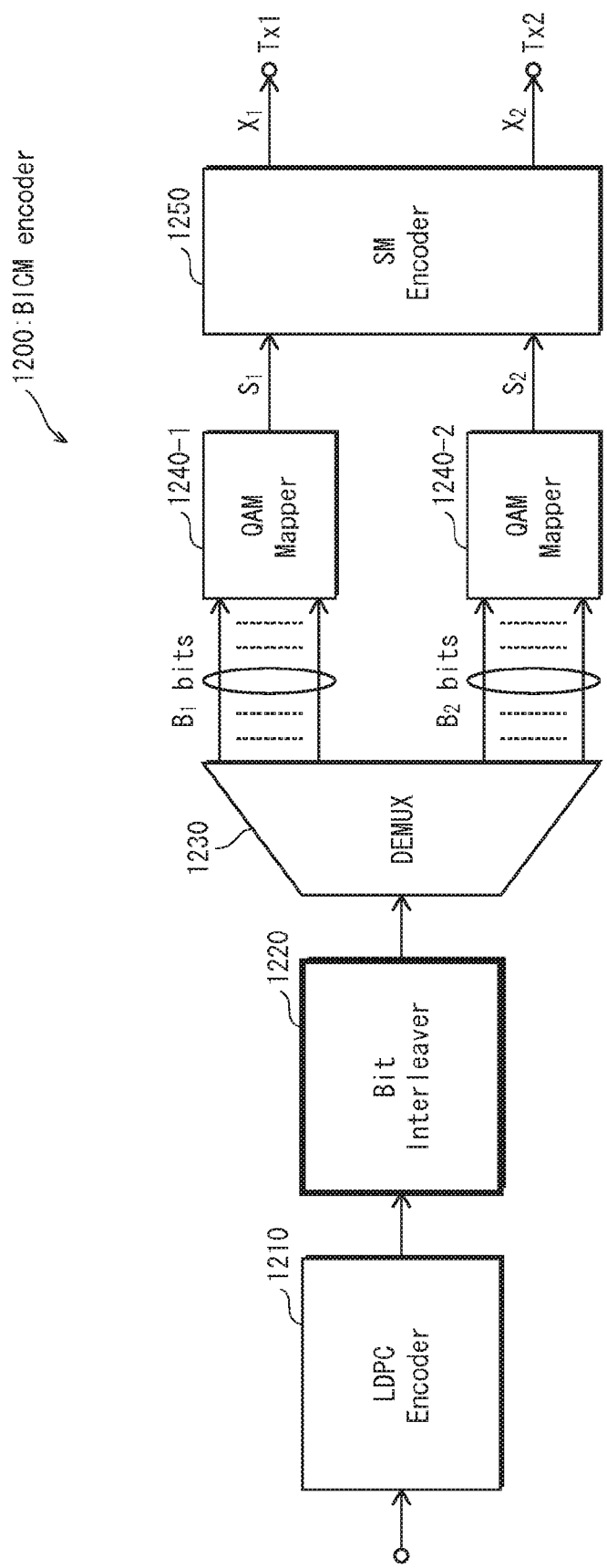
FIG. 2 is a block diagram of a bit-interleaved coding and modulation encoder for spatial multiplexing.

The following describes the details of the BICM encoder 1200 shown in FIG. 1, with reference to FIG. 2.

FIG. 2 is a block diagram of the BICM encoder 1200 shown in FIG. 1 for spatial multiplexing.

The BICM encoder 1200 includes an LDPC encoder 1210, a bit interleaver 1220, a demultiplexer 1230, QAM mappers 1240-1 through 1240-2, and a spatial-multiplexing (SM) encoder 1250.

The LDPC encoder 1210 encodes the input blocks, i.e. base-band frames, by using LDPC codes, to obtain a codeword, and outputs the codeword to the bit interleaver 1220.

The bit interleaver 1220 performs bit interleaving on the bits of each LDPC codeword, and outputs the bit-interleaved code to the demultiplexer 1230.

The demultiplexer 1230 demultiplexes the bit-interleaved codeword into two bitstreams, and outputs the bitstreams to the QAM mappers 1240-1 through 1240-2.

Each of the QAM mappers 1240-1 through 1240-2 maps a plurality of constellation words constituting the input bit-stream onto a plurality of complex symbols, and outputs the symbols to the SM encoder 1250 which is optional. Each constellation word indicates one of a plurality of constellation points of a predefined constellation used for constellation mapping of the constellation word. Note that each of $B_1$ and $B_2$ in FIG. 2 denotes the number of bits of a constellation word.

The SM encoder 1250 typically provides for multiplying the vector of two complex input signals by an orthogonal square matrix.

The components of the BICM encoder 1200 in FIG. 2 will now be explained in more detail.

The following describes LDPC encoding.

The LDPC encoder 1210 encodes base-band frames according to a specified LDPC code to obtain a codeword. The present invention is specifically designed for LDPC block codes with staircase parity structure, as encountered in the DVB-S2, DVB-T2 and DVB-C2 standards.

Note that "DVB-S2" stands for "Digital Video Broadcasting-Second Generation Satellite", "DVB-T2" stands for "Digital Video Broadcasting-Second Generation Terrestrial", and "DVB-C2" stands for "Digital Video Broadcasting-Second Generation Cable".

The LDPC block code will now be explained in more detail.

An LDPC block code is a linear error-correcting code that is fully defined by its parity check matrix (PCM), which is a binary sparse matrix that represents the connection of the codeword bits (also referred to as bit nodes or variable nodes) to the parity checks (also referred to as check nodes). The columns and the rows of the PCM correspond to the variable and the check nodes respectively. Connections of the variable nodes to the check nodes are represented by entries "1" in the PCM. Note that the check nodes are denoted by CN.

LDPC codes have variations, and one of which is quasi-cyclic low-density parity check (QC-LDPC) codes. QC-LDPC codes have a structure that makes them particularly suitable for hardware implementation. In fact, most if not all standards today use QC-LDPC codes. The PCM of a QC-LDPC code has a special structure consisting of circulant matrices. A circulant matrix is a square matrix in which each row is a cyclic shift of the previous row with one position, and can have one, two, or more folded diagonals.

The size of each circulant matrix is Q*Q, where Q is referred to as the cyclic factor of the LDPC code. Such a quasi-cyclic structure allows Q check nodes to be processed in parallel, which is clearly advantageous for efficient hardware implementation.

The PCM of a QC LDPC code has Q*M rows and Q*N columns, a codeword consisting of N blocks of Q bits. A Q-bit block is referred to as a quasi-cyclic block or simply cyclic block throughout this document and is abbreviated as QB.

Figure 3:
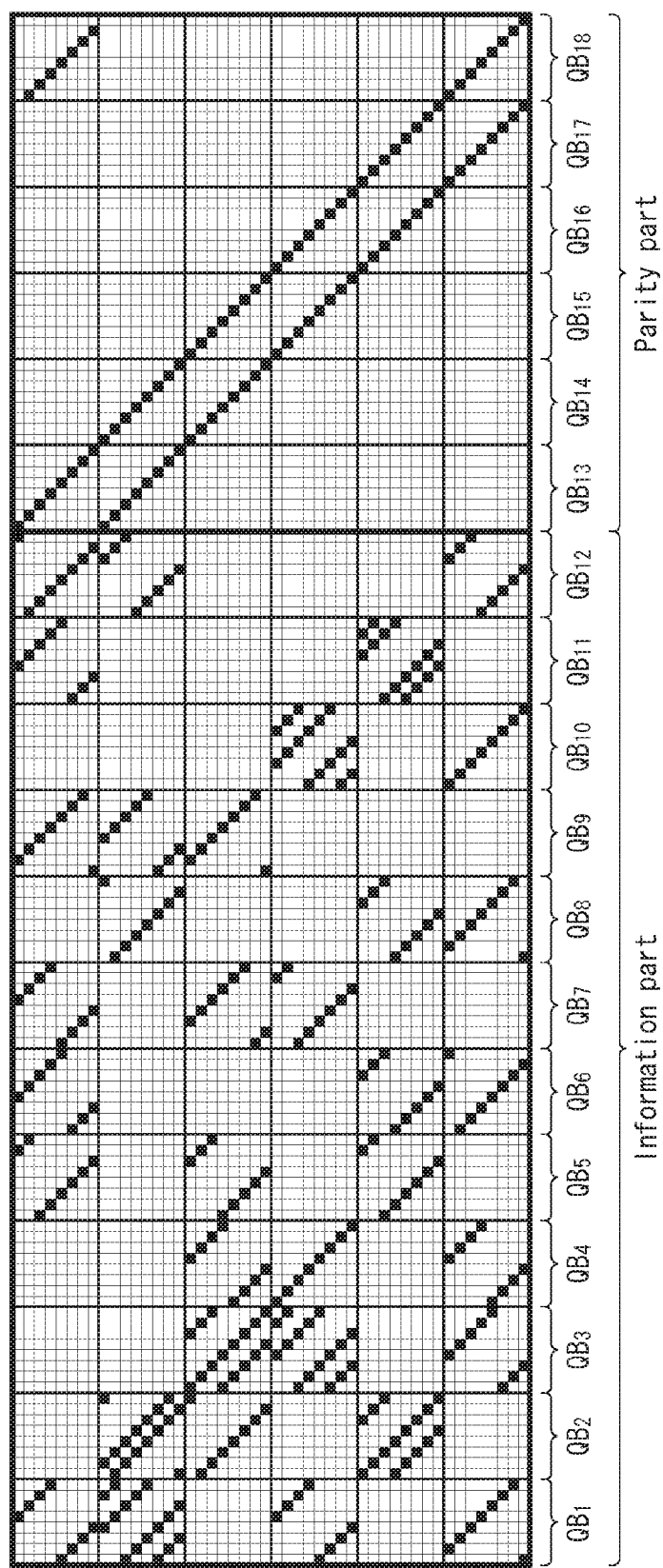
FIG. 3 shows a parity check matrix of an exemplary QC-LDPC code with cyclic factor Q=8.

FIG. 3 shows an exemplary PCM of a QC-LDPC code when M=6, N=18 and Q=8. In each of FIG. 3, and later described FIGS. 5-7, each of the smallest squares represents one entry of the PCM, where the black entries correspond to "1" and the rest correspond to "0".

The PCM shown in FIG. 3 has circulant matrices with one or two folded diagonals. The QC-LDPC code corresponding to the PCM shown in FIG. 3 encodes a block of 8*12=96 bits to a codeword of 8*18=144 bits, having therefore a code rate of 96/144=2/3.

The code in FIG. 3 belongs to a special family of QC-LDPC codes called repeat accumulate quasi-cyclic low-density parity check (RA QC-LDPC) codes. The RA QC-LDPC codes are well known for their ease of encoding and are encountered in a large number of standards, such as the second generation DVB standards: DVB-S2, DVB-T2, and DVB-C2. The left-hand side part of the PCM corresponds to the information part. The right-hand side part of the PCM corresponds to the parity part, and the entries "1" in this part are arranged in a staircase structure.

Note that "DVB" stands for "Digital Video Broadcasting".

In the following, the definition of the RA QC LDPC codes used in the DVB-S2, DVB-T2 and DVB-C2 family of standards, as introduced in Section 5.3.2 and Annexes B and C of the DVB-S2 standard ETSI EN 302 307, V1.2.1 (August 2009), which is Non Patent Literature 2, will be discussed. In this family of standards the cyclic factor Q is 360.

Each QC LDPC code is fully defined by a table that contains, for the first bit of each cyclic block in the information part, the zero-based indices of the check nodes the bit is connected to. These indices are referred to as "addresses of the parity bit accumulators" in the DVB-S2 standard.

FIG. 4 shows a table corresponding to the QC LDPC code of FIG. 3, for example. Note that values of the QB column in FIG. 4 lists indices of cyclic blocks of only the information part of the PCM. In the example of FIG. 4, indices of the check nodes for the first bit in the cyclic block $QB_1$ are "13", "24", "27", "31" and "47".

Figure 5:
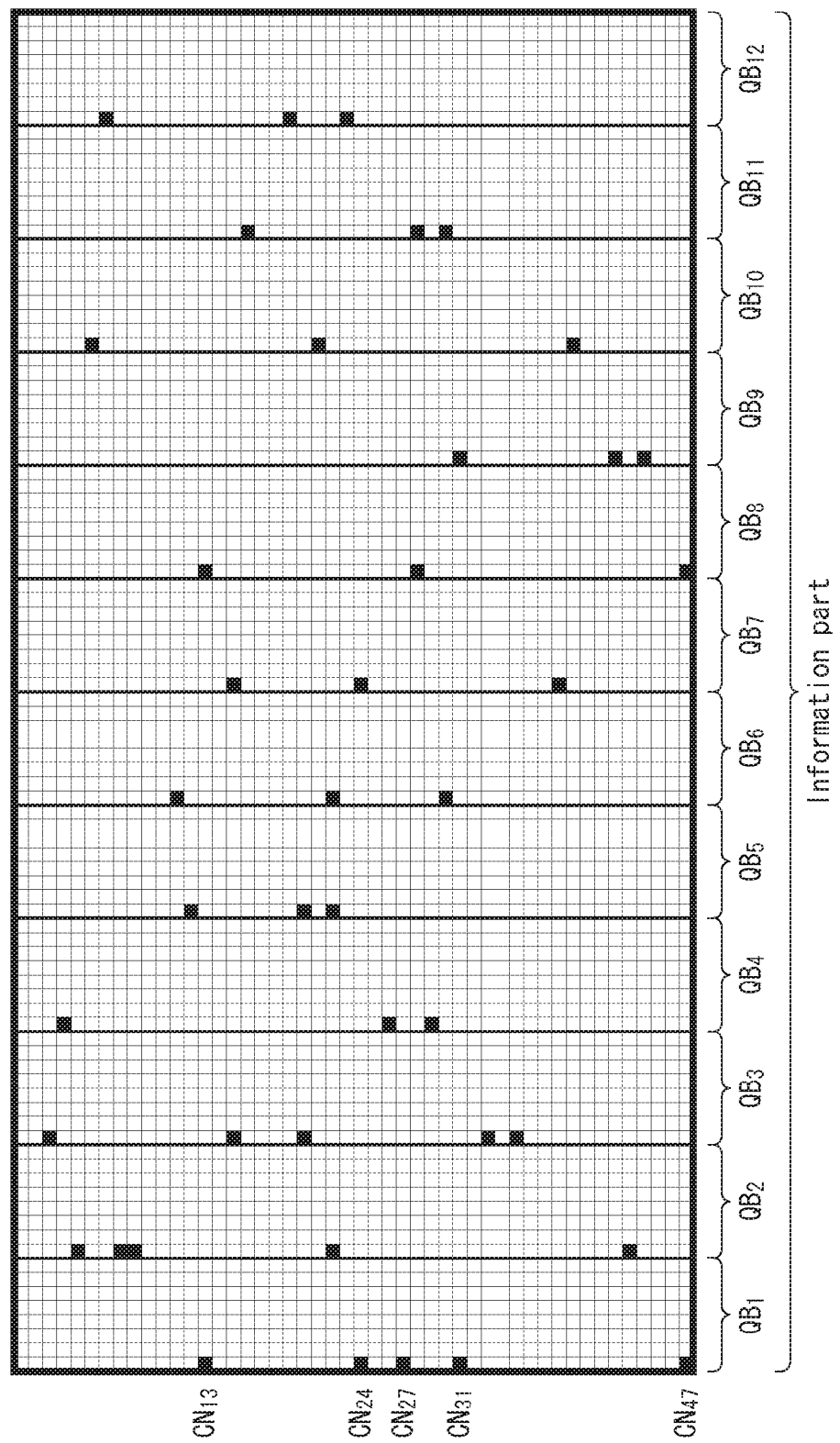
FIG. 5 shows the information part of the parity-check matrix, and represents positions of "1" only for the first bit in each cyclic block corresponding to FIG. 4.

FIG. 5 shows the information part of the PCM and represents positions of "1" only for the first bit in each cyclic block of FIG. 4. For example, with regard to the first bit in the cyclic block $QB_1$, matrix entries of $CN_{13}$, $CN_{24}$, $CN_{27}$, $CN_{31}$ and $CN_{47}$ are "1".

Figure 6:
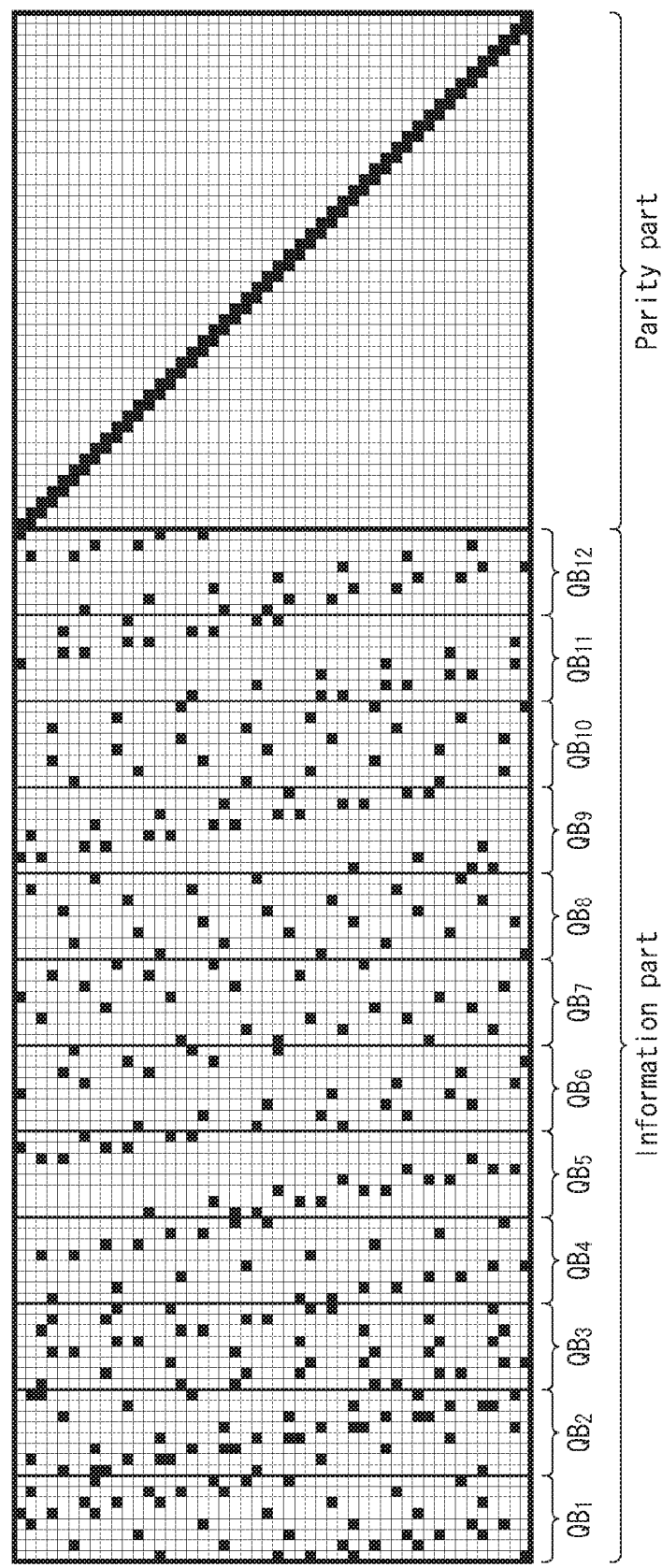
FIG. 6 shows the full parity-check matrix of FIG. 4, containing the entries for all information bits, as well as the staircase parity part.

The full parity-check matrix of FIG. 4, containing the entries for all information bits, as well as the staircase parity part, is shown in FIG. 6.

In each cyclic block, for the other information bits (excluding the first bit in the cyclic block), the CN indices are computed with the following formula 1:

$$i_q = (i_0 + q \times M) \% (Q \times M)$$ [Formula 1]

where q is the bit index (0 ... Q−1) within a cyclic block; $i_q$ is the CN index for bit q; $i_0$ is one of the indices of the check nodes for the first bit in FIG. 4; M is the number of cyclic blocks in the parity part, i.e. 6 in this example of FIG. 6; Q*M is the number of parity bits, i.e. 48 in this example of FIG. 6; and % denotes the modulo operator.

Figure 7:
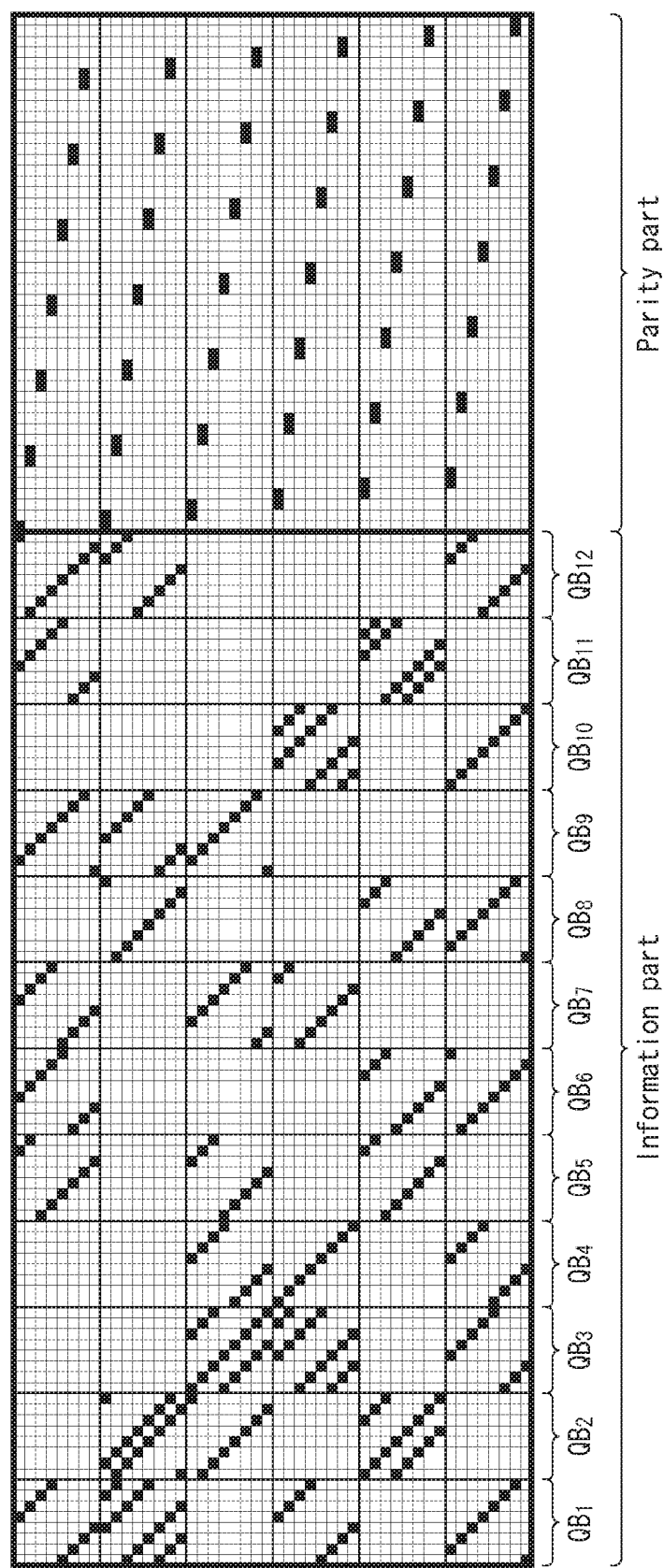
FIG. 7 shows the quasi-cyclic structure of the parity-check matrix of FIG. 6.

In order to reveal the quasi-cyclic structure of the parity-check matrix in FIG. 6, the following permutation computed with the following formula 2 is applied to the rows of the PCM, the resulting matrix being shown in FIG. 7. The permutation computed by the formula 2 is referred to as row permutation throughout this document:

$$j = (i \% M) \times Q + \text{floor}(i/M)$$ [Formula 2]

where i and j are the zero-based indices of the non-permuted and the permuted CNs, respectively, M is the number of cyclic blocks in the parity part, Q is the number of bits of each cyclic block, % denotes the modulo operator, and floor (i/M) is a function returning the largest integer that is equal to or less than i/M.

Since the row permutation is not applied to the bits (i.e., the columns are not permuted), the LDPC code definition does not change. The parity part of the resulting parity-check matrix is not quasi cyclic, however. In order to make it quasi cyclic, a special permutation computed with the following formula 3 must be applied to the parity bits only. Note that the permutation computed with the following formula 3 will be referred to as parity permutation or parity interleaving throughout this document.

$$j = (i \% Q) \times M + \text{floor}(i/Q)$$ [Formula 3]

where i and j are the zero-based indices of the non-permuted and permuted parity bits respectively, M is the number of cyclic blocks in the parity part, Q is the number of bits of each cyclic block, % denotes the modulo operator, and floor (i/Q) is a function returning the largest integer that is equal to or less than i/Q.

This permutation computed with the formula 3 does change the QC LDPC code definition. Moreover, this permutation will be regarded as part of the LDPC encoding process from now on.

In the following we introduce the seven QC LDPC codes that will be specified by the upcoming DVB-NGH standard, which is now under development and is intended for terrestrial reception of digital video services on handheld devices. NGH stands for next-generation handheld.

The DVB-NGH standard will specify seven QC LDPC codes. All codes have a cyclic factor Q=360 and N=45 cyclic blocks per codeword. The codeword length is therefore 16200 bits. The following code rates are defined by the DVB-NGH standard: 5/15 (1/3), 6/15 (2/5), 7/15, 8/15, 9/15 (3/5), 10/15 (2/3), and 11/15. The definitions of these seven QC LDPC codes are given in the tables shown in FIGS. 8 to 14, respectively, in the format introduced in FIG. 4 above.

Note that since the LDPC encoding process using the QC LDPC codes shown in FIGS. 8 to 14 is substantially the same as the process described in the DVB-S2 standard, those skilled in the art are supposed to understand the process.

Here, the LDPC encoding process performed by the LDPC encoder 1210 is specifically described in the format described in the DVB-S2 standard, with reference to FIG. 8, as an example.

The LDPC encoder systematically encodes an information block (input from the LDPC encoder) i of size $K_{ldpc}$ into an LDPC code c of size of $N_{ldpc}$, as in formula 4 below.

$$\text{Let } i = (i_0, i_1, \ldots, i_{K_{ldpc}-1}),$$

$$c = (c_0, c_1, c_2, \ldots c_{N_{ldpc}-1}) = (i_0, i_1, \ldots, i_{K_{ldpc}-1}, p_0, p_1, \ldots, p_{N_{ldpc}-K_{ldpc}-1})$$  [Formula 4]

where $i_0, i_1, \ldots, i_{K_{ldpc}-1}$: information bits $p_0, p_1, \ldots p_{N_{ldpc}-K_{ldpc}-1}$: parity bits Note that the parameters ($N_{ldpc}$, $K_{ldpc}$) for QC LDPC code with code rate 5/15 are (16200, 5400).

The task of the LDPC encoder 1210 is to compute the $N_{ldpc} - K_{ldpc}$ parity bits for every block of $K_{ldpc}$ information bits. The procedure is as shown below.

First, the parity bits are initialized as shown in formula 5.

$$p_0 = p_1 = \ldots = p_{N_{ldpc}-K_{ldpc}-1} = 0 \quad \text{[Formula 5]}$$

The first information bit $i_0$ is accumulated at each parity bit address specified in the first row (each check node index) of FIG. 8. More specifically, the operations of Equation 3 are performed. To be specific, the calculation in the following formula 6 is performed.

$$p_{416} = p_{416} \oplus i_0$$

$$p_{2560} = p_{2560} \oplus i_0$$

$$p_{2912} = p_{2912} \oplus i_0$$

$$p_{3112} = p_{3112} \oplus i_0$$

$$p_{3216} = p_{3216} \oplus i_0$$

$$p_{4156} = p_{4156} \oplus i_0$$

$$p_{4969} = p_{4969} \oplus i_0$$

$$p_{6405} = p_{6405} \oplus i_0$$

$$p_{6723} = p_{6723} \oplus i_0$$

$$p_{6912} = p_{6912} \oplus i_0$$

$$p_{8593} = p_{8593} \oplus i_0$$

$$p_{8909} = p_{8909} \oplus i_0 \quad \text{[Formula 6]}$$

where, the symbol $\oplus$ stands for XOR.

For the next 359 information bits $i_m$ (m=1, 2, ... 359), $i_m$ is accumulated at each parity bit address $\{x+(m \bmod 360) \times q\}$ mod $(N_{ldpc}-K_{ldpc})$. Note that x denotes the address of the parity bit accumulator corresponding to the first information bit $i_0$, and q is a constant dependent on the code rate 5/15. The value of q is given by $q=(N_{ldpc}-K_{ldpc})/360=(16200-5400)/360=30$.

For the $361^{st}$ information bit $i_{360}$, the addresses of the parity bit accumulators are given in the second row of FIG. 8. In a similar manner, for the next 359 information bits $i_m$ (m=361, 362, ... 719), the addresses of the parity bit accumulators are given by $\{x+(m \bmod 360) \times q\}$ mod $(N_{ldpc}-K_{ldpc})$. Note that x denotes the address of the parity bit accumulator for the $360^{th}$ information bit $i_{360}$, i.e. the entries in the second row of FIG. 8.

In a similar manner, for every group of 360 new information bits, a new row from FIG. 8 is used to find the addresses of the parity bit accumulators.

After all of the information bits are exhausted, the final parity bits are obtained as follows.

Sequentially perform the operations of formula 7 starting with i=1.

$$p_i = p_i \oplus p_{i-1}, i=1,2, \ldots, N_{ldpc}-K_{ldpc}-1 \quad \text{[Formula 7]}$$

where, the symbol $\oplus$ stands for XOR.

Final content of $p_i$ (i=0, 1, ... $N_{ldpc}-K_{ldpc}-1$) is equal to the parity bit $p_i$.

Note that the same description as given above in the example directed to FIG. 8 is applicable to FIGS. 9 through 14, by simply replacing the values of the entries in each row of FIG. 8 with those of FIGS. 9 through 14.

Yet, in the case of FIG. 9 (code rate 2/5), the parameters ($N_{ldpc}$, $K_{ldpc}$) for QC LDPC code are (16200, 6480) and q=27. In the case of FIG. 10 (code rate 7/15), the parameters ($N_{ldpc}$, $K_{ldpc}$) for the QC LDPC code are (16200, 7560) and q=24. In the case of FIG. 11 (code rate 8/15), the parameters ($N_{ldpc}$, $K_{ldpc}$) for the QC LDPC code are (16200, 8640) and q=21. In the case of FIG. 12 (code rate 9/15), the parameters ($N_{ldpc}$, $K_{ldpc}$) for the QC LDPC code are (16200, 9720) and q=18. In the case of FIG. 13 (code rate 10/15), the parameters ($N_{ldpc}$, $K_{ldpc}$) for the QC LDPC code are (16200, 10800) and q=15. In the case of FIG. 14 (code rate 11/15), the parameter ($N_{ldpc}$, $K_{ldpc}$) for the QC LDPC code are (16200, 11880) and q=12.

Although the above description of QC LDPC codes complies with the notation of DVB-S2, according to the notation of DVB-T2 or DVB-NGH, q mentioned above is written as $Q_{ldpc}$, for example.

The LDPC encoder 1120 performs the operations of the following formula 8 on the codeword acquired from encoding. Let 2 and u are the bits of the non-permuted and permuted parity bits respectively:

$$u_i = \lambda_i : 0 \leq i < K_{ldpc}$$

$$u_{K_{ldpc}+360t+s} = \lambda_{K_{ldpc}+Q_{ldpc}s+t} : 0 \leq s < 360, 0 \leq t < Q_{ldpc} \quad \text{[Formula 8]}$$

In formula 8, $K_{ldpc}$ denotes the number of information bits of a QC LDPC codeword and information bits are not interleaved. The cyclic factor Q of the parity-check matrix is 360.

Note that $Q_{ldpc}=(N_{ldpc}-K_{ldpc})/360=30$ for code rate 5/15, whereas $Q_{ldpc}=27$ for code rate 2/5, $Q_{ldpc}=24$ for code rate 7/15, $Q_{ldpc}=21$ for code rate 8/15, $Q_{ldpc}=18$ for code rate 9/15, $Q_{ldpc}=15$ for code rate 10/15, and $Q_{ldpc}=12$ for code rate 11/15.

The following briefly describes cyclic blocks constituting the QC LDPC code in this document, and indices of cyclic blocks. The permuted QC LDPC codeword (the QC LDPC codeword whose parity bits are permuted) is sequentially grouped into blocks composed of Q bits, i.e., 360 bits starting from $u_0$ in the formula 8. Such blocks are the cyclic blocks of the QC LDPC codeword. Subsequently, indices "1", "2" and so on are sequentially assigned to the cyclic blocks starting from $u_0$.

The following describes encoding for spatial multiplexing.

The present invention deals specifically with spatial-multiplexing systems with two transmit antennas. In such a system, two complex QAM symbols, denoted by $s_1$ and $s_2$ in FIG. 2, are transmitted in the same channel slot. In the case of OFDM modulation, a channel slot is represented by an OFDM cell, which is defined as one subcarrier in an OFDM symbol. The two complex QAM symbols form a spatial-multiplexing (SM) pair.

The two complex QAM symbols in an SM pair can be transmitted uncoded, i.e. each over its own antenna, or an additional spatial-multiplexing encoding step can be applied by the SM encoder 1250, as shown in FIG. 2, whereby the two complex QAM symbols $s_1$ and $s_2$ are jointly encoded to produce two complex symbols $x_1$ and $x_2$. The SM encoding typically consists in multiplying the vector $[s_1\ s_2]$ by a 2×2 complex generator matrix G, as shown by the following formula 9:

$$\begin{bmatrix} x_1 \\ x_2 \end{bmatrix} = G \begin{bmatrix} s_1 \\ s_2 \end{bmatrix} = \begin{bmatrix} g_{11} & g_{12} \\ g_{21} & g_{22} \end{bmatrix} \begin{bmatrix} s_1 \\ s_2 \end{bmatrix} \quad \text{[Formula 9]}$$

The following describes QAM mapping.

The present invention deals specifically with the case when both complex QAM symbols of an SM pair (s1, s2) have square quadrature amplitude modulation QAM constellations. The two square QAM constellations are not necessarily of the same size.

A QAM symbol is obtained by independently modulating the real and the imaginary components using pulse-amplitude modulation (PAM), each point in the constellation corresponding to a unique combination of bits.

Figure 15C:
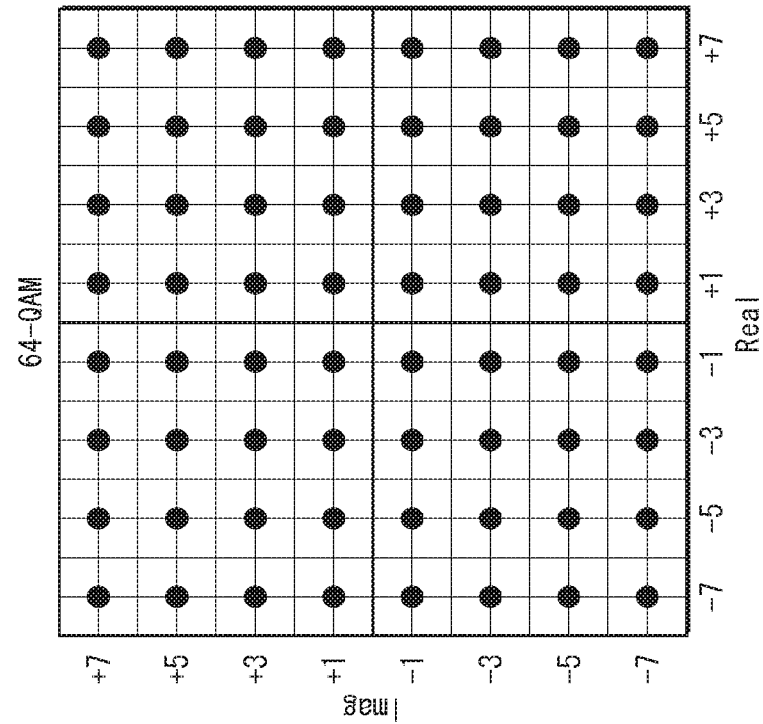
FIGS. 15A to 15C show a 4-QAM (QPSK) constellation, a 16-QAM constellation, and a 64-QAM constellation, respectively.
Figure 15B:
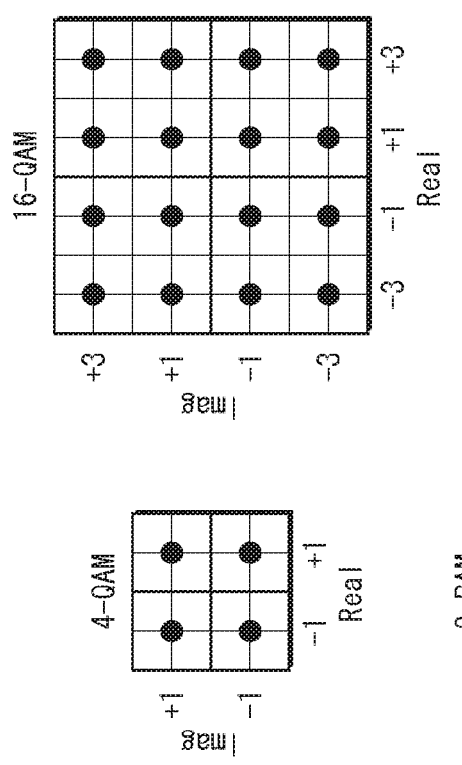
Figure 15A:
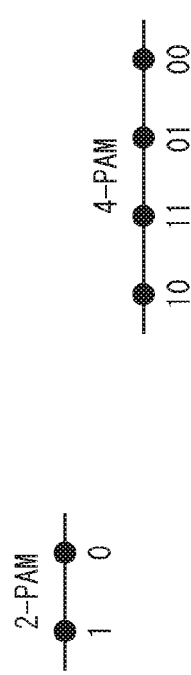

FIGS. 15A-15C show the three types of square QAM constellations relevant to the present invention: 4-QAM, 16-QAM, and 64-QAM.

In the square QAM constellations, the real and imaginary components have the same PAM modulation. To be specific, in the case of 4-QAM constellation, the real and imaginary components have the same 2-PAM modulation, in the case of 16-QAM constellation, the real and imaginary components have the same 4-PAM modulation, and in the case of 64-QAM constellation, the real and imaginary components have the same 8-PAM modulation.

The present invention also assumes that the PAM mapping has a Gray encoding, as shown in FIGS. 15A-15C.

FIGS. 16A-16C show the corresponding QAM mappers for the three square QAM constellations shown in FIGS. 15A-15C.

As shown in FIGS. 16A-16C, each QAM mapper consists of two independent PAM mappers, each encoding the same number of bits.

FIG. 16A shows a block diagram of a QAM mapper for QPSK (4-QAM) constellation. A QAM mapper 1240A includes two independent PAM mappers 1241A and 1245A for 2-PAM constellation, one for the real part and the other for the imaginary part. Each of the PAM mappers 1241A and 1245A encodes one bit, and therefore the QAM mapper 1240A encodes two bits in total.

FIG. 16B shows a block diagram of a QAM mapper for 16-QAM constellation. A QAM mapper 1240B includes two independent PAM mappers 1241B and 1245B for 4-PAM constellation, one for the real part and the other for the imaginary part. Each of the PAM mappers 1241B and 1245B encodes two bits, and therefore the QAM mapper 1240B encodes four bits in total.

FIG. 16C shows a block diagram of a QAM mapper for 64-QAM constellation. A QAM mapper 1240C includes two independent PAM mappers 1241C and 1245C for 8-PAM constellation, one for the real part and the other for the imaginary part. Each of the PAM mappers 1241C and 1245C encodes three bits, and therefore the QAM mapper 1240C encodes six bits in total.

The bits encoded in a PAM symbol have different robustness levels (reliabilities) when the received PAM symbol is demapped in the receiver. This is a well known fact and is illustrated in FIG. 17 for an 8-PAM symbol with Gray encoding. The different robustness levels result from the fact that the distance between the two partitions defined by a bit (0 or 1) is different for each of the three bits. The reliability of a bit is proportional to the average distance between the two partitions defined by that bit. In the example shown in FIG. 17, bit $b_1$ has the lowest robustness level (reliability), bit $b_2$ has the second lowest robustness level (reliability), and bit $b_3$ has the highest robustness level (reliability).

Note that, 4-QAM constellation has one robustness level, 16-QAM constellation has two robustness levels and 64-QAM constellation has three robustness levels.

In each square QAM constellation (square QAM constellations corresponding to FIGS. 16A-16C, for example), $b_{i,Re}$ and $b_{i,Im}$ (i=1, . . . ) have the same robustness level, and the robustness level (reliability) of $b_{i+1,Re}$ and $b_{i+1,Im}$ (i=1, . . . ) is greater than the robustness level (reliability) of $b_{i,Re}$, $b_{i,Im}$.

Prior to transmission, the QAM symbols are normalized in power by multiplying them with a scaling factor K. The value of K is: (i) sqrt(2) for QPSK (4-QAM), (ii) sqrt(10) for 16-QAM, and (iii) sqrt(42) for 64-QAM, where sqrt(x) is a function that returns the square root of x. Note that multiplying the QAM symbols with a scaling factor K is performed by the QAM mapper.

From now on we denote the number of bits in the two QAM symbols of an SM pair by $B_1$ and $B_2$ respectively. Since the QAM constellations are square, $B_1$ and $B_2$ are even. In the following, the bits encoded in a QAM constellation will be referred to as a constellation word, and the bits encoded in an SM constellation pair will be referred to as a spatial-multiplexing (SM) word, or a spatial-multiplexing (SM) block.

A further aspect relevant to the present invention is that, since a square QAM symbol consists of two independent PAM symbols, the bits encoded in a QAM symbol can be grouped in bit pairs having the same robustness.

The following describes configurations in DVB-NGH.

The spatial-multiplexing profile of the DVB-NGH standard will support the three SM configurations shown in Table 1. The SM configurations are defined for the combination of QAM symbol sizes of two complex QAM symbols $S_1$ and $S_2$. Note that the number of bits of a channel slot (the number of bits of a SM block) matches the sum of bits of QAM constellations used to generate the two complex QAM symbols $S_1$ and $S_2$ (the sum of bits of constellation words constituting the SM block). According to the DVB-NGH standard, for each of the three SM configurations there are three different ratios of the transmit power applied to the two transmit antennas, namely transmit power ratio 1/1, 1/2, and 1/4.

TABLE 1

SM configurations used in DVB-NGH

| # bits per channel slot | QAM symbol sizes | Tx power ratio 1/1 | | | Tx power ratio 1/2 | | | Tx power ratio 1/4 | | |
|---|---|---|---|---|---|---|---|---|---|---|
| | | β | θ (deg) | α | β | θ (deg) | α | β | θ (deg) | α |
| 6 | s1: 4-QAM (2 bits) s2: 16-QAM (4 bits) | 1/2 | 45.00 | 0.44 | 1/3 | 0.00 | 0.50 | 1/5 | 0.00 | 0.50 |
| 8 | s1: 16-QAM (4 bits) s2: 16-QAM (4 bits) | 1/2 | 57.76 | 0.50 | 1/3 | 25.00 | 0.50 | 1/5 | 0.00 | 0.50 |
| 10 | s1: 16-QAM (4 bits) s2: 64-QAM (6 bits) | 1/2 | 22.00 | 0.50 | 1/3 | 15.00 | 0.50 | 1/5 | 0.00 | 0.50 |

Note that the transmit power ratio is a ratio of transmit power of complex symbol $x_1$ to transmit power of complex symbol $x_2$ (transmit power of complex symbol $x_1$/transmit power of complex symbol $x_2$), which is output from the SM encoder 1250. The generator matrix G used by the SM encoder 1250 adjusts the transmit power ratio.

The generator matrix G of the SM encoder 1250 has the following generic expression, shown in the formula 10:

$$G = \begin{bmatrix} 1 & 0 \\ 0 & e^{j\phi(k)} \end{bmatrix} \begin{bmatrix} \sqrt{\beta} & 0 \\ 0 & \sqrt{1-\beta} \end{bmatrix} \begin{bmatrix} \cos\theta & \sin\theta \\ \sin\theta & -\cos\theta \end{bmatrix} \quad \text{[Formula 10]}$$

$$\begin{bmatrix} \sqrt{\alpha} & 0 \\ 0 & \sqrt{1-\alpha} \end{bmatrix}$$

The phase $\phi(k)$ is a variable phase that changes for each channel slot. The β, θ, and α parameters may change in the final version of the standard. Their concrete values are not relevant to the present invention. What is important is the QAM size on each transmit antenna for the three configurations and the transmit power ratios.

The following describes interleaving performed on the bits of an LDPC codeword.

Typically, the bits of an LDPC codeword have different importance levels, and the bits of a constellation have different robustness levels. A direct, i.e. non-interleaved, mapping of the LDPC codeword bits to the constellation bits leads to a suboptimal performance. In order to avoid such performance degradation the codeword bits need to be interleaved prior to being mapped onto constellations.

In order to interleave the LDPC codeword bits, the bit interleaver 1220 and the demultiplexer 1230 are used between the LDPC encoder 1210 and the QAM mappers 1240-1 through 1240-2, as illustrated in FIG. 2. By carefully designing the bit interleaver 1220 and the demultiplexer 1230, an optimal association can be achieved between the bits of the LDPC codeword and the bits encoded by the constellation, which leads to improvement of the reception performance A typical measure of the performance is the bit error rate (BER) or the block error rate (BLER) as a function of the signal-to-noise ratio (SNR).

The different importance levels of the bits of an LDPC codeword result primarily from the fact that not all the bits are involved in the same number of parity checks. The more parity checks (check nodes) a codeword bit (variable node) is involved in, the more important that bit is in the iterative LDPC decoding process. A further reason is the fact that the variable nodes have different connectivities to the cycles in the Tanner graph representation of the LDPC code, so codeword bits may have different importance levels even when the codeword bits are involved in the same number of parity checks. These aspects are well understood in the art. As a general rule, the importance level of a variable node increases with the number of check nodes it is connected to.

In the particular case of QC-LDPC codes, all bits in a cyclic block of Q bits have the same importance since all of them are involved in the same number of parity checks and have the same connectivity to the cycles in the Tanner graph.

Thus, in order to improve the reception performance, the present invention provides a method for mapping the bits of a QC LDPC codeword to two constellation words constituting a SM block.

Embodiment 1

An embodiment of the present invention provides an interleaving method for interleaving the bits of a codeword based on QC-LDPC codes (QC-LDPC codeword) while ensuring the following conditions:

(A1) the $B_t$ bits of each QAM symbol are mapped to exactly $B_t/2$ cyclic blocks of the QC-LDPC codeword in such a way that each of the $B_t/2$ cyclic blocks is associated with bits of the same robustness; and (A2) the T QAM symbols (e.g., two QAM symbols) of a spatial-multiplexing (SM) block are mapped onto different cyclic blocks of the QC-LDPC codeword.

In other words:

(B1) each constellation word (the number of bits B) is made up of bits from $B_t/2$ different cyclic blocks of the QC-LDPC codeword;

(B2) each pair of constellation word bits that have the same robustness is made up of bits from the same cyclic block; and (B3) constellation words for different antennas are made up of bits from different cyclic blocks.

An SM block is made up of bits from B/2 cyclic blocks.

An SM block consists of B bits, and consists of T constellation words.

The t in $B_t$ is indices of antennas (indices of constellation words in an SM block).

As described above, cyclic blocks of the predetermined QC-LDPC code have different importance levels. The importance level of a cyclic block depends on the number of check nodes connected to bits (variable nodes) constituting the cyclic block. Therefore, transmission performance can be improved by matching the importance level of the cyclic block with the robustness level of bits of a constellation word onto which the cyclic block is mapped. Especially, a bit of the cyclic block having the highest importance level needs to be mapped on a bit of the constellation word having the highest robustness level. In contrast, a bit of the cyclic block having the lowest importance level needs to be mapped on a bit of the constellation word having the lowest robustness level.

When the number of transmit antennas is two (constellation words of the SM block are two), mapping of the bits of QC LDPC codeword onto the two constellation words constituting the SM block (SM word) will be explained in the following. The present invention is specifically optimized for and works in conjunction with such a mapping.

The bits of QC LDPC codes are mapped to two constellation words constituting the SM block such that:

(C1) each SM word is made up of bits from (B1+B2)/2 different cyclic blocks of the codeword, (C2) each pair of SM word bits that are encoded in the same QAM symbol and have the same robustness is made up of bits from the same cyclic block, and (C3) constellation words for different transmit antennas are made up of bits from different cyclic blocks.

Specifically, the Q*B/2 bits of the B/2 cyclic blocks are mapped to Q/2 spatial-multiplexing blocks. In this case, the B/2 cyclic blocks are referred to as a section.

Figure 18A:
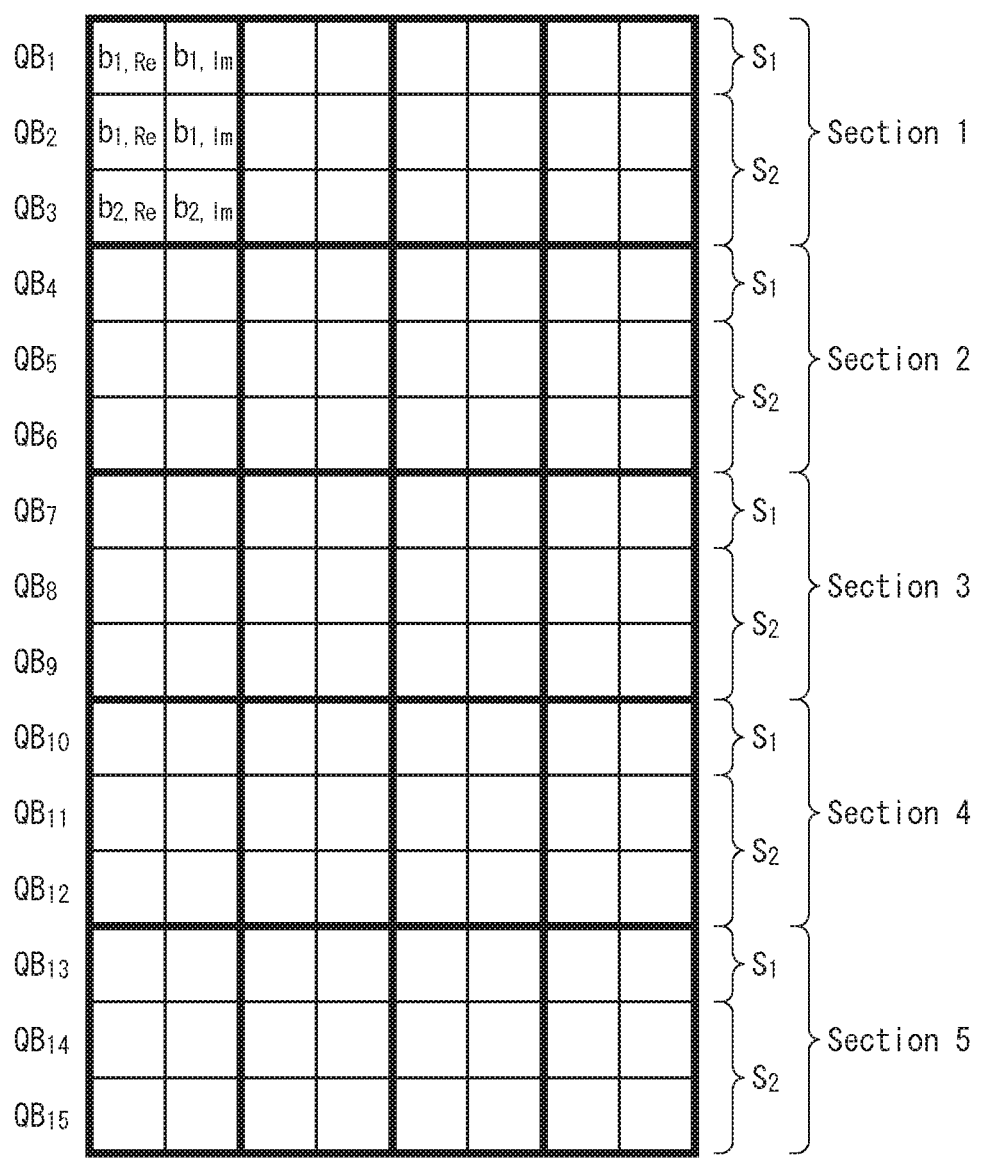
FIG. 18A is a schematic representation of a spatial-multiplexing system with 2 antennas and a number of bits per spatial multiplexing block equal to 6.
Figure 18B:
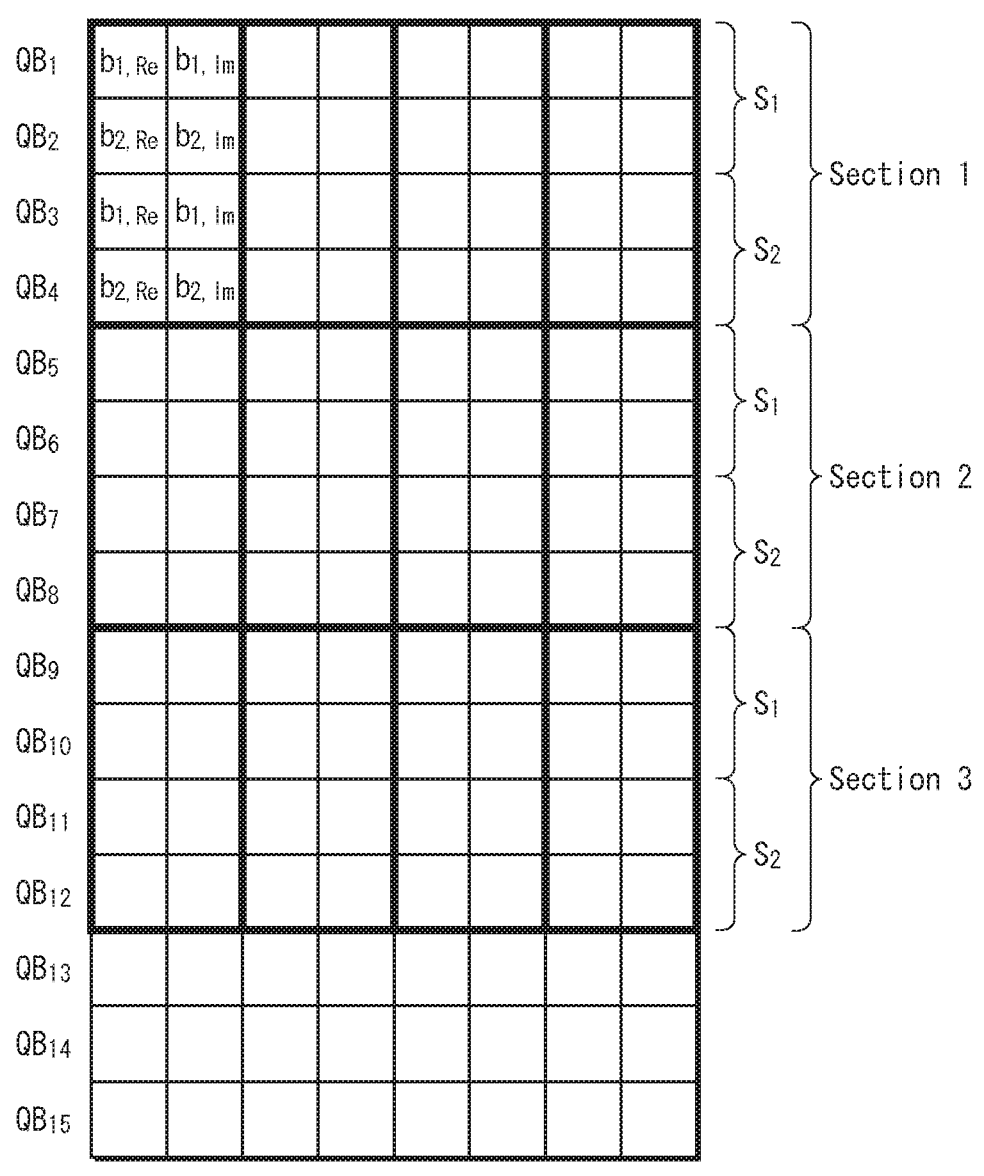

Such a configuration is shown in FIGS. 18A to 18C for a spatial-multiplexing system with two antennas and a number of bits per spatial-multiplexing block equal to 6, 8, and 10 respectively. The thick borders group bits belonging to the same SM block. In these examples the LDPC parameters are: the cyclic factor Q=8, and the number of cyclic blocks per codeword N=15.

For the cases where N is not a multiple of B/2, i.e. B=8 in the above examples, the codeword cannot be divided into sections of B/2 cyclic blocks each. Therefore, the codeword is divided into (i) a group of X cyclic blocks, where X is the remainder of N divided by B/2 (this group is hereinafter referred to as "remainder group"), and (ii) a group of one or more sections each consisting of B/2 cyclic blocks. The mapping for the remainder group is not a subject of the present invention. One option is to perform the mapping sequentially.

For the cases where N is a multiple of B/2, i.e. B=6 and 10 in the above examples, the coded word can be divided into one or more sections of B/2 cyclic blocks each.

<Transmitter>

The following describes a transmitter included in a communication system according to an embodiment of the present invention, with reference to the drawings.

Figure 19:
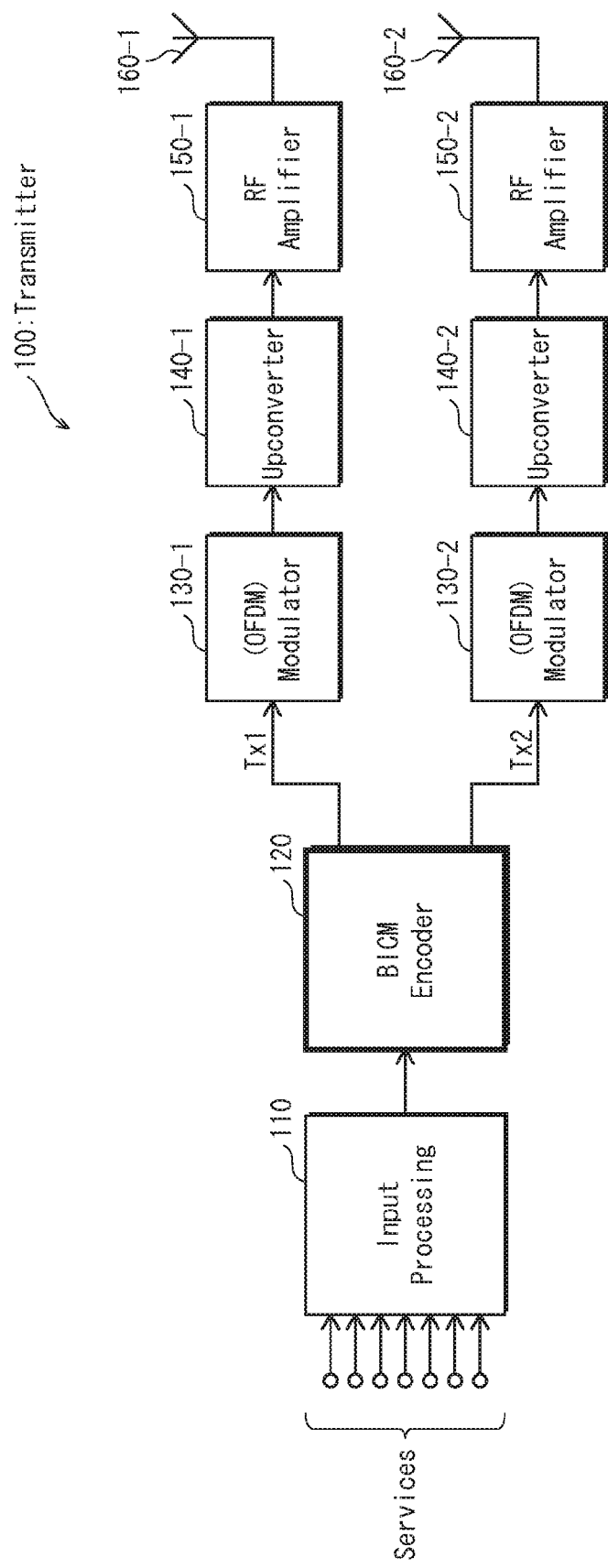
FIG. 19 is a block diagram of a transmitter included in a communication system according to an embodiment of the present invention.

FIG. 19 is a block diagram of a transmitter 100 according to an embodiment of the present invention. The transmitter 100 includes an input processing unit 110, a bit-interleaved coding and modulation (BICM) encoder 120, (OFDM) modulators 130-1 through 130-4, up-converters 140-1 through 140-2, RF power amplifiers 150-1 through 150-2, and transmit antennas 160-1 through 160-2. Except for the BICM encoder 120, each component performs substantially the same processing as the corresponding component of the transmitter 1000 shown in FIG. 1, and the detailed descriptions are omitted.

Figure 20:
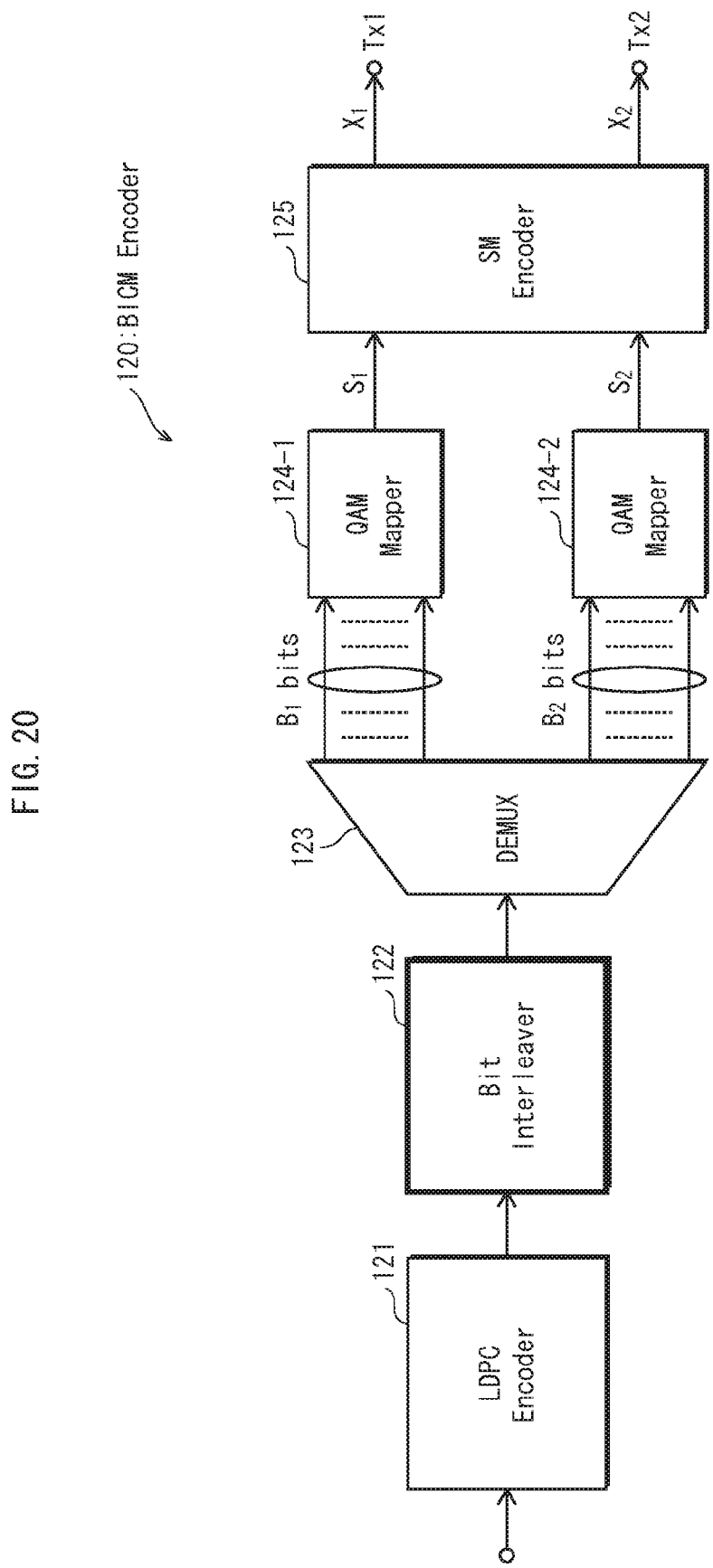
FIG. 20 is a block diagram of the BICM encoder shown in FIG. 19.

The following describes in detail the BICM encoder 120 shown in FIG. 19, with reference to FIG. 20.

FIG. 20 is a block diagram of the BICM encoder 120 shown in FIG. 19 for spatial multiplexing.

The BICM encoder 120 includes an LDPC encoder 121, a bit interleaver 122, a demultiplexer 123, QAM mappers 124-1 through 124-4, and a spatial-multiplexing (SM) encoder 125. Except for the bit interleaver 122 and the demultiplexer 123, each component performs substantially the same processing as the corresponding component of the BICM encoder 1200 shown in FIG. 2.

The LDPC encoder 121 generates a codeword by using LDPC codes and outputs the codeword to the bit interleaver 122. The codeword generated by the LDPC encoder 121 consists of N cyclic blocks, and each cyclic block consists of Q bits.

For example, the LDPC encoder 121 uses, as a QC LDPC code, QC LDPC codes shown in FIGS. 8 through 14. In this case, Q=360 and N=45.

The bit interleaver 122 receives the codeword from the LDPC encoder 121, and interleaves the bits of the received codeword. The demultiplexer 123 demultiplexes the interleaved bits of the codeword (i.e. divides the bits into a plurality of bit sequences, and applies permutation to the bit sequences), and maps the bits onto constellation words. The bit interleaver 122 and the demultiplexer 123 perform their respective processing on one or all of the bits of the LDPC codeword so as to fulfill the conditions (A1) and (A2) (namely, conditions (B1), (B2) and (B3), when T=2, conditions (C1), (C2) and (C3)).

Each of the QAM mappers 124-1 through 124-2 maps the constellation words provided by the demultiplexer 123 onto complex QAM symbols. The SM encoder 125 performs coding for spatial-multiplexing on the complex QAM symbols provided by the QAM mappers 124-1 through 124-2.

Figure 21:
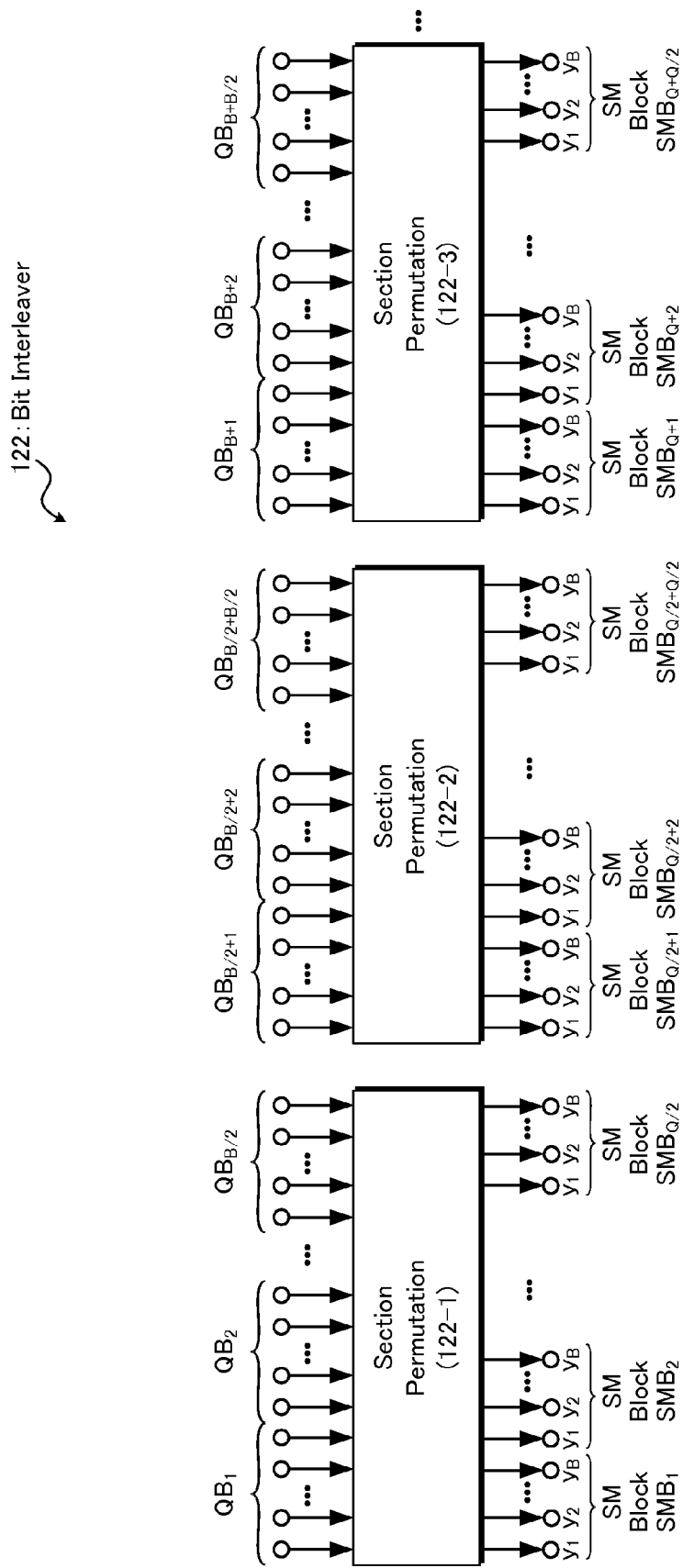
FIG. 21 is a block diagram showing an example structure of the bit interleaver shown in FIG. 20.

The following explains an example of the bit interleaver 122 shown in FIG. 20, with reference to FIG. 21.

FIG. 21 is a block diagram showing an example structure of the bit interleaver 122 shown in FIG. 20.

In the case of the bit interleaver 122 whose example structure is shown in FIG. 21, N cyclic blocks are divided into (i) a group of one or more sections each consisting of B/2 cyclic blocks and (ii) a group of X cyclic blocks, where X is the remainder of N divided by B/2 (i.e. remainder group). When N is a multiple of B/2, no remainder group exists.

For example, when N=15, Q=8, B=6, which is the case corresponding to the case shown in FIG. 18A, the number of the cyclic blocks associated with one section is B/2=3, the number of the SM blocks is Q/2=4, and the number of the sections is 5.

When N=15, Q=8, B=8, which is the case corresponding to the case shown in FIG. 18B, the number of the cyclic blocks associated with one section is B/2=4, the number of the SM blocks is Q/2=4, the number of the sections is 3, and the number of the cyclic blocks in the remainder group is 3.

When N=15, Q=8, B=10, which is the case corresponding to the case shown in FIG. 18C, the number of the cyclic blocks associated with one section is B/2=5, the number of the SM blocks is Q/2=4, and the number of the sections is 3.

The bit interleaver 122, whose example structure is shown in FIG. 21, includes section permutation units 122-1, 122-2, 122-3 and so on, for each section. When N is not a multiple of B/2, some cyclic blocks does not belong to any section. With respect to such cyclic blocks, namely blocks not belonging to any section, bit permutation may not be performed or performed according to a given permutation rule.

Each of the section permutation units 122-1, 122-2, 122-3 and so on outputs Q*(B/2) bits of the B/2 cyclic blocks after applying bit permutation to them so that Q bits of cyclic block QB are mapped to two bits of each of Q/2 SM blocks. Then, the demultiplexer 123 outputs the constellation words after applying bit permutation for each SM block so that two bits in the same cyclic block in each SM block is mapped to two bits having the same robustness in the same constellation word. The section permutation units 122-1, 122-2, 122-3 and so on may operate independently from each other. It is not necessary that one section permutation unit is provided for each section. A smaller number of section permutation units than the number of sections may be used by a time-division scheme.

The following explains an example operation of a section permutation unit shown in FIG. 21 when Q=8 and B=6, 8 or 10, with reference to FIGS. 22A through 22C and FIGS. 23A through 23C.

Figure 22A:
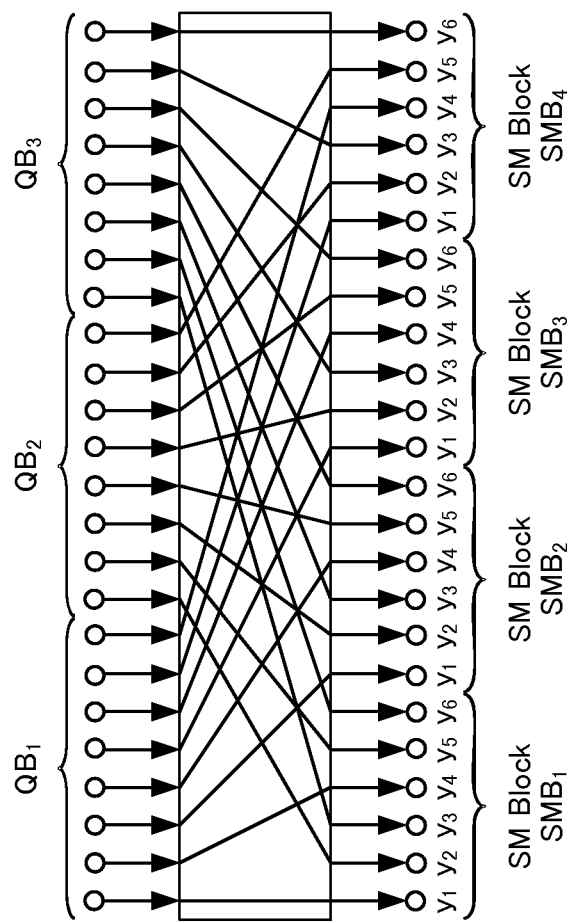
FIG. 22A shows an example of bit permutation function performed by a section permutation unit shown in FIG. 21 when B=6.

FIG. 22A shows an example of the bit permutation function performed by a section permutation unit when Q=8 and B=6. FIG. 23A shows an example operation for bit permutation performed by the section permutation unit shown in FIG. 22A.

As shown in FIG. 22A, the section permutation unit 122-1A applies bit permutation to the input bits so that the bits of the three (i.e. B/2=3) cyclic blocks $QB_1$ through $QB_3$ are mapped to the bits of four (i.e. Q/2=4) SM blocks $SMB_1$ through $SMB_4$.

Figure 23B:
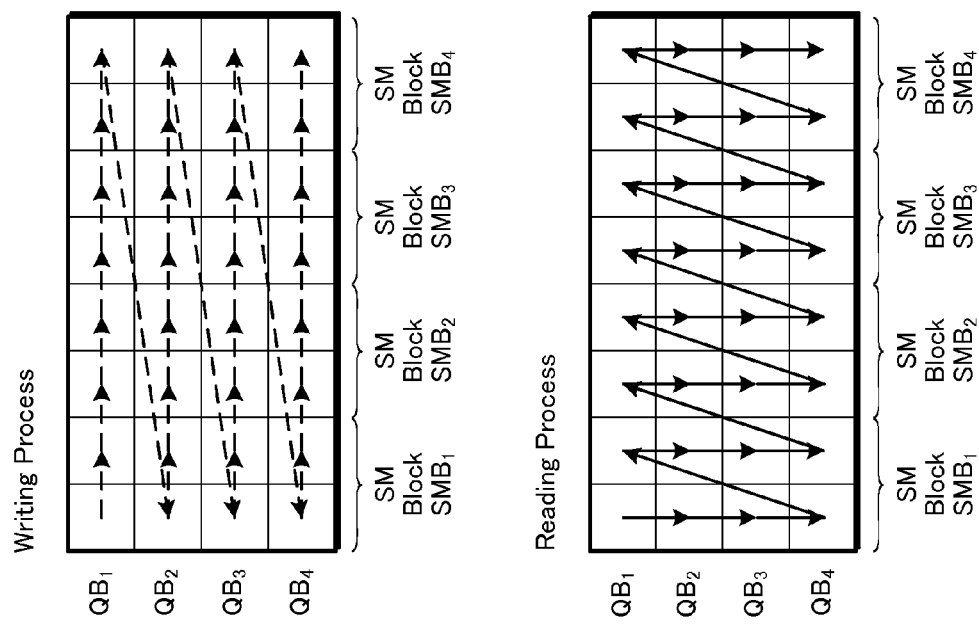
FIG. 23B shows an example operation for bit permutation performed by a section permutation unit shown in FIG. 22B.

To apply bit permutation to the input bits shown in FIG. 22A, the section permutation unit 122-1A performs processing that is equivalent to column-row interleaving as shown in FIG. 23A for example, by which the section permutation unit 122-1A writes bits row-wise into an interleaver matrix having Q columns and B/2 rows (=eight columns and three rows) and reads bits column-wise from the interleaver matrix. In FIG. 23A, and in FIGS. 23B through 23C which will be described later, the order of bit writing is represented by a dotted arrow, and the order of bit reading is represented by a bold arrow.

Figure 22B:
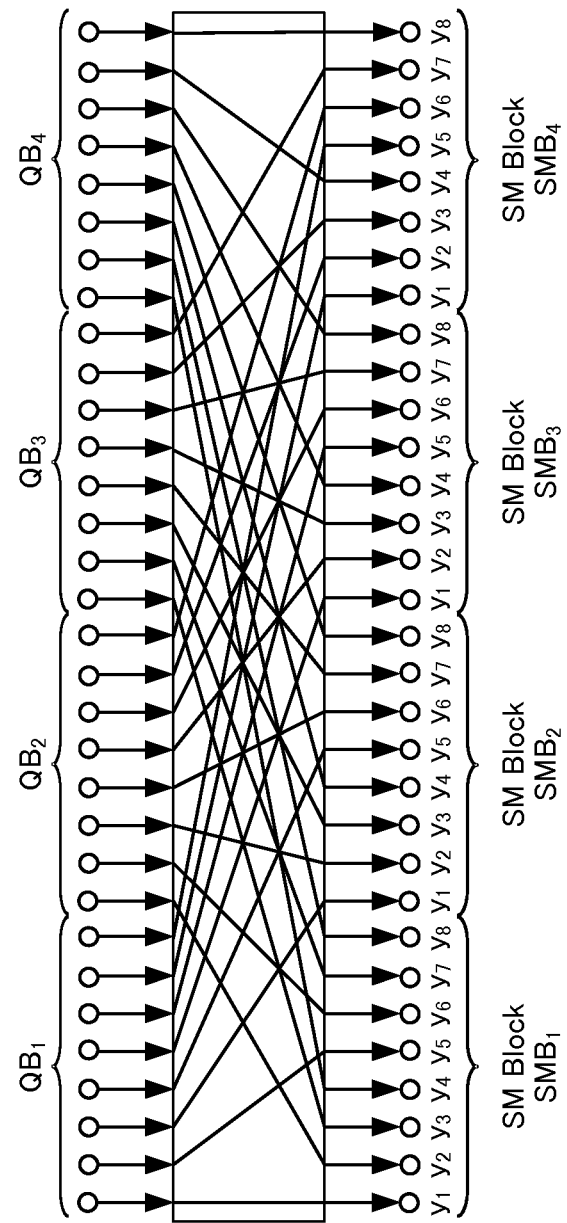
FIG. 22B shows an example of bit permutation function performed by a section permutation unit shown in FIG. 21 when B=8.

FIG. 22B shows an example of the bit permutation function performed by a section permutation unit when Q=8 and B=8. FIG. 23B shows an example operation for bit permutation performed by the section permutation unit shown in FIG. 22B.

As shown in FIG. 22B, the section permutation unit 122-1B applies bit permutation to the input bits so that the bits of the four (i.e. B/2=4) cyclic blocks $QB_1$ through $QB_4$ are mapped to the bits of four (i.e. Q/2=4) SM blocks $SMB_1$ through $SMB_4$.

To apply bit permutation to the input bits shown in FIG. 22B, the section permutation unit 122-1B performs processing that is equivalent to column-row interleaving as shown in FIG. 23C for example, by which the section permutation unit 122-1B writes bits row-wise into an interleaver matrix having Q columns and B/2 rows (=eight columns and four rows) and reads bits column-wise from the interleaver matrix.

Figure 22C:
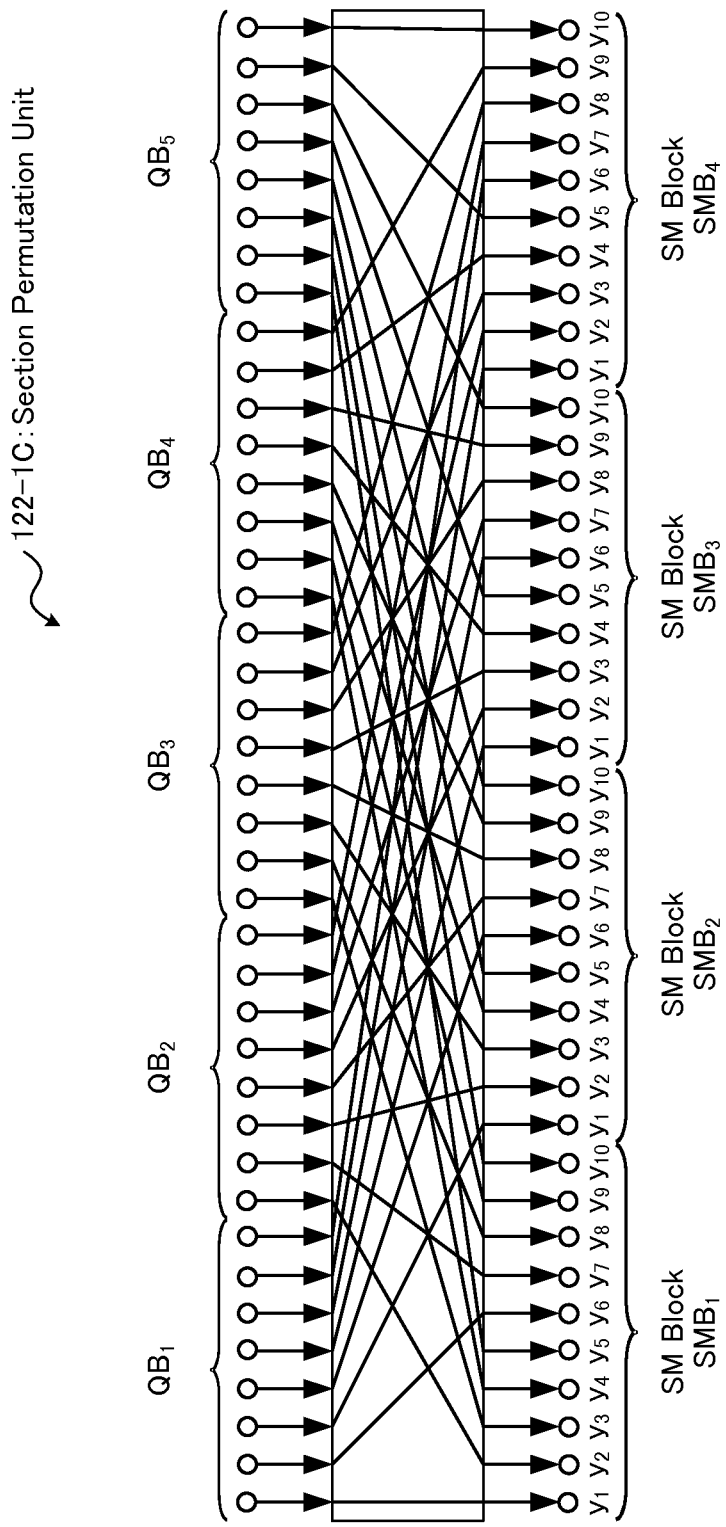
FIG. 22C shows an example of bit permutation function performed by a section permutation unit shown in FIG. 21 when B=10.

FIG. 22C shows an example of the bit permutation function performed by a section permutation unit when Q=8 and B=10. FIG. 23C shows an example operation for bit permutation performed by the section permutation unit shown in FIG. 22C.

As shown in FIG. 22C, the section permutation unit 122-1C applies bit permutation to the input bits so that the bits of the five (i.e. B/2=5) cyclic blocks $QB_1$ through $QB_5$ are mapped to the bits of four (i.e. Q/2=4) SM blocks $SMB_1$ through $SMB_4$ To apply bit permutation to the input bits shown in FIG. 22C, the section permutation unit 122-1C performs processing that is equivalent to column-row interleaving as shown in FIG. 23C for example, by which the section permutation unit 122-1C writes bits row-wise into an interleaver matrix having Q columns and B/2 rows (=eight columns and five rows) and reads bits column-wise from the interleaver matrix.

Each section permutation unit described with reference to FIGS. 22A through 22C and FIGS. 23A through 23C can be generalized as follows.

The input bits to the section permutation unit are the bits of cyclic blocks $QB_{B/2*i+1}$ thorough $QB_{B/2*i+B/2}$, and the output bits to the section permutation unit are the bits of SM blocks $SMB_{Q/2*i+1}$ through $SMB_{Q/2*i+Q/2}$. The section permutation unit performs processing that is equivalent to column-row interleaving, by which the section permutation unit writes bits row-wise into an interleaver matrix having Q columns and B/2 rows, and reads column-wise from the interleaver matrix. Note that Q is a cyclic factor, and B is the number of bits of an SM block.

Figure 24A:
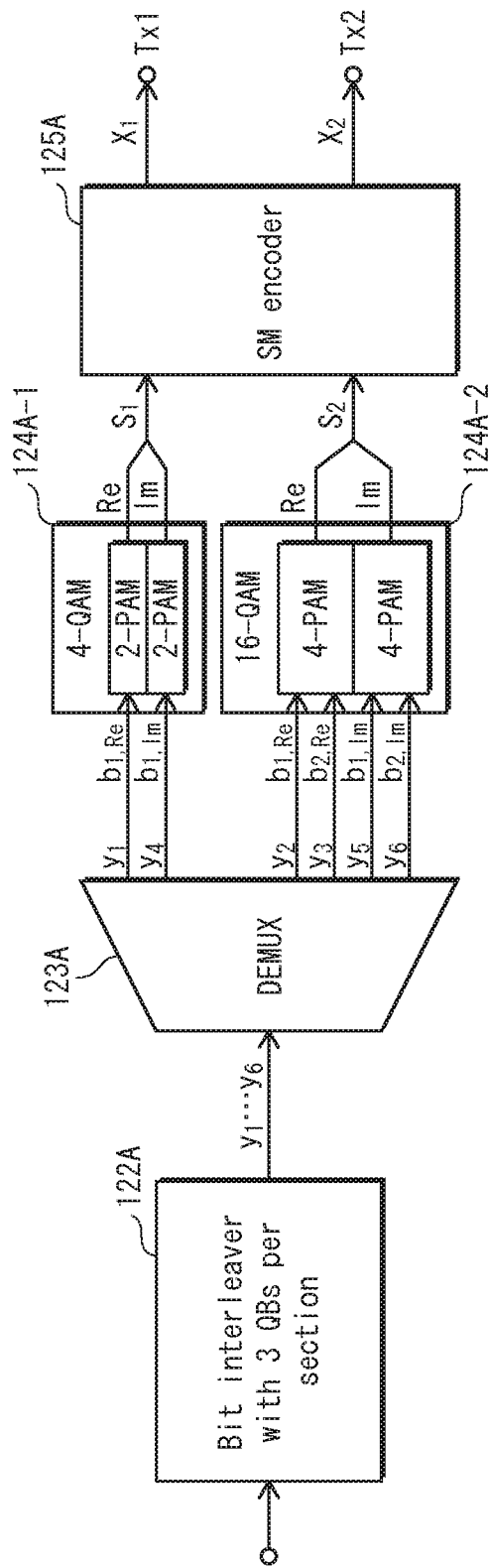
FIG. 24A shows an example structure of the bit-interleaved coding and modulation encoder shown in FIG. 20 when B=6.
Figure 24B:
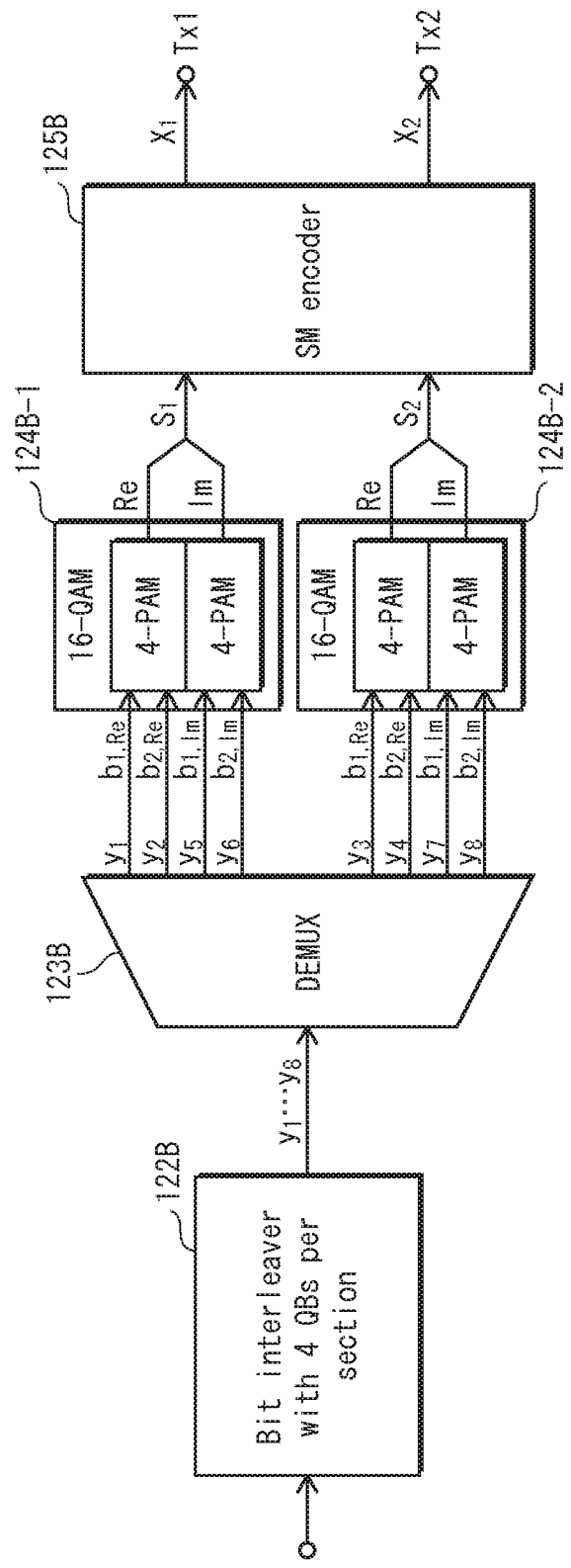
FIG. 24B shows an example structure of the bit-interleaved coding and modulation encoder shown in FIG. 20 when B=8.
Figure 24C:
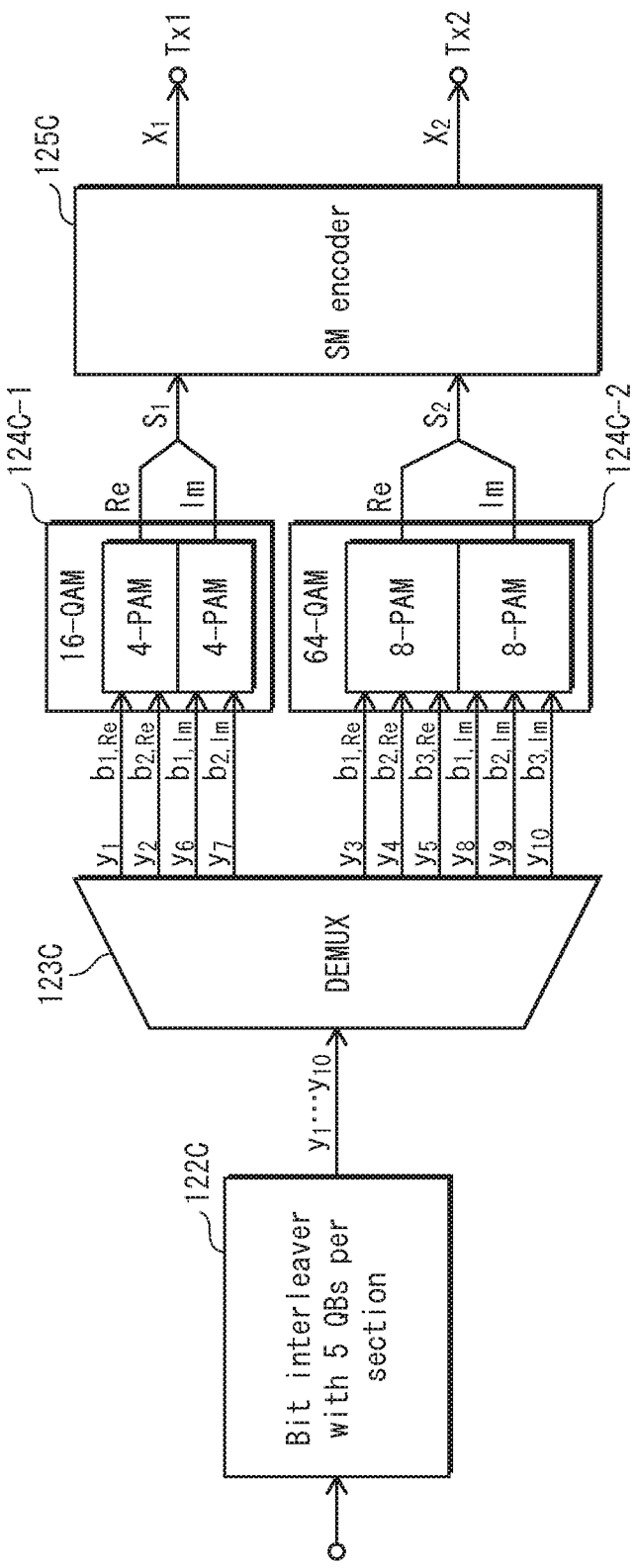
FIG. 24C shows an example structure of the bit-interleaved coding and modulation encoder shown in FIG. 20 when B=10.

The following describes example operations performed by the bit interleaver, demultiplexer and QAM mapper pathway of the BICM encoder 120 shown in FIG. 20, with reference to FIGS. 24A through 24C. It is assumed that the number of transmit antennas (i.e. the number of constellation words for each SM block) is two.

FIG. 24A shows an example structure of the bit interleaver, demultiplexer and QAM mapper pathway of a BICM encoder when B=6.

The QC LDPC codewords generated by the LDPC encoder (not depicted in this figure. See FIG. 20) included in the BICM encoder 120A is fed to the bit interleaver 122A, which includes the section permutation unit described with reference to FIG. 22A and FIG. 23A. The bits of the QC LDPC codewords are interleaved by the bit interleaver 122A, and the codewords with the interleaved bits are fed to the demultiplexer 123A.

In the example shown in FIG. 24A, the demultiplexer 123A applies bit permutation to the bits $y_1$ through $y_6$ to arrange them in the order of $y_1, y_4, y_2, y_3, y_5, y_6$. As a result, the bits $(y_1, y_4)$ are mapped to the constellation word $C_A$ $(b_{1,Re}, b_{1,Im})$ and the bits $(y_2, y_3, y_5, y_6)$ are mapped to the constellation word $C_B$ $(b_{1,Re}, b_{2,Re}, b_{1,Im}, b_{2,Im})$.

The 4-QAM mapper 124A-1 maps the constellation words $C_A$, namely $(b_{1,Re}, b_{1,Im})$, to the complex symbols (Re, Im) by using two 2-PAM mappers. In contrast, the 16-QAM mapper 124A-2 maps the constellation words $C_B$, namely $(b_{1,Re}, b_{2,Re}, b_{1,Im}, b_{2,Im})$, to the complex symbols (Re, Im) by using two 4-PAM mappers.

The SM encoder 125A performs coding for spatial-multiplexing on the complex symbols $s_1, s_2$ to generate transmission signals $x_1$ and $x_2$.

FIG. 24B shows an example structure of the bit interleaver, demultiplexer and QAM mapper pathway of a BICM encoder when B=8.

The QC LDPC codewords generated by the LDPC encoder (not depicted in this figure. See FIG. 20) included in the BICM encoder 120B is fed to the bit interleaver 122B, which includes the section permutation unit described with reference to FIG. 22B and FIG. 23B. The bits of the QC LDPC codewords are interleaved by the bit interleaver 122B, and the codewords with the interleaved bits are fed to the demultiplexer 123B.

In the example shown in FIG. 24B, the demultiplexer 123B applies bit permutation to the bits $y_1$ through $y_8$ to arrange them in the order of $y_1, y_2, y_5, y_6, y_3, y_4 y_7, y_8$. As a result, the bits $(y_1, y_2, y_5, y_6)$ are mapped to the constellation word $C_A$ ($b_{1,Re}$, $b_{2,Re}$, $b_{1,Im}$, $b_{2,Im}$) and the bits ($y_3$, $y_4$, $y_7$, $y_8$) are mapped to the constellation word $C_B$ ($b_{1,Re}$, $b_{2,Re}$, $b_{1,Im}$, $b_{2,Im}$).

The 16-QAM mappers 124B-1 and 124B-2 map the constellation word $C_A$, $C_B$ ($b_{1,Re}$, $b_{2,Re}$, $b_{1,Im}$, $b_{2,Im}$) to the complex symbol (Re, Im) by using two 4-PAM mappers, respectively.

The SM encoder 125B performs coding for spatial-multiplexing on the complex symbols $s_1$ and $s_2$ to generate transmission signals $x_1$ and $x_2$.

FIG. 24C shows an example structure of the bit interleaver, demultiplexer and QAM mapper pathway of a BICM encoder when B=10.

The QC LDPC codewords generated by the LDPC encoder (not depicted in this figure. See FIG. 20) included in the BICM encoder 120C is fed to the bit interleaver 122C, which includes the section permutation unit described with reference to FIG. 22C and FIG. 23C. The bits of the QC LDPC codewords are interleaved by the bit interleaver 122C, and the codewords with the interleaved bits are fed to the demultiplexer 123C.

In the example shown in FIG. 13C, the demultiplexer 123C applies bit permutation to the bits $y_1$ through $y_{10}$ to arrange them in the order of $y_1$, $y_2$, $y_6$, $y_7$, $y_3$, $y_4$, $y_5$, $y_8$, $y_9$, $y_{10}$. As a result, the bits ($y_1$, $y_2$, $y_6$, $y_7$) are mapped to the constellation word $C_A$ ($b_{1,Re}$, $b_{2,Re}$, $b_{1,Im}$, $b_{2,Im}$), and the bits ($y_3$, $y_4$, $y_5$, $y_8$, $y_9$, $y_{10}$) are mapped to the constellation word $C_B$ ($b_{1,Re}$, $b_{2,Re}$, $b_{3,Re}$, $b_{1,Im}$, $b_{2,Im}$, $b_{3,Im}$).

The 16-QAM mapper 124C-1 maps the constellation words $C_A$, namely ($b_{1,Re}$, $b_{2,Re}$, $b_{1,Im}$, $b_{2,Im}$), to the complex symbols (Re, Im) by using two 4-PAM mappers. In contrast, the 64-QAM mapper 124C-2 maps the constellation words $C_B$, namely ($b_{1,Re}$, $b_{2,Re}$, $b_{3,Re}$, $b_{1,Im}$, $b_{2,Im}$, $b_{3,Im}$), to the complex symbols (Re, Im) by using two 8-PAM mappers.

The SM encoder 125C performs coding for spatial-multiplexing on the complex symbols $s_1$ and $s_2$ to generate transmission signals $x_1$ and $x_2$.

Each demultiplexer described with reference to FIGS. 24A through 24C can be generalized as follows. Here, it is assumed that the number of bits of an SM block is B, the number of antennas (constellation words) is T, the number of bits of a constellation word $C_i$ is $B_i=2*F_i$. Here, i denotes the index of an antenna (constellation word) and is an integer falling within the range from 1 to T.

When $L_i = L_{i-1} + F_{i-1}$ (where $L_1 = 0$), the demultiplexer applies bit permutation to the input bits so that the bits ($y_{Li+1}$, $y_{Li+2}$, ..., $y_{Li+Fi}$, $y_{B/2+Li+1}$, $y_{B/2+Li+2}$, ..., $y_{B/2+Li+Fi}$) are mapped to the constellation word $C_i$.

Embodiment 2

In Embodiment 2, description is made on a bit interleaver with a different structure from the bit interleaver 122 described in Embodiment 1. Note that in Embodiment 2, constituent elements that perform substantially the same processing as the processing performed by the constituent elements of Embodiment 1 are indicated with the same reference signs, and a description thereof is omitted.

Figure 25:
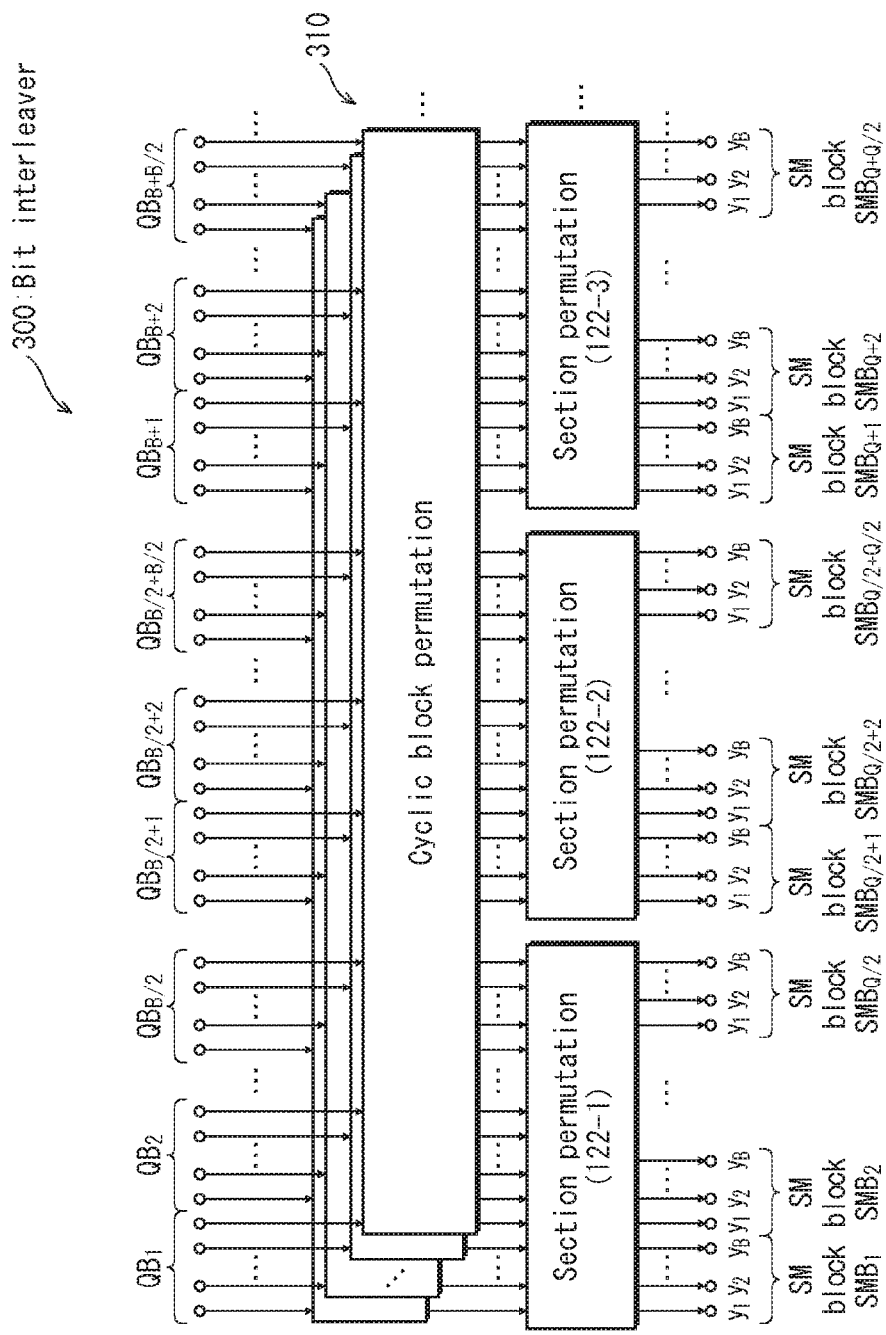
FIG. 25 is a block diagram showing another example structure of the bit interleaver shown in FIG. 20.

FIG. 25 is a block diagram showing another example structure of the bit interleaver pertaining to Embodiment of the present invention. A bit interleaver 300 shown in FIG. 25 includes cyclic block permutation unit 310 in addition to the structure of the bit interleaver 122 shown in FIG. 21.

Figure 26:
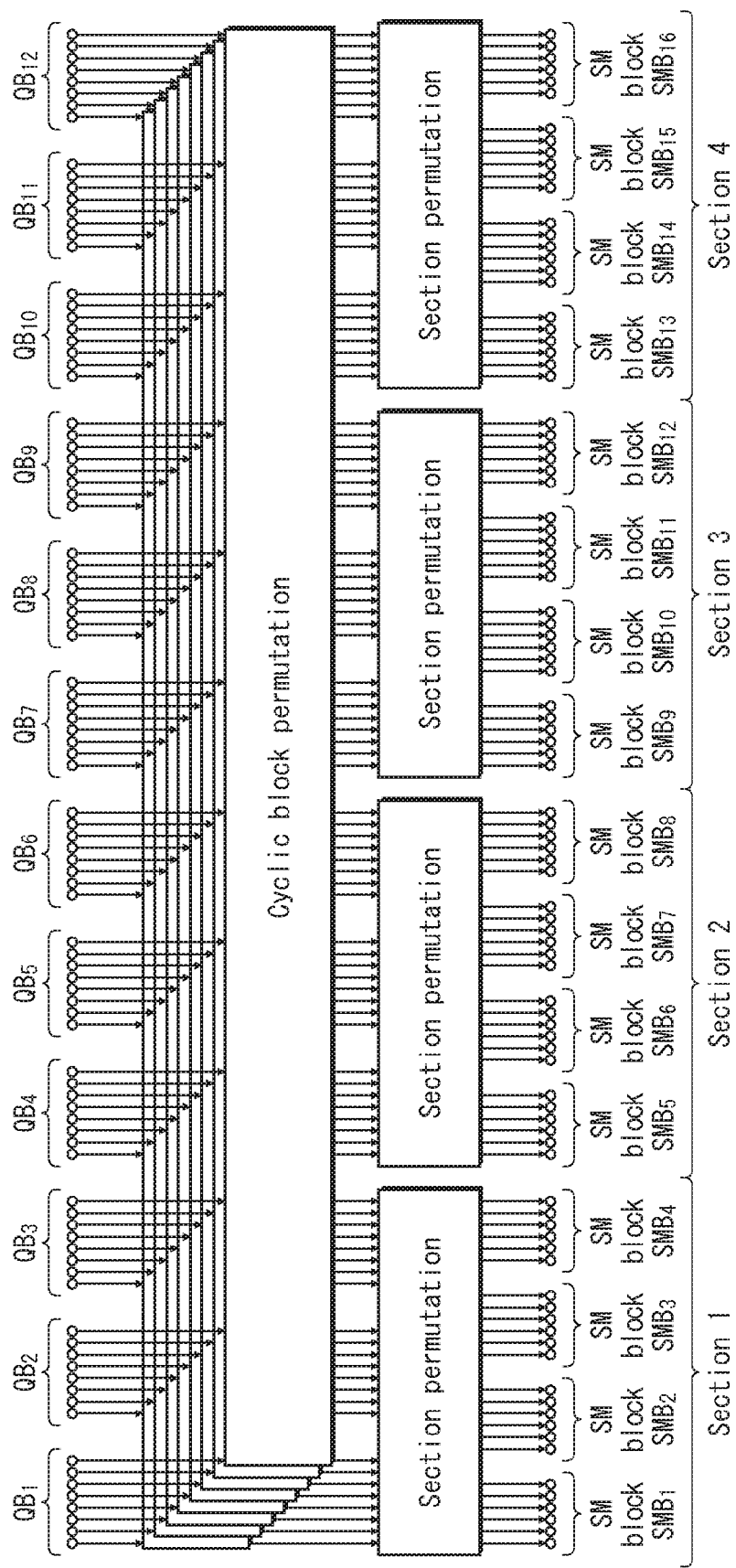
FIG. 26 is a block diagram showing an example structure of the bit interleaver shown in FIG. 25, when Q=8, N=12 and B=6.

FIG. 26 shown as an example of a bit interleaver shown in FIG. 25, when Q=8, N=12 and B=6. However, an LDPC code consists of N=12 cyclic blocks $QB_1$, ..., $QB_{12}$ with Q=8 bits each. The bits of the LDPC code are mapped to 16 SM blocks $SMB_1$, $SMB_2$, ..., $SMB_{16}$ having 6 bits each.

The bit interleaver 300 shown in FIG. 25 performs permutation consisting of at least two stages on the QC LDPC codeword, and includes the cyclic block permutation unit 310 and section permutation units 122-1, 122-2 and so on.

In a first stage, the bit interleaver 300 applies a cyclic block permutation to the QC LDPC codeword in order to rearrange the sequence of N cyclic blocks constituting the QC LDPC code, without affecting the sequence of the bits within each cyclic block. The first stage is performed by the cyclic block permutation unit 310.

In a second stage, the bit interleaver 300 maps the bits of the permuted QC LDPC codeword (LDPC codeword with the shuffled cyclic blocks) to SM blocks. Such mapping is implemented by dividing the QC LDPC codeword into a plurality of sections such that the bits of the QC LDPC codeword are mapped to the SM blocks on a section-by-section basis. Note that the second stage is performed by the section permutation units 122-1, 122-2, and so on. The bits mapped to the SM blocks by the bit interleaver 300 are demultiplexed by the demultiplexer 123 (see FIG. 20), and subsequently, mapped to a plurality of the constellation words of the SM blocks.

Each section is preferably made up of B/2 cyclic blocks such that the above conditions (i) and (ii) can be met.

The inventor has realized that the performance of the communication system can be improved for a given LDPC code by optimizing the cyclic block permutation, i.e., by choosing a cyclic block permutation that matches constellation bits of different reliabilities with cyclic blocks of different importance levels.

The mapping of cyclic blocks to constellation word bits, however, is not straightforward. Finding optimized cyclic block permutations is a very time-consuming process as no analytical solutions are known so far. The method used for finding the optimized cyclic block permutations disclosed in the present invention consists of the following steps, which are applied for each of the 3×3×7=63 configurations, using the formula (number of B)×(number of transmit power ratios)×(number of code rates).

As a preliminary step, several (10 ... 100) unconstrained random QB permutations are generated. For these cyclic block permutations, Monte-Carlo simulations are performed with blind and iterative demapping in order to generate the corresponding BLER-vs-SNR plots. FIG. 27 shows 20 such plots for the code rate 8/15 and B=8 bits per channel slot. The FIG. 27 also shows in bold lines simulation results for the optimized permutation found by applying the steps disclosed in the present invention.

The inventor discovered that optimizing the QB permutation for blind demapping results in suboptimal performance with iterative demapping and vice versa. Finding permutations that are good for both types of demapping remains a challenging task.

It is therefore an object of the present invention to present cyclic block permutations that have good performance with both blind and iterative demapping.

From the preliminary step, the SNR range for various cyclic block permutations can be determined. Then, a threshold SNR is set in order to select only permutations that have good performance with blind demapping. Good performance means low SNR. In FIG. 27, for example, the threshold SNR could be 9.8 dB. The threshold SNR should not be set too low since that will exclude many permutations that are very good with iterative demapping. Besides, cyclic block permutations that are heavily optimized for blind demapping perform badly with iterative demapping. Selecting the initial threshold SNR appropriately is a question of experience.

In a first selection step, a large number of unconstrained random cyclic block permutations (e.g. >1,000) is generated. For each cyclic block permutation, the corresponding BLER curve is determined, e.g. through Monte-Carlo simulations, and only the cyclic block permutations with a SNR at the target BLER lower than the defined threshold SNR are selected.

For the surviving permutations, the BLER curves with iterative demapping are determined and the best permutation is selected. As an example it is assumed that this permutation is:

06 03 38 04 34 20 02 26 43 25 28 32 12 21 35 41 40 13 37 15 08 30 09 16 07 11 10 42 44 39 24 22 29 19 36 01 23 33 17 18 27 14 31 05

This cyclic block permutation rearranges the sequence of the cyclic blocks $QB_1$, $QB_2$, $QB_3$ and so on to the sequence $QB_6$, $QB_3$, $QB_{38}$ and so on.

This cyclic block permutation is further shown in FIG. 28A. Note that each of FIG. 28A and later described FIGS. 28B and 28C shows constellation bits and sections. In examples shown in FIGS. 28A-28C, the number of cyclic blocks per section is four, and the complex QAM symbols $S_1$ and $S_2$ are 16-QAM symbols.

In a second selection step, we generate a medium number (e.g. 100 . . . 1,000) of constrained random cyclic block permutations derived from the cyclic block permutation returned by the first selection step, and apply the selection criterion from the first selection step to the generated cyclic block permutations. The constrained cyclic block permutations are derived by applying a random cyclic block permutation to the cyclic blocks of a single randomly selected section, i.e. to a column of FIG. 28A. This is illustrated in FIG. 28B, in which section 7 was selected and permuted so as to obtain [10 11 42 07] instead of the original cyclic-block sequence [07 11 10 42]. Applying such a constraint ensures that the variations in performance are small and concentrated around the already good permutation selected in the first step. In this manner, better permutations can be found more efficiently than by using a blind unconstrained search.

In a third selection step, a medium number (e.g., 100 . . . 1,000) of constrained random cyclic block permutations are derived from the permutation returned by the second selection step and the selection criterion from the first selection step is applied to the generated cyclic block permutations. The constrained cyclic block permutations are derived by applying random permutations to cyclic blocks of the rows of FIG. 28B. One random permutation is applied to each row, i.e. robustness level, the length of each permutation being the number of sections. One such example is shown in FIG. 28C.

In this third selection step the variations in performance are rather small and affect the iterative demapping more than the blind demapping. The performance with iterative demapping can therefore be optimized without sacrificing the performance with blind demapping.

For the three transmitter power ratios (described above), various numbers of bits for each of the three channel slots (number of bits of SM blocks), and different seven code rates, results of the optimization process based on the above method are illustrated in FIGS. 29A to 29C, FIGS. 30A to 30C and FIGS. 31A to 31C. Note that QC LDPC codes in these figures are codes defined by the DVB-NGH standard with code rates CR of 1/3, 2/5, 7/15, 8/15, 3/5, 2/3, and 11/15, as shown in FIGS. 8 to 14, respectively. In addition, each of these figures shows the case where the number of transmit antennas (the number of constellation words of a SM block) is two.

FIG. 29A indicates optimized cyclic block permutations when transmitter power ratio=1/1, the number of bits of channel slots=6, and code rates CR=1/3, 2/5, 7/15, 8/15, 3/5, 2/3, and 11/15.

FIG. 29B indicates optimized cyclic block permutations when transmitter power ratio=1/1, the number of bits of channel slots=8, and code rates CR=1/3, 2/5, 7/15, 8/15, 3/5, 2/3, and 11/15.

FIG. 29C indicates optimized cyclic block permutations when transmitter power ratio=1/1, the number of bits of channel slots=10, and code rates CR=1/3, 2/5, 7/15, 8/15, 3/5, 2/3, and 11/15.

FIG. 30A indicates optimized cyclic block permutations when transmitter power ratio=1/2, the number of bits of channel slots=6, and code rates CR=1/3, 2/5, 7/15, 8/15, 3/5, 2/3, and 11/15.

FIG. 30B indicates optimized cyclic block permutations when transmitter power ratio=1/2, the number of bits of channel slots=8, and code rates CR=1/3, 2/5, 7/15, 8/15, 3/5, 2/3, and 11/15.

FIG. 30C indicates optimized cyclic block permutations when transmitter power ratio=1/2, the number of bits of channel slots=10, and code rates CR=1/3, 2/5, 7/15, 8/15, 3/5, 2/3, and 11/15.

FIG. 31A indicates optimized cyclic block permutations when transmitter power ratio=1/4, the number of bits of channel slots=6, and code rates CR=1/3, 2/5, 7/15, 8/15, 3/5, 2/3, and 11/15.

FIG. 31B indicates optimized cyclic block permutations when transmitter power ratio=1/4, the number of bits of channel slots=8, and code rates CR=1/3, 2/5, 7/15, 8/15, 3/5, 2/3, and 11/15.

FIG. 31C indicates optimized cyclic block permutations when transmitter power ratio=1/4, the number of bits of channel slots=10, and code rates CR=1/3, 2/5, 7/15, 8/15, 3/5, 2/3, and 11/15.

Each row of FIGS. 29A to 29C, FIGS. 30A to 30C and FIGS. 31A to 31C indicates a cyclic block permutation. Note that values such as "17" shown in each figure indicate indices of the cyclic blocks.

The second row of FIG. 29A for instance, indicates an optimized cyclic block permutation for the QC LDPC codeword defined in FIG. 9 with transmitter power ratio 1/1, B=6 bits per channel slot and code rate 2/5. In this case, the cyclic blocks of each codeword are permuted such that section 1 is made up of cyclic blocks $QB_{20}$, $QB_{16}$, and $QB_{34}$, in the stated order. Section 2 is made up of cyclic blocks $QB_{41}$, $QB_{28}$, and $QB_{36}$, and so on.

The cyclic block permutation unit 310 included in the bit interleaver 300 shown in FIG. 25 permutes N cyclic blocks of the QC LDPC code (N=45, Q360) received from the earlier LDPC encoder 121 (see FIG. 20) in an order of the cyclic block permutations shown in FIGS. 29A to 29C, FIGS. 30A to 30C and FIGS. 31A to 31C corresponding to a code rate, the number of bits of a channel slot (the number of bits of a SM block), and transmitter power ratio, which are used by the transmitter for transmission. Accordingly, the cyclic blocks of N=45 output from the cyclic block permutation unit 310 are arranged, from left to right in FIG. 25, in the order of rows corresponding to a code rate, the number of bits of a channel slot (the number of bits of a SM block), and transmitter power ratio, which are used by the transmitter for transmission shown in FIGS. 29A to 29C, FIGS. 30A to 30C and FIGS. 31A to 31C.

Each of the section permutation units 122-1, 122-2 and so on included in the bit interleaver 300 and the demultiplexer 123 map, on constellation words, the bits of the LDPC code (LDPC code with rearranged cyclic blocks) after applying cyclic block permutation to them by performing processing described with use of FIGS. 22A to 22C, FIGS. 23A to 23C and FIGS. 24C to 24C depending on the number of bits of a channel slot (the number of bits of a SM block), the value of the cyclic factor Q, and the sizes of two QAM constellations used for QAM constellation mapping.

The processing of FIGS. 22A to 22C and FIGS. 23A to 23C is performed after replacing the cyclic factor Q from 8 to 360 (see generalized explanation).

The following further describes processing of mapping the bits of the LDPC codeword onto constellation words performed by the bit interleaver and the demultiplexer. Note that in the following section, the $k^{th}$ cyclic block is the $k^{th}$ from the upper bit of the rearranged LDPC codeword (in FIG. 25, from the left side of the input of the section permutation units, in FIGS. 22A to 22C, FIGS. 30A to 30C and FIGS. 31C to 31C, from the left side of the section).

When the number of bits of a channel slot (the number of bits of a SM block) B=6, the bits of the QC LDPC codeword rearranged by the cyclic block permutation are mapped onto the constellation words as follows. Note that the transmit power ratios are 1/1, 1/2, and 1/4, the code rates are 1/3, 2/5, 7/15, 8/15, 3/5, 2/3 and 11/15 (QC LDPC code defined by Table shown in FIGS. 8 through 14).

The mapping processing is performed such that two bits of the 4-QAM constellation word of a lower modulation level consists of two bits of the first cyclic block of each section, two bits having the lowest robustness level of the 16-QAM constellation word of a higher modulation level consists of two bits of the second cyclic block of each section, and two bits having the highest robustness level of the 16-QAM constellation word consists of the two bits of the third cyclic block of each section.

For example, when B=6, the code rate CR=2/5, the transmit power ratio=1/1, the two bits of the 4-QAM constellation word consists of bits of the first cyclic block of each section (in the case of section 1, cyclic block $QB_{20}$), two bits of the 16-QAM constellation word having the lowest reliability consists of two bits of the second cyclic block of each section (in the case of section 1, cyclic block $QB_{16}$), and two bits of the 16-QAM constellation word having the highest reliability consists of two bits of the third cyclic block of each section (in the case of section 1, cyclic block $QB_{34}$).

When the number of bits of a channel slot (the number of bits of a SM block) B=8, the bits of the QC LDPC codeword rearranged by the cyclic block permutation are mapped onto the constellation words as follows. Note that the transmit power ratios are 1/1, 1/2, and 1/4, the code rates are 1/3, 2/5, 7/15, 8/15, 3/5, 2/3 and 11/15 (QC LDPC code defined by Table shown in FIGS. 8 through 14).

The mapping processing is performed such that two bits having the lowest robustness level of one 16-QAM constellation word consists of two bits of the first cyclic block of each section, two bits having the highest robustness level of the one 16-QAM constellation word of consists of two bits of the second cyclic block of each section, two bits having the lowest robustness level of another 16-QAM constellation word consists of the two bits of the third cyclic block of each section, and two bits having the highest robustness level of the another 16-QAM constellation word consists of the two bits of the fourth cyclic block of each section.

When the number of bits of a channel slot (the number of bits of a SM block) B=10, the bits of the QC LDPC codeword rearranged by the cyclic block permutation are mapped onto the constellation words as follows. Note that the transmit power ratios are 1/1, 1/2, and 1/4, the code rates are 1/3, 2/5, 7/15, 8/15, 3/5, 2/3 and 11/15 (QC LDPC code defined by Table shown in FIGS. 8 through 14).

The mapping processing is performed such that two bits having the lowest robustness level of a 16-QAM constellation word of a lower modulation level consists of two bits of the first cyclic block of each section, two bits having the highest robustness level of the 16-QAM constellation word consists of two bits of the second cyclic block of each section, two bits having the lowest robustness level of a 64-QAM constellation word of a higher modulation level consists of the two bits of the third cyclic block of each section, two bits having the second lowest robustness level of the 64-QAM constellation word consists of the two bits of the fourth cyclic block of each section, and two bits having the highest robustness level of the 64-QAM constellation word consists of the two bits of the fifth cyclic block of each section.

Embodiment 3

<Receiver>

The following explains a receiver included in a communication system according to an embodiment of the present invention.

Figure 32:
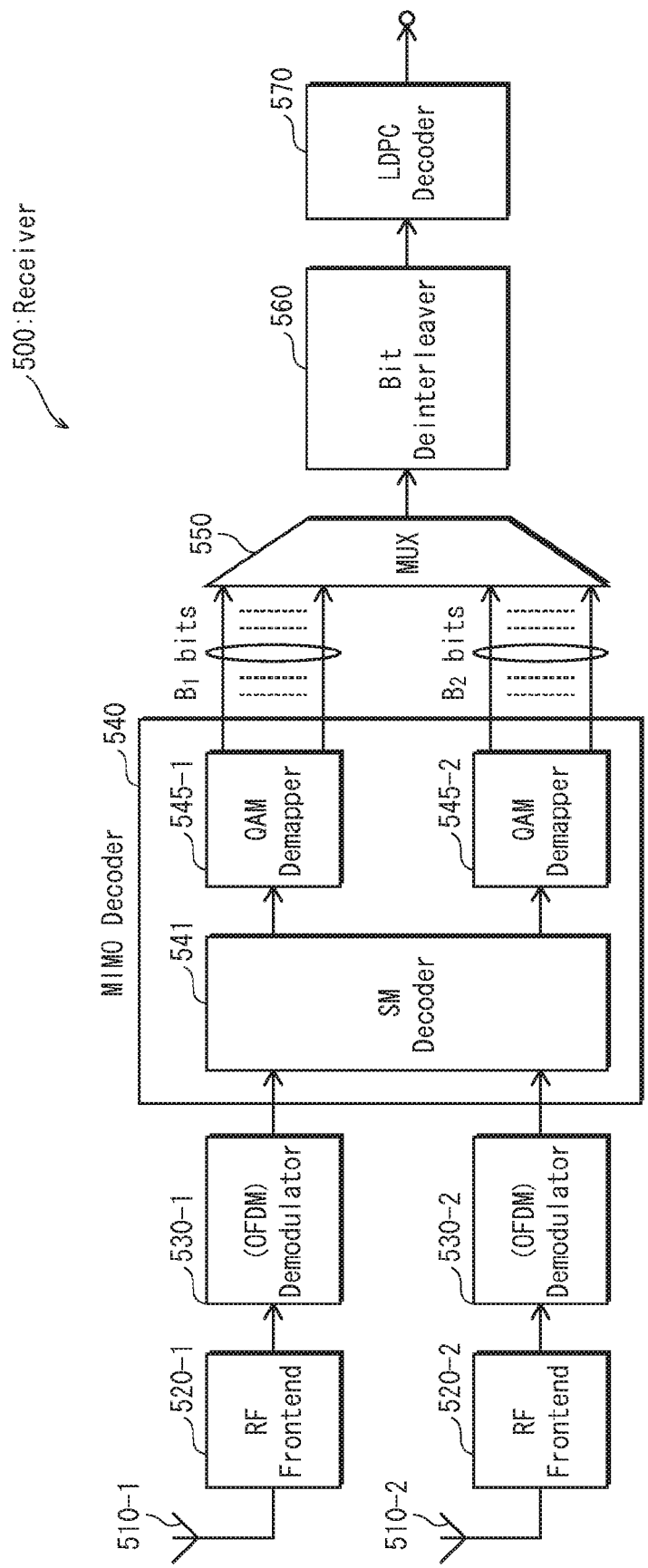
FIG. 32 is a block diagram of a receiver included in a communication system according to an embodiment of the present invention.

FIG. 32 is a block diagram of a receiver 500 according to an embodiment of the present invention. The receiver mirrors the functionality of the transmitter. A generic receiver has R receive antennas and receives the signal from the T transmit antennas. R and T are not necessarily the same. In FIG. 32, R=T=2.

The receiver 500 shown in FIG. 32 includes receive antennas 510-1 through 510-2, radio-frequency (RF) frontends 520-1 through 520-2, demodulators 530-1 through 530-2, a MIMO decoder 540, a multiplexer 550, a bit deinterleaver 560 and an LDPC decoder 570. The MIMO decoder 540 includes a spatial-multiplexing (SM) decoder 541 and QAM demappers 545-1 through 545-2.

The signal from each receive antenna 510-1, . . . , 510-2 is processed by an RF frontend 520-1, . . . , 520-2 and a demodulator 530-1, . . . , 530-2. The RF frontend 520-1, . . . , 520-2 typically comprises a tuner and a down-converter. The tuner selects a desired frequency channel, and the down-converter performs down-conversion to a desired frequency band. The demodulator 530-1, . . . , 530-4 produces for each channel slot one received symbol and T channel fading coefficients. The received symbols and the associated channel fading coefficients are complex valued. For each channel slot, the R received symbols and the T*R associated channel fading coefficients are provided as input to the SM decoder 541. With use of the R received symbols and the T*R associated channel fading coefficients, the SM decoder 541 produces T complex QAM symbols at its output. These complex symbols then undergo QAM constellation demapping, multiplexing, de-interleaving and LDPC decoding, i.e. the exact inverse steps in the transmitter as explained above in conjunction with Embodiments 1 and 2.

The QAM demappers 545-1 through 545-2 respectively perform QAM constellation demapping, corresponding to the QAM constellation mapping performed by the QAM mappers 124-1 through 124-2 included in the transmitter, on the input complex QAM symbols.

The multiplexer 550 performs, on the input from the QAM demappers 545-1 through 545-2, the inverse of the processing performed by the demultiplexer 123 included in the transmitter (i.e. processing of restoring the order of the bits before the bit permutation by the demultiplexer 123, and multiplexing the bits).

The bit deinterleaver 560 performs, on the input from the multiplexer 550, the inverse of the processing performed by the bit interleavers 122 and 300 included in the transmitter (i.e. processing of restoring the order of the bits before the bit-interleaving by the bit interleaver 122 and 300), i.e., performs bit deinterleaving.

The LDPC decoder 570 performs, on the input from the bit deinterleaver 560, LDPC decoding based on the same QC-LDPC codes as the LDPC encoder 121 of the transmitter.

The combination of SM decoding and QAM constellation demapping is sometimes referred in the art as multiple-input multiple-output (MIMO) decoding. In high-end implementations, a so-called maximum-likelihood decoding is employed, whereby the SM decoding and the QAM constellation demapping are performed jointly in one MIMO decoder 540. These aspects are well known in the art.

<Supplement 1>

The present invention is not limited to the particulars described as for Embodiments above. The present invention may be implemented in any modes for achieving the aim described above and other relevant or accompanying aims. For example, the following modifications may be adopted (1) In the above embodiments, T=2 (the number of constellation words for an SM block is two), N=45, Q=360 and B=6, 8 and 10, for example. However, the present invention is not limited to this.

The present invention may be applied to any number of antennas (including two, four, eight, etc.) except for one.

The present invention may also be applied to any QAM constellation to square QAM constellations (4-QAM, 16-QAM, 64-QAM, 256-QAM, etc.). Note that the value of B is the total number of the bits of the constellation to be used, and is an integer equal to or more than 2×T.

The present invention may also be applied to any LDPC code to those codes that are adopted for second-generation digital video broadcasting standards (e.g. DVB-S2, DVB-T2, DVB-C2, etc.), as they are defined, for instance, in tables A.1 through A.6 of the DVB-T2 standard ETSI EN 302 755. Note that the values of N, M and Q are integers that change depending on the LDPC code to be used.

(2) The present invention is not restricted to a particular form for implementing the disclosed methods and devices, both in software or in hardware. Specifically, the invention may be implemented in form of a computer-readable medium having embodied thereon computer-executable instructions that are adapted for allowing a computer, a microprocessor, a microcontroller, and the like, to perform all steps of a method according to the embodiments of the present invention. The present invention may also be implemented in form of an application-specific integrated circuit (ASIC) or in form of a field programmable gate array (FPGA).

<Supplement 2>

The following summarizes an interleaving method, an interleaver, a transmitter provided with the interleaver, a deinterleaving method corresponding to the interleaving method, a deinterleaver corresponding to the interleaver, and a receiver provided with the deinterleaver according to an embodiment of the present invention, and their advantageous effects.

(1) An interleaving method performed by a transmitter for a communication system with quasi-cyclic low-density parity-check codes, spatial multiplexing, and T transmit antennas, T being an integer greater than 1, the interleaving method being used for applying bit permutation to bits of a codeword of a quasi-cyclic low-density parity-check code in order to generate a plurality of constellation words constituting a plurality of spatial-multiplexing blocks from the codeword, the codeword consisting of N cyclic blocks, and each cyclic block consisting of Q bits, each spatial-multiplexing block consisting of B bits and consisting of T constellation words, the interleaving method comprising: a first permutation step of permuting the N cyclic blocks of the codeword; and a second permutation step of permuting the bits of the codeword, whose N cyclic blocks have been permuted, so as to map the bits to the T constellation words constituting the spatial-multiplexing block.

The first deinterleaving method performed by a receiver for a communication system with quasi-cyclic low-density parity-check codes, spatial multiplexing, and T transmit antennas, T being an integer greater than 1, the deinterleaving method comprising the step of applying the inverse of the bit permutation performed by the first interleaving method to the plurality of spatial-multiplexing blocks made up of a plurality of constellation words.

The first interleaver provided in a transmitter for a communication system with quasi-cyclic low-density parity-check codes, spatial multiplexing, and T transmit antennas, T being an integer greater than 1, the interleaver applying bit permutation to bits of a codeword of a quasi-cyclic low-density parity-check code in order to generate a plurality of constellation words of at least one spatial-multiplexing block from the codeword, the codeword consisting of N cyclic blocks, each cyclic block consisting of Q bits, the spatial-multiplexing block consisting of B bits and consisting of T constellation words, the interleaving method comprising: a first permutation unit that permutes the N cyclic blocks to obtain a permuted codeword in which a sequence of the N cyclic blocks is permuted; and a second permutation unit that permutes the bits of the permuted codeword to map the bits to the T constellation words constituting the spatial-multiplexing block.

The first deinterleaver provided in a receiver for a communication system with quasi-cyclic low-density parity-check codes, spatial multiplexing, and T transmit antennas, T being an integer greater than 1, wherein the deinterleaver is configured to apply the inverse of the bit permutation performed by the first interleaver to a plurality of constellation words of a plurality of spatial-multiplexing blocks.

The first transmitter for a communication system with quasi-cyclic low-density parity-check codes, spatial multiplexing, and T transmit antennas, T being an integer greater than 1, the transmitter comprising: a quasi-cyclic low-density parity-check encoder configured to generate a codeword by using a quasi-cyclic low-density parity-check code; the first interleaver configured to apply bit permutation to the bits of the codeword and to generate at least one spatial-multiplexing block; and a constellation mapper configured to map a plurality of constellation words of the at least one spatial-multiplexing block to a plurality of symbols.

The first receiver for a communication system with quasi-cyclic low-density parity-check codes, spatial multiplexing, and T transmit antennas, T being an integer greater than 1, the receiver comprising: a multiple-input multiple-output decoder configured to convert signals from a plurality of receive antennas into T complex symbols corresponding to T constellation words of at least one spatial-multiplexing block; the first deinterleaver configured to perform deinterleaving on the T complex symbols; and a quasi-cyclic low-density parity-check decoder configured to decode a result of the deinterleaving performed by the deinterleaver, by using the quasi-cyclic parity-check codes.

These methods and apparatuses improve the reception performance of a communication system.

(2) According to the second interleaving method, in the first interleaving method, T=2, N=45, Q=360, and B is 6, 8 or 10.

(3) According to the third interleaving method, in the second interleaving method, when N is a multiple of B/2, the N cyclic blocks are divided into a plurality of sections each including B/2 cyclic blocks, when N is not a multiple of B/2, N–X cyclic blocks are divided into a plurality of sections each including B/2 cyclic blocks, where X is the remainder of N divided by B/2, and permutation in the second permutation step is applied such that each of the spatial-multiplexing blocks associated with one of the sections is made up of only bits from the B/2 different cyclic blocks included in the one of the sections; each of the T constellation words constituting one of the spatial-multiplexing blocks associated with one of the sections is made up of bits from Bt/2 different cyclic blocks, Bt being the number of bits of the constellation word; and among a plurality of bits contained in one of the T constellation words constituting one of the spatial-multiplexing blocks associated with one of the sections, a pair of bits having the same robustness is made up of bits from a common one of the Bt/2 cyclic blocks.

This method improves processing speed by dividing, into sections, the codeword based on QC-LDPC codes and making parallel processing possible.

(4) According to the fourth interleaving method, in the third interleaving method, with B=6 and a transmission power ratio of 1/1, wherein the quasi-cyclic low-density parity-check code is a code defined by the DVB-NGH standard with a code rate of one of 1/3, 2/5, 7/15, 8/15, 3/5, 2/3, and 11/5, the bits of each spatial-multiplexing block are divided into a 4-QAM constellation word and a 16-QAM constellation word, and permutation in the first permutation step is applied according to cyclic block permutation shown in Table 2, in accordance with the code rates of the quasi-cyclic low-density parity-check code:

TABLE 2

| | | Code Rate | | | | | | |
|---|---|---|---|---|---|---|---|---|
| | | 1/3 | 2/5 | 7/15 | 8/15 | 3/5 | 2/3 | 11/15 |
| Section 1 | $1^{st}$ | 17 | 20 | 13 | 12 | 32 | 19 | 5 |
| | $2^{nd}$ | 5 | 16 | 11 | 27 | 38 | 33 | 35 |
| | $3^{rd}$ | 34 | 34 | 44 | 14 | 25 | 39 | 39 |
| Section 2 | $1^{st}$ | 33 | 41 | 41 | 35 | 18 | 10 | 3 |
| | $2^{nd}$ | 28 | 28 | 24 | 13 | 28 | 14 | 25 |
| | $3^{rd}$ | 38 | 36 | 12 | 38 | 34 | 34 | 16 |
| Section 3 | $1^{st}$ | 22 | 19 | 16 | 7 | 7 | 27 | 44 |
| | $2^{nd}$ | 13 | 35 | 27 | 39 | 39 | 3 | 17 |
| | $3^{rd}$ | 32 | 42 | 14 | 9 | 15 | 40 | 4 |
| Section 4 | $1^{st}$ | 14 | 45 | 22 | 19 | 20 | 20 | 32 |
| | $2^{nd}$ | 44 | 43 | 32 | 43 | 40 | 36 | 13 |
| | $3^{rd}$ | 7 | 2 | 5 | 33 | 44 | 32 | 12 |
| Section 5 | $1^{st}$ | 27 | 1 | 17 | 24 | 19 | 16 | 8 |
| | $2^{nd}$ | 23 | 8 | 29 | 25 | 12 | 17 | 26 |
| | $3^{rd}$ | 18 | 30 | 39 | 10 | 29 | 43 | 45 |
| Section 6 | $1^{st}$ | 41 | 12 | 6 | 6 | 14 | 7 | 10 |
| | $2^{nd}$ | 10 | 9 | 35 | 45 | 17 | 9 | 6 |
| | $3^{rd}$ | 35 | 14 | 30 | 21 | 21 | 26 | 15 |
| Section 7 | $1^{st}$ | 21 | 10 | 10 | 2 | 33 | 11 | 21 |
| | $2^{nd}$ | 15 | 38 | 8 | 28 | 5 | 44 | 40 |
| | $3^{rd}$ | 45 | 15 | 37 | 4 | 24 | 21 | 43 |
| Section 8 | $1^{st}$ | 42 | 22 | 3 | 3 | 36 | 5 | 27 |
| | $2^{nd}$ | 26 | 6 | 38 | 17 | 41 | 42 | 24 |
| | $3^{rd}$ | 31 | 5 | 1 | 15 | 31 | 31 | 33 |
| Section 9 | $1^{st}$ | 39 | 24 | 7 | 40 | 10 | 6 | 2 |
| | $2^{nd}$ | 29 | 13 | 42 | 42 | 6 | 41 | 28 |
| | $3^{rd}$ | 12 | 31 | 26 | 22 | 27 | 8 | 41 |
| Section 10 | $1^{st}$ | 4 | 32 | 15 | 8 | 45 | 4 | 29 |
| | $2^{nd}$ | 1 | 23 | 28 | 41 | 42 | 24 | 19 |
| | $3^{rd}$ | 2 | 27 | 34 | 11 | 37 | 13 | 38 |

TABLE 2-continued

| | | Code Rate | | | | | | |
|---|---|---|---|---|---|---|---|---|
| | | 1/3 | 2/5 | 7/15 | 8/15 | 3/5 | 2/3 | 11/15 |
| Section 11 | $1^{st}$ | 40 | 40 | 9 | 32 | 13 | 25 | 14 |
| | $2^{nd}$ | 36 | 39 | 23 | 16 | 43 | 15 | 20 |
| | $3^{rd}$ | 19 | 18 | 43 | 18 | 11 | 18 | 30 |
| Section 12 | $1^{st}$ | 20 | 33 | 4 | 44 | 26 | 23 | 36 |
| | $2^{nd}$ | 43 | 3 | 40 | 31 | 16 | 1 | 7 |
| | $3^{rd}$ | 9 | 29 | 2 | 37 | 22 | 45 | 23 |
| Section 13 | $1^{st}$ | 16 | 25 | 20 | 30 | 2 | 30 | 34 |
| | $2^{nd}$ | 3 | 7 | 25 | 26 | 1 | 2 | 1 |
| | $3^{rd}$ | 24 | 21 | 36 | 29 | 3 | 38 | 18 |
| Section 14 | $1^{st}$ | 11 | 44 | 21 | 34 | 8 | 12 | 22 |
| | $2^{nd}$ | 37 | 17 | 33 | 36 | 30 | 29 | 42 |
| | $3^{rd}$ | 25 | 26 | 31 | 23 | 9 | 22 | 11 |
| Section 15 | $1^{st}$ | 30 | 37 | 18 | 5 | 23 | 35 | 9 |
| | $2^{nd}$ | 8 | 11 | 19 | 20 | 4 | 28 | 37 |
| | $3^{rd}$ | 6 | 4 | 45 | 1 | 35 | 37 | 31 | permutation in the second permutation step is applied such that the two bits of the 4-QAM constellation word are made up of bits of the first cyclic block of the respective section, the two bits of the 16-QAM constellation word having the lowest reliability are made up of bits of the second cyclic block of the respective section, and the two bits of the 16-QAM constellation word having the highest reliability are made up of bits of the third cyclic block of the respective section.

According to this method, the N cyclic blocks of the codeword based on QC-LDPC codes are appropriately permuted, and then bits of the codeword with the permuted cyclic blocks are appropriately mapped onto two constellation words. Thus, the method further improves the reception performance of a communication system.

(5) According to the fifth interleaving method, in the third interleaving method, with B=8 and a transmission power ratio of 1/1, wherein the quasi-cyclic low-density parity-check code is a code defined by the DVB-NGH standard with a code rate of one of 1/3, 2/5, 7/15, 8/15, 3/5, 2/3 and 11/15, the bits of each spatial-multiplexing block are divided into a first 16-QAM constellation word and a second 16-QAM constellation word, and permutation in the first permutation step is applied according to cyclic block permutation shown in Table 3, in accordance with the code rates of the quasi-cyclic low-density parity-check code:

TABLE 3

| | | Code Rate | | | | | | |
|---|---|---|---|---|---|---|---|---|
| | | 1/3 | 2/5 | 7/15 | 8/15 | 3/5 | 2/3 | 11/15 |
| Section 1 | $1^{st}$ | 9 | 7 | 8 | 17 | 24 | 40 | 15 |
| | $2^{nd}$ | 37 | 21 | 12 | 39 | 3 | 38 | 5 |
| | $3^{rd}$ | 33 | 43 | 38 | 38 | 15 | 36 | 37 |
| | $4^{th}$ | 39 | 35 | 21 | 26 | 2 | 35 | 20 |
| Section 2 | $1^{st}$ | 38 | 27 | 28 | 41 | 40 | 1 | 18 |
| | $2^{nd}$ | 28 | 4 | 19 | 10 | 11 | 23 | 43 |
| | $3^{rd}$ | 14 | 24 | 24 | 33 | 29 | 18 | 1 |
| | $4^{th}$ | 3 | 5 | 6 | 6 | 18 | 9 | 33 |
| Section 3 | $1^{st}$ | 43 | 16 | 31 | 28 | 42 | 24 | 12 |
| | $2^{nd}$ | 36 | 20 | 17 | 5 | 12 | 29 | 29 |
| | $3^{rd}$ | 1 | 30 | 27 | 14 | 34 | 43 | 30 |
| | $4^{th}$ | 20 | 10 | 20 | 3 | 16 | 27 | 27 |
| Section 4 | $1^{st}$ | 4 | 17 | 32 | 42 | 31 | 2 | 21 |
| | $2^{nd}$ | 7 | 42 | 5 | 22 | 21 | 19 | 24 |
| | $3^{rd}$ | 12 | 41 | 35 | 31 | 41 | 3 | 34 |
| | $4^{th}$ | 6 | 44 | 2 | 43 | 19 | 10 | 4 |
| Section 5 | $1^{st}$ | 13 | 15 | 37 | 25 | 44 | 25 | 7 |
| | $2^{nd}$ | 35 | 13 | 1 | 40 | 14 | 20 | 44 |
| | $3^{rd}$ | 8 | 31 | 4 | 44 | 38 | 37 | 41 |
| | $4^{th}$ | 23 | 36 | 3 | 24 | 25 | 6 | 36 |

TABLE 3-continued

|  |  | \multicolumn{7}{c}{Code Rate} |
|---|---|---|---|---|---|---|---|---|
|  |  | 1/3 | 2/5 | 7/15 | 8/15 | 3/5 | 2/3 | 11/15 |
| Section 6 | $1^{st}$ | 19 | 23 | 43 | 8 | 37 | 4 | 25 |
|  | $2^{nd}$ | 32 | 12 | 9 | 1 | 36 | 7 | 16 |
|  | $3^{rd}$ | 42 | 37 | 41 | 12 | 32 | 41 | 40 |
|  | $4^{th}$ | 25 | 18 | 33 | 4 | 7 | 39 | 11 |
| Section 7 | $1^{st}$ | 41 | 1 | 26 | 29 | 1 | 42 | 19 |
|  | $2^{nd}$ | 10 | 19 | 15 | 15 | 28 | 17 | 32 |
|  | $3^{rd}$ | 44 | 40 | 39 | 7 | 5 | 14 | 28 |
|  | $4^{th}$ | 30 | 22 | 18 | 20 | 10 | 11 | 23 |
| Section 8 | $1^{st}$ | 24 | 29 | 29 | 34 | 33 | 8 | 8 |
|  | $2^{nd}$ | 31 | 9 | 11 | 2 | 9 | 22 | 22 |
|  | $3^{rd}$ | 40 | 38 | 30 | 36 | 6 | 32 | 38 |
|  | $4^{th}$ | 27 | 8 | 7 | 23 | 17 | 12 | 35 |
| Section 9 | $1^{st}$ | 15 | 6 | 44 | 37 | 4 | 28 | 17 |
|  | $2^{nd}$ | 26 | 34 | 23 | 16 | 13 | 15 | 2 |
|  | $3^{rd}$ | 21 | 14 | 25 | 11 | 39 | 21 | 42 |
|  | $4^{th}$ | 29 | 26 | 16 | 9 | 23 | 5 | 13 |
| Section 10 | $1^{st}$ | 5 | 39 | 14 | 30 | 30 | 34 | 14 |
|  | $2^{nd}$ | 17 | 3 | 10 | 27 | 26 | 26 | 26 |
|  | $3^{rd}$ | 11 | 25 | 34 | 32 | 43 | 13 | 39 |
|  | $4^{th}$ | 34 | 32 | 36 | 21 | 8 | 30 | 3 |
| Section 11 | $1^{st}$ | 22 | 28 | 22 | 35 | 35 | 16 | 31 |
|  | $2^{nd}$ | 16 | 33 | 42 | 13 | 20 | 33 | 6 |
|  | $3^{rd}$ | 18 | 11 | 13 | 18 | 27 | 44 | 10 |
|  | $4^{th}$ | 2 | 2 | 40 | 19 | 22 | 31 | 9 |
| Residual |  | 45 | 45 | 45 | 45 | 45 | 45 | 45 | permutation in the second permutation step is applied such that the two bits of the first 16-QAM constellation word having the lowest reliability are made up of bits of the first cyclic block of the respective section, and the two bits of the first 16-QAM constellation word having the highest reliability are made up of bits of the second cyclic block of the respective section, the two bits of the second 16-QAM constellation word having the lowest reliability are made up of bits of the third cyclic block of the respective section, and the two bits of the second 16-QAM constellation word having the highest reliability are made up of bits of the fourth cyclic block of the respective section.

According to this method, the N cyclic blocks of the codeword based on QC-LDPC codes are appropriately permuted, and then bits of the codeword with the permuted cyclic blocks are appropriately mapped onto two constellation words. Thus, the method further improves the reception performance of a communication system.

(6) According to the sixth interleaving method, in the third interleaving method, with B=10 and a transmission power ratio of 1/1, wherein the quasi-cyclic low-density parity-check code is a code defined by the DVB-NGH standard with a code rate of one of 1/3, 2/5, 7/15, 8/15, 3/5, 2/3 and 11/15, the bits of each spatial-multiplexing block are divided into a 16-QAM constellation word and a 64-QAM constellation word, and permutation in the first permutation step is applied according to cyclic block permutation shown in Table 4, in accordance with the code rates of the quasi-cyclic low-density parity-check code:

TABLE 4

|  |  | \multicolumn{7}{c}{Code Rate} |
|---|---|---|---|---|---|---|---|---|
|  |  | 1/3 | 2/5 | 7/15 | 8/15 | 3/5 | 2/3 | 11/15 |
| Section 1 | $1^{st}$ | 27 | 23 | 9 | 27 | 17 | 38 | 27 |
|  | $2^{nd}$ | 17 | 27 | 1 | 3 | 28 | 30 | 4 |
|  | $3^{rd}$ | 42 | 11 | 33 | 43 | 39 | 11 | 28 |
|  | $4^{th}$ | 8 | 16 | 4 | 12 | 7 | 27 | 37 |
|  | $5^{th}$ | 30 | 42 | 20 | 17 | 14 | 17 | 39 |

TABLE 4-continued

|  |  | \multicolumn{7}{c}{Code Rate} |
|---|---|---|---|---|---|---|---|---|
|  |  | 1/3 | 2/5 | 7/15 | 8/15 | 3/5 | 2/3 | 11/15 |
| Section 2 | $1^{st}$ | 38 | 19 | 16 | 18 | 29 | 16 | 44 |
|  | $2^{nd}$ | 6 | 25 | 29 | 8 | 16 | 22 | 8 |
|  | $3^{rd}$ | 15 | 44 | 41 | 40 | 35 | 45 | 1 |
|  | $4^{th}$ | 32 | 39 | 38 | 22 | 41 | 21 | 18 |
|  | $5^{th}$ | 36 | 33 | 6 | 15 | 45 | 44 | 41 |
| Section 3 | $1^{st}$ | 22 | 34 | 19 | 31 | 2 | 1 | 45 |
|  | $2^{nd}$ | 18 | 32 | 14 | 7 | 5 | 23 | 29 |
|  | $3^{rd}$ | 40 | 22 | 35 | 41 | 18 | 3 | 42 |
|  | $4^{th}$ | 26 | 35 | 30 | 29 | 1 | 2 | 19 |
|  | $5^{th}$ | 14 | 12 | 39 | 21 | 32 | 35 | 15 |
| Section 4 | $1^{st}$ | 41 | 4 | 43 | 30 | 42 | 7 | 34 |
|  | $2^{nd}$ | 45 | 2 | 15 | 6 | 13 | 8 | 2 |
|  | $3^{rd}$ | 29 | 24 | 27 | 26 | 37 | 12 | 40 |
|  | $4^{th}$ | 23 | 1 | 44 | 28 | 34 | 39 | 17 |
|  | $5^{th}$ | 9 | 10 | 10 | 36 | 21 | 13 | 9 |
| Section 5 | $1^{st}$ | 20 | 9 | 11 | 39 | 33 | 40 | 10 |
|  | $2^{nd}$ | 4 | 14 | 3 | 9 | 25 | 6 | 33 |
|  | $3^{rd}$ | 44 | 28 | 24 | 19 | 40 | 42 | 31 |
|  | $4^{th}$ | 37 | 37 | 18 | 16 | 12 | 36 | 25 |
|  | $5^{th}$ | 2 | 29 | 7 | 32 | 6 | 14 | 35 |
| Section 6 | $1^{st}$ | 43 | 36 | 45 | 5 | 30 | 18 | 21 |
|  | $2^{nd}$ | 12 | 20 | 8 | 13 | 31 | 34 | 7 |
|  | $3^{rd}$ | 11 | 7 | 37 | 24 | 24 | 31 | 30 |
|  | $4^{th}$ | 10 | 8 | 34 | 1 | 8 | 28 | 43 |
|  | $5^{th}$ | 28 | 13 | 22 | 4 | 20 | 24 | 14 |
| Section 7 | $1^{st}$ | 21 | 3 | 31 | 10 | 23 | 10 | 3 |
|  | $2^{nd}$ | 16 | 17 | 2 | 23 | 4 | 5 | 6 |
|  | $3^{rd}$ | 5 | 40 | 40 | 14 | 3 | 15 | 20 |
|  | $4^{th}$ | 13 | 41 | 36 | 35 | 9 | 26 | 22 |
|  | $5^{th}$ | 31 | 31 | 12 | 2 | 11 | 9 | 36 |
| Section 8 | $1^{st}$ | 33 | 30 | 32 | 42 | 27 | 20 | 12 |
|  | $2^{nd}$ | 3 | 5 | 13 | 37 | 22 | 19 | 32 |
|  | $3^{rd}$ | 1 | 6 | 42 | 44 | 38 | 37 | 38 |
|  | $4^{th}$ | 35 | 15 | 25 | 38 | 44 | 32 | 16 |
|  | $5^{th}$ | 7 | 21 | 17 | 34 | 15 | 29 | 5 |
| Section 9 | $1^{st}$ | 39 | 45 | 28 | 33 | 10 | 25 | 13 |
|  | $2^{nd}$ | 34 | 26 | 21 | 11 | 19 | 33 | 24 |
|  | $3^{rd}$ | 24 | 38 | 26 | 45 | 43 | 4 | 26 |
|  | $4^{th}$ | 19 | 43 | 5 | 25 | 36 | 43 | 11 |
|  | $5^{th}$ | 25 | 18 | 23 | 20 | 26 | 41 | 23 | permutation in the second permutation step is applied such that the two bits of the 16-QAM constellation word having the lowest reliability are made up of bits of the first cyclic block of the respective section, the two bits of the 16-QAM constellation word having the highest reliability are made up of bits of the second cyclic block of the respective section, the two bits of the 64-QAM constellation word having the lowest reliability are made up of bits of the third cyclic block of the respective section, the two bits of the 64-QAM constellation word having the second lowest reliability are made up of bits of the fourth cyclic block of the respective section, and the two bits of the 64-QAM constellation word having the highest reliability are made up of bits of the fifth cyclic block of the respective section.

According to this method, the N cyclic blocks of the codeword based on QC-LDPC codes are appropriately permuted, and then bits of the codeword with the permuted cyclic blocks are appropriately mapped onto two constellation words. Thus, the method further improves the reception performance of a communication system.

(7) According to the seventh interleaving method, in the third interleaving method, with B=6 and a transmission power ratio of 1/2, wherein the quasi-cyclic low-density parity-check code is a code defined by the DVB-NGH standard with a code rate of one of 1/3, 2/5, 7/15, 8/15, 3/5, 2/3 and 11/15, the bits of each spatial-multiplexing block are divided into a 4-QAM constellation word and a 16-QAM constellation word, and permutation in the first permutation step is applied according to cyclic block permutation shown in Table 5, in accordance with the code rates of the quasi-cyclic low-density parity-check code:

TABLE 5

|  |  | Code Rate | | | | | | |
|---|---|---|---|---|---|---|---|---|
|  |  | 1/3 | 2/5 | 7/15 | 8/15 | 3/5 | 2/3 | 11/15 |
| Section 1 | $1^{st}$ | 20 | 20 | 34 | 8 | 31 | 10 | 5 |
|  | $2^{nd}$ | 23 | 16 | 13 | 25 | 43 | 24 | 35 |
|  | $3^{rd}$ | 40 | 34 | 24 | 22 | 26 | 31 | 39 |
| Section 2 | $1^{st}$ | 15 | 41 | 16 | 18 | 20 | 4 | 3 |
|  | $2^{nd}$ | 19 | 28 | 40 | 28 | 44 | 5 | 25 |
|  | $3^{rd}$ | 21 | 36 | 19 | 20 | 39 | 43 | 16 |
| Section 3 | $1^{st}$ | 27 | 19 | 23 | 3 | 18 | 22 | 44 |
|  | $2^{nd}$ | 44 | 35 | 38 | 23 | 28 | 34 | 17 |
|  | $3^{rd}$ | 9 | 42 | 1 | 4 | 11 | 21 | 4 |
| Section 4 | $1^{st}$ | 10 | 45 | 28 | 33 | 37 | 18 | 32 |
|  | $2^{nd}$ | 11 | 43 | 36 | 38 | 12 | 36 | 13 |
|  | $3^{rd}$ | 36 | 2 | 21 | 19 | 36 | 12 | 12 |
| Section 5 | $1^{st}$ | 18 | 1 | 9 | 27 | 34 | 11 | 8 |
|  | $2^{nd}$ | 38 | 8 | 6 | 31 | 42 | 9 | 26 |
|  | $3^{rd}$ | 32 | 30 | 2 | 11 | 40 | 13 | 45 |
| Section 6 | $1^{st}$ | 35 | 12 | 42 | 6 | 9 | 35 | 10 |
|  | $2^{nd}$ | 39 | 9 | 44 | 45 | 7 | 41 | 6 |
|  | $3^{rd}$ | 31 | 14 | 8 | 24 | 21 | 15 | 15 |
| Section 7 | $1^{st}$ | 16 | 10 | 43 | 29 | 22 | 20 | 21 |
|  | $2^{nd}$ | 33 | 38 | 33 | 39 | 6 | 29 | 40 |
|  | $3^{rd}$ | 42 | 15 | 5 | 7 | 16 | 8 | 43 |
| Section 8 | $1^{st}$ | 30 | 22 | 22 | 26 | 27 | 16 | 27 |
|  | $2^{nd}$ | 1 | 6 | 41 | 41 | 29 | 2 | 24 |
|  | $3^{rd}$ | 7 | 5 | 32 | 2 | 13 | 40 | 33 |
| Section 9 | $1^{st}$ | 34 | 24 | 29 | 10 | 8 | 27 | 2 |
|  | $2^{nd}$ | 43 | 13 | 45 | 40 | 30 | 25 | 28 |
|  | $3^{rd}$ | 45 | 31 | 15 | 32 | 19 | 39 | 41 |
| Section 10 | $1^{st}$ | 17 | 32 | 18 | 13 | 38 | 6 | 29 |
|  | $2^{nd}$ | 28 | 23 | 26 | 14 | 45 | 33 | 19 |
|  | $3^{rd}$ | 22 | 27 | 37 | 9 | 32 | 45 | 38 |
| Section 11 | $1^{st}$ | 8 | 40 | 27 | 1 | 4 | 30 | 14 |
|  | $2^{nd}$ | 4 | 39 | 31 | 34 | 2 | 28 | 20 |
|  | $3^{rd}$ | 2 | 18 | 10 | 5 | 10 | 37 | 30 |
| Section 12 | $1^{st}$ | 14 | 33 | 17 | 35 | 5 | 23 | 36 |
|  | $2^{nd}$ | 24 | 3 | 30 | 36 | 1 | 1 | 7 |
|  | $3^{rd}$ | 41 | 29 | 11 | 21 | 14 | 14 | 23 |
| Section 13 | $1^{st}$ | 37 | 25 | 14 | 42 | 17 | 7 | 34 |
|  | $2^{nd}$ | 25 | 7 | 20 | 37 | 41 | 3 | 1 |
|  | $3^{rd}$ | 12 | 21 | 7 | 12 | 24 | 26 | 18 |
| Section 14 | $1^{st}$ | 26 | 44 | 3 | 16 | 35 | 42 | 22 |
|  | $2^{nd}$ | 5 | 17 | 35 | 30 | 3 | 44 | 42 |
|  | $3^{rd}$ | 3 | 26 | 4 | 17 | 23 | 38 | 11 |
| Section 15 | $1^{st}$ | 6 | 37 | 39 | 15 | 15 | 19 | 9 |
|  | $2^{nd}$ | 13 | 11 | 25 | 44 | 33 | 17 | 37 |
|  | $3^{rd}$ | 29 | 4 | 12 | 43 | 25 | 32 | 31 | permutation in the second permutation step is applied such that the two bits of the 4-QAM constellation word are made up of bits of the first cyclic block of the respective section, the two bits of the 16-QAM constellation word having the lowest reliability are made up of bits of the second cyclic block of the respective section, and the two bits of the 16-QAM constellation word having the highest reliability are made up of bits of the third cyclic block of the respective section.

According to this method, the N cyclic blocks of the codeword based on QC-LDPC codes are appropriately permuted, and then bits of the codeword with the permuted cyclic blocks are appropriately mapped onto two constellation words. Thus, the method further improves the reception performance of a communication system.

(8) According to the eighth interleaving method, in the third interleaving method, with B=8 and a transmission power ratio of 1/2, wherein the quasi-cyclic low-density parity-check code is a code defined by the DVB-NGH standard with a code rate of one of 1/3, 2/5, 7/15, 8/15, 3/5, 2/3 and 11/15, the bits of each spatial-multiplexing block are divided into a first 16-QAM constellation word and a second 16-QAM constellation word, permutation in the first permutation step is applied according to cyclic block permutation shown in Table 6, in accordance with the code rates of the quasi-cyclic low-density parity-check code:

TABLE 6

|  |  | Code Rate | | | | | | |
|---|---|---|---|---|---|---|---|---|
|  |  | 1/3 | 2/5 | 7/15 | 8/15 | 3/5 | 2/3 | 11/15 |
| Section 1 | $1^{st}$ | 4 | 7 | 41 | 28 | 27 | 2 | 15 |
|  | $2^{nd}$ | 16 | 21 | 14 | 29 | 20 | 23 | 5 |
|  | $3^{rd}$ | 25 | 43 | 33 | 19 | 32 | 3 | 37 |
|  | $4^{th}$ | 1 | 35 | 22 | 22 | 18 | 16 | 20 |
| Section 2 | $1^{st}$ | 19 | 27 | 27 | 35 | 41 | 1 | 18 |
|  | $2^{nd}$ | 42 | 4 | 10 | 43 | 33 | 12 | 43 |
|  | $3^{rd}$ | 36 | 24 | 21 | 44 | 6 | 19 | 1 |
|  | $4^{th}$ | 8 | 5 | 12 | 16 | 12 | 17 | 33 |
| Section 3 | $1^{st}$ | 13 | 16 | 35 | 21 | 35 | 30 | 12 |
|  | $2^{nd}$ | 34 | 20 | 19 | 38 | 21 | 41 | 29 |
|  | $3^{rd}$ | 41 | 30 | 34 | 41 | 14 | 43 | 30 |
|  | $4^{th}$ | 6 | 10 | 8 | 5 | 9 | 24 | 27 |
| Section 4 | $1^{st}$ | 37 | 17 | 37 | 27 | 31 | 35 | 21 |
|  | $2^{nd}$ | 9 | 42 | 15 | 37 | 37 | 33 | 24 |
|  | $3^{rd}$ | 12 | 41 | 5 | 15 | 23 | 22 | 34 |
|  | $4^{th}$ | 17 | 44 | 20 | 42 | 16 | 42 | 4 |
| Section 5 | $1^{st}$ | 3 | 15 | 28 | 7 | 42 | 34 | 7 |
|  | $2^{nd}$ | 35 | 13 | 24 | 18 | 40 | 13 | 44 |
|  | $3^{rd}$ | 32 | 31 | 29 | 9 | 43 | 5 | 41 |
|  | $4^{th}$ | 22 | 36 | 32 | 20 | 13 | 40 | 36 |
| Section 6 | $1^{st}$ | 2 | 23 | 11 | 25 | 36 | 15 | 25 |
|  | $2^{nd}$ | 39 | 12 | 4 | 10 | 34 | 8 | 16 |
|  | $3^{rd}$ | 11 | 37 | 1 | 40 | 26 | 11 | 40 |
|  | $4^{th}$ | 21 | 18 | 3 | 4 | 22 | 32 | 11 |
| Section 7 | $1^{st}$ | 14 | 1 | 30 | 34 | 30 | 28 | 19 |
|  | $2^{nd}$ | 33 | 19 | 44 | 3 | 28 | 29 | 32 |
|  | $3^{rd}$ | 15 | 40 | 6 | 31 | 8 | 36 | 28 |
|  | $4^{th}$ | 23 | 22 | 7 | 2 | 19 | 10 | 23 |
| Section 8 | $1^{st}$ | 44 | 29 | 23 | 12 | 1 | 38 | 8 |
|  | $2^{nd}$ | 18 | 9 | 42 | 14 | 44 | 39 | 22 |
|  | $3^{rd}$ | 26 | 38 | 25 | 6 | 3 | 21 | 38 |
|  | $4^{th}$ | 40 | 8 | 17 | 17 | 38 | 14 | 35 |
| Section 9 | $1^{st}$ | 43 | 6 | 26 | 26 | 11 | 44 | 17 |
|  | $2^{nd}$ | 24 | 34 | 2 | 8 | 39 | 18 | 2 |
|  | $3^{rd}$ | 10 | 14 | 36 | 30 | 10 | 7 | 42 |
|  | $4^{th}$ | 5 | 26 | 13 | 1 | 24 | 26 | 13 |
| Section 10 | $1^{st}$ | 28 | 39 | 39 | 33 | 29 | 4 | 14 |
|  | $2^{nd}$ | 20 | 3 | 43 | 39 | 25 | 31 | 26 |
|  | $3^{rd}$ | 29 | 25 | 38 | 23 | 17 | 9 | 39 |
|  | $4^{th}$ | 31 | 32 | 16 | 13 | 7 | 6 | 3 |
| Section 11 | $1^{st}$ | 7 | 28 | 40 | 36 | 5 | 37 | 31 |
|  | $2^{nd}$ | 27 | 33 | 9 | 11 | 15 | 27 | 6 |
|  | $3^{rd}$ | 30 | 11 | 31 | 32 | 4 | 25 | 10 |
|  | $4^{th}$ | 38 | 2 | 18 | 24 | 2 | 20 | 9 |
| Residual |  | 45 | 45 | 45 | 45 | 45 | 45 | 45 | permutation in the second permutation step is applied such that the two bits of the first 16-QAM constellation word having the lowest reliability are made up of bits of the first cyclic block of the respective section, and the two bits of the first 16-QAM constellation word having the highest reliability are made up of bits of the second cyclic block of the respective section, the two bits of the second 16-QAM constellation word having the lowest reliability are made up of bits of the third cyclic block of the respective section, and the two bits of the second 16-QAM constellation word having the highest reliability are made up of bits of the fourth cyclic block of the respective section.

According to this method, the N cyclic blocks of the codeword based on QC-LDPC codes are appropriately permuted, and then bits of the codeword with the permuted cyclic blocks are appropriately mapped onto two constellation words. Thus, the method further improves the reception performance of a communication system.

(9) According to the ninth interleaving method, in the third interleaving method, with B=10 and a transmission power ratio of 1/2, wherein the quasi-cyclic low-density parity-check code is a code defined by the DVB-NGH standard with a code rate of one of 1/3, 2/5, 7/15, 8/15, 3/5, 2/3 and 11/15, the bits of each spatial-multiplexing block are divided into a 16-QAM constellation word and a 64-QAM constellation word, permutation in the first permutation step is applied according to cyclic block permutation shown in Table 7, in accordance with the code rates of the quasi-cyclic low-density parity-check code:

TABLE 7

|  |  | Code Rate | | | | | | |
|---|---|---|---|---|---|---|---|---|
|  |  | 1/3 | 2/5 | 7/15 | 8/15 | 3/5 | 2/3 | 11/15 |
| Section 1 | $1^{st}$ | 27 | 23 | 43 | 31 | 17 | 38 | 27 |
|  | $2^{nd}$ | 17 | 27 | 20 | 43 | 28 | 30 | 4 |
|  | $3^{rd}$ | 42 | 11 | 44 | 28 | 39 | 11 | 28 |
|  | $4^{th}$ | 8 | 16 | 31 | 25 | 7 | 27 | 37 |
|  | $5^{th}$ | 30 | 42 | 7 | 10 | 14 | 17 | 39 |
| Section 2 | $1^{st}$ | 38 | 19 | 28 | 36 | 41 | 16 | 44 |
|  | $2^{nd}$ | 6 | 25 | 19 | 16 | 16 | 22 | 8 |
|  | $3^{rd}$ | 15 | 44 | 26 | 35 | 35 | 45 | 1 |
|  | $4^{th}$ | 32 | 39 | 23 | 38 | 29 | 21 | 18 |
|  | $5^{th}$ | 36 | 33 | 3 | 13 | 45 | 44 | 41 |
| Section 3 | $1^{st}$ | 22 | 34 | 40 | 44 | 2 | 1 | 45 |
|  | $2^{nd}$ | 18 | 32 | 35 | 20 | 5 | 23 | 29 |
|  | $3^{rd}$ | 40 | 22 | 42 | 21 | 18 | 3 | 42 |
|  | $4^{th}$ | 26 | 35 | 22 | 30 | 1 | 2 | 19 |
|  | $5^{th}$ | 14 | 12 | 16 | 15 | 32 | 35 | 15 |
| Section 4 | $1^{st}$ | 41 | 4 | 34 | 12 | 37 | 7 | 34 |
|  | $2^{nd}$ | 45 | 2 | 21 | 4 | 13 | 8 | 2 |
|  | $3^{rd}$ | 29 | 24 | 27 | 24 | 34 | 12 | 40 |
|  | $4^{th}$ | 23 | 1 | 17 | 1 | 42 | 39 | 17 |
|  | $5^{th}$ | 9 | 10 | 4 | 5 | 21 | 13 | 9 |
| Section 5 | $1^{st}$ | 20 | 9 | 33 | 7 | 33 | 40 | 10 |
|  | $2^{nd}$ | 4 | 14 | 32 | 14 | 12 | 6 | 33 |
|  | $3^{rd}$ | 44 | 28 | 2 | 34 | 40 | 42 | 31 |
|  | $4^{th}$ | 37 | 37 | 38 | 45 | 25 | 36 | 25 |
|  | $5^{th}$ | 2 | 29 | 1 | 18 | 6 | 14 | 35 |
| Section 6 | $1^{st}$ | 43 | 36 | 39 | 33 | 30 | 18 | 21 |
|  | $2^{nd}$ | 12 | 20 | 10 | 11 | 31 | 34 | 7 |
|  | $3^{rd}$ | 11 | 7 | 36 | 42 | 24 | 31 | 30 |
|  | $4^{th}$ | 10 | 8 | 11 | 27 | 8 | 28 | 43 |
|  | $5^{th}$ | 28 | 13 | 8 | 9 | 20 | 24 | 14 |
| Section 7 | $1^{st}$ | 21 | 3 | 6 | 39 | 23 | 10 | 3 |
|  | $2^{nd}$ | 16 | 17 | 24 | 17 | 4 | 5 | 6 |
|  | $3^{rd}$ | 5 | 40 | 41 | 26 | 3 | 15 | 20 |
|  | $4^{th}$ | 13 | 41 | 15 | 40 | 9 | 26 | 22 |
|  | $5^{th}$ | 31 | 31 | 5 | 23 | 11 | 9 | 36 |
| Section 8 | $1^{st}$ | 33 | 30 | 18 | 32 | 15 | 20 | 12 |
|  | $2^{nd}$ | 3 | 5 | 25 | 3 | 27 | 19 | 32 |
|  | $3^{rd}$ | 1 | 6 | 45 | 22 | 38 | 37 | 38 |
|  | $4^{th}$ | 35 | 15 | 13 | 41 | 44 | 32 | 16 |
|  | $5^{th}$ | 7 | 21 | 29 | 6 | 22 | 29 | 5 |
| Section 9 | $1^{st}$ | 39 | 45 | 14 | 8 | 43 | 25 | 13 |
|  | $2^{nd}$ | 34 | 26 | 9 | 19 | 26 | 33 | 24 |
|  | $3^{rd}$ | 24 | 38 | 30 | 29 | 36 | 4 | 26 |
|  | $4^{th}$ | 19 | 43 | 37 | 37 | 10 | 43 | 11 |
|  | $5^{th}$ | 25 | 18 | 12 | 2 | 19 | 41 | 23 | permutation in the second permutation step is applied such that the two bits of the 16-QAM constellation word having the lowest reliability are made up of bits of the first cyclic block of the respective section, the two bits of the 16-QAM constellation word having the highest reliability are made up of bits of the second cyclic block of the respective section, the two bits of the 64-QAM constellation word having the lowest reliability are made up of bits of the third cyclic block of the respective section, the two bits of the 64-QAM constellation word having the second lowest reliability are made up of bits of the fourth cyclic block of the respective section, and the two bits of the 64-QAM constellation word having the highest reliability are made up of bits of the fifth cyclic block of the respective section.

According to this method, the N cyclic blocks of the codeword based on QC-LDPC codes are appropriately permuted, and then bits of the codeword with the permuted cyclic blocks are appropriately mapped onto two constellation words. Thus, the method further improves the reception performance of a communication system.

(10) According to the tenth interleaving method, in the third interleaving method, with B=6 and a transmission power ratio of 1/4, wherein the quasi-cyclic low-density parity-check code is a code defined by the DVB-NGH standard with a code rate of one of 1/3, 2/5, 7/15, 8/15, 3/5, 2/3 and 11/15, the bits of each spatial-multiplexing block are divided into a 4-QAM constellation word and a 16-QAM constellation word, and permutation in the first permutation step is applied according to cyclic block permutation shown in Table 8, in accordance with the code rates of the quasi-cyclic low-density parity-check code:

TABLE 8

|  |  | Code Rate | | | | | | |
|---|---|---|---|---|---|---|---|---|
|  |  | 1/3 | 2/5 | 7/15 | 8/15 | 3/5 | 2/3 | 11/15 |
| Section 1 | $1^{st}$ | 5 | 20 | 34 | 34 | 23 | 45 | 45 |
|  | $2^{nd}$ | 40 | 16 | 13 | 13 | 5 | 39 | 1 |
|  | $3^{rd}$ | 3 | 34 | 24 | 24 | 22 | 28 | 39 |
| Section 2 | $1^{st}$ | 26 | 41 | 16 | 16 | 42 | 38 | 13 |
|  | $2^{nd}$ | 2 | 28 | 40 | 15 | 45 | 16 | 34 |
|  | $3^{rd}$ | 9 | 36 | 19 | 18 | 20 | 20 | 18 |
| Section 3 | $1^{st}$ | 4 | 19 | 23 | 23 | 43 | 10 | 22 |
|  | $2^{nd}$ | 20 | 35 | 38 | 32 | 18 | 8 | 3 |
|  | $3^{rd}$ | 17 | 42 | 1 | 1 | 11 | 14 | 19 |
| Section 4 | $1^{st}$ | 11 | 45 | 28 | 28 | 27 | 44 | 20 |
|  | $2^{nd}$ | 43 | 43 | 36 | 36 | 39 | 35 | 37 |
|  | $3^{rd}$ | 16 | 2 | 21 | 21 | 34 | 4 | 17 |
| Section 5 | $1^{st}$ | 19 | 1 | 9 | 9 | 41 | 24 | 36 |
|  | $2^{nd}$ | 24 | 8 | 6 | 6 | 37 | 34 | 30 |
|  | $3^{rd}$ | 39 | 30 | 2 | 2 | 6 | 12 | 27 |
| Section 6 | $1^{st}$ | 37 | 12 | 42 | 42 | 24 | 26 | 16 |
|  | $2^{nd}$ | 10 | 9 | 44 | 44 | 16 | 32 | 31 |
|  | $3^{rd}$ | 44 | 14 | 8 | 8 | 8 | 15 | 2 |
| Section 7 | $1^{st}$ | 8 | 10 | 43 | 37 | 30 | 30 | 8 |
|  | $2^{nd}$ | 14 | 38 | 33 | 33 | 40 | 22 | 42 |
|  | $3^{rd}$ | 22 | 15 | 5 | 5 | 12 | 11 | 35 |
| Section 8 | $1^{st}$ | 21 | 22 | 22 | 22 | 35 | 21 | 6 |
|  | $2^{nd}$ | 41 | 6 | 41 | 19 | 21 | 43 | 38 |
|  | $3^{rd}$ | 45 | 5 | 32 | 14 | 31 | 17 | 33 |
| Section 9 | $1^{st}$ | 1 | 24 | 29 | 29 | 36 | 19 | 28 |
|  | $2^{nd}$ | 31 | 13 | 45 | 45 | 10 | 13 | 23 |
|  | $3^{rd}$ | 35 | 31 | 15 | 40 | 33 | 6 | 9 |
| Section 10 | $1^{st}$ | 29 | 32 | 18 | 41 | 44 | 2 | 21 |
|  | $2^{nd}$ | 13 | 23 | 26 | 26 | 38 | 5 | 43 |
|  | $3^{rd}$ | 34 | 27 | 37 | 43 | 14 | 37 | 4 |
| Section 11 | $1^{st}$ | 28 | 40 | 27 | 27 | 4 | 31 | 12 |
|  | $2^{nd}$ | 42 | 39 | 31 | 31 | 3 | 42 | 15 |
|  | $3^{rd}$ | 32 | 18 | 10 | 10 | 13 | 9 | 29 |
| Section 12 | $1^{st}$ | 12 | 33 | 17 | 17 | 9 | 7 | 32 |
|  | $2^{nd}$ | 25 | 3 | 30 | 30 | 29 | 40 | 40 |
|  | $3^{rd}$ | 18 | 29 | 11 | 11 | 19 | 18 | 24 |
| Section 13 | $1^{st}$ | 23 | 25 | 14 | 38 | 32 | 25 | 14 |
|  | $2^{nd}$ | 33 | 7 | 20 | 20 | 15 | 1 | 7 |
|  | $3^{rd}$ | 38 | 21 | 7 | 7 | 25 | 27 | 5 |
| Section 14 | $1^{st}$ | 6 | 44 | 3 | 3 | 28 | 23 | 10 |
|  | $2^{nd}$ | 15 | 17 | 35 | 35 | 26 | 3 | 41 |
|  | $3^{rd}$ | 27 | 26 | 4 | 4 | 17 | 29 | 44 |
| Section 15 | $1^{st}$ | 7 | 37 | 39 | 39 | 1 | 33 | 25 |
|  | $2^{nd}$ | 30 | 11 | 25 | 25 | 2 | 41 | 11 |
|  | $3^{rd}$ | 36 | 4 | 12 | 12 | 7 | 36 | 26 | permutation in the second permutation step is applied such that the two bits of the 4-QAM constellation word are made up of bits of the first cyclic block of the respective section, the two bits of the 16-QAM constellation word having the lowest reliability are made up of bits of the second cyclic block of the respective section, and the two bits of the 16-QAM constellation word having the highest reliability are made up of bits of the third cyclic block of the respective section.

According to this method, the N cyclic blocks of the codeword based on QC-LDPC codes are appropriately permuted, and then bits of the codeword with the permuted cyclic blocks are appropriately mapped onto two constellation words. Thus, the method further improves the reception performance of a communication system.

(11) According to the eleventh interleaving method, in the third interleaving method, with B=8 and a transmission power ratio of 1/4, wherein the quasi-cyclic low-density parity-check code is a code defined by the DVB-NGH standard with a code rate of one of 1/3, 2/5, 7/15, 8/15, 3/5, 2/3 and 11/15 the bits of each spatial-multiplexing block are divided into a first 16-QAM constellation word and a second 16-QAM constellation word, and permutation in the first permutation step is applied according to cyclic block permutation shown in Table 9, in accordance with the code rates of the quasi-cyclic low-density parity-check code:

TABLE 9

| | | Code Rate | | | | | | |
|---|---|---|---|---|---|---|---|---|
| | | 1/3 | 2/5 | 7/15 | 8/15 | 3/5 | 2/3 | 11/15 |
| Section 1 | $1^{st}$ | 4 | 23 | 35 | 16 | 27 | 2 | 15 |
| | $2^{nd}$ | 16 | 9 | 15 | 24 | 20 | 23 | 5 |
| | $3^{rd}$ | 25 | 28 | 8 | 44 | 32 | 3 | 37 |
| | $4^{th}$ | 1 | 41 | 5 | 3 | 18 | 16 | 20 |
| Section 2 | $1^{st}$ | 19 | 43 | 40 | 39 | 41 | 1 | 18 |
| | $2^{nd}$ | 42 | 27 | 20 | 34 | 33 | 12 | 43 |
| | $3^{rd}$ | 36 | 17 | 42 | 8 | 6 | 19 | 1 |
| | $4^{th}$ | 8 | 34 | 1 | 11 | 12 | 17 | 33 |
| Section 3 | $1^{st}$ | 13 | 42 | 2 | 37 | 35 | 30 | 12 |
| | $2^{nd}$ | 34 | 31 | 11 | 25 | 21 | 41 | 29 |
| | $3^{rd}$ | 41 | 10 | 31 | 26 | 14 | 43 | 30 |
| | $4^{th}$ | 6 | 5 | 3 | 7 | 9 | 24 | 27 |
| Section 4 | $1^{st}$ | 37 | 40 | 41 | 29 | 31 | 35 | 21 |
| | $2^{nd}$ | 9 | 22 | 37 | 43 | 37 | 33 | 24 |
| | $3^{rd}$ | 12 | 15 | 6 | 42 | 23 | 22 | 34 |
| | $4^{th}$ | 17 | 32 | 10 | 1 | 16 | 42 | 4 |
| Section 5 | $1^{st}$ | 3 | 7 | 36 | 35 | 42 | 34 | 7 |
| | $2^{nd}$ | 35 | 39 | 14 | 22 | 40 | 13 | 44 |
| | $3^{rd}$ | 32 | 30 | 34 | 21 | 43 | 5 | 41 |
| | $4^{th}$ | 22 | 33 | 28 | 17 | 13 | 40 | 36 |
| Section 6 | $1^{st}$ | 2 | 36 | 44 | 4 | 36 | 15 | 25 |
| | $2^{nd}$ | 39 | 44 | 22 | 2 | 34 | 8 | 16 |
| | $3^{rd}$ | 11 | 37 | 12 | 33 | 26 | 11 | 40 |
| | $4^{th}$ | 21 | 18 | 30 | 5 | 22 | 32 | 11 |
| Section 7 | $1^{st}$ | 14 | 35 | 29 | 27 | 30 | 28 | 19 |
| | $2^{nd}$ | 33 | 3 | 17 | 10 | 28 | 29 | 32 |
| | $3^{rd}$ | 15 | 14 | 26 | 13 | 8 | 36 | 28 |
| | $4^{th}$ | 23 | 20 | 27 | 14 | 19 | 10 | 23 |
| Section 8 | $1^{st}$ | 44 | 6 | 23 | 36 | 1 | 38 | 8 |
| | $2^{nd}$ | 18 | 2 | 43 | 19 | 44 | 39 | 22 |
| | $3^{rd}$ | 26 | 4 | 9 | 23 | 3 | 21 | 38 |
| | $4^{th}$ | 40 | 1 | 4 | 9 | 38 | 14 | 35 |
| Section 9 | $1^{st}$ | 43 | 19 | 38 | 41 | 11 | 44 | 17 |
| | $2^{nd}$ | 24 | 25 | 18 | 40 | 39 | 18 | 2 |
| | $3^{rd}$ | 10 | 21 | 24 | 32 | 10 | 7 | 42 |
| | $4^{th}$ | 5 | 12 | 21 | 20 | 24 | 26 | 13 |
| Section 10 | $1^{st}$ | 28 | 8 | 32 | 28 | 29 | 4 | 14 |
| | $2^{nd}$ | 20 | 29 | 16 | 18 | 25 | 31 | 26 |
| | $3^{rd}$ | 29 | 13 | 13 | 31 | 17 | 9 | 39 |
| | $4^{th}$ | 31 | 26 | 39 | 15 | 7 | 6 | 3 |
| Section 11 | $1^{st}$ | 7 | 16 | 33 | 30 | 5 | 37 | 31 |
| | $2^{nd}$ | 27 | 24 | 19 | 12 | 15 | 27 | 6 |
| | $3^{rd}$ | 30 | 38 | 25 | 6 | 4 | 25 | 10 |
| | $4^{th}$ | 38 | 11 | 7 | 38 | 2 | 20 | 9 |
| Residual | | 45 | 45 | 45 | 45 | 45 | 45 | 45 | permutation in the second permutation step is applied such that the two bits of the first 16-QAM constellation word having the lowest reliability are made up of bits of the first cyclic block of the respective section, the two bits of the first 16-QAM constellation word having the highest reliability are made up of bits of the second cyclic block of the respective section, the two bits of the second 16-QAM constellation word having the lowest reliability are made up of bits of the third cyclic block of the respective section, and the two bits of the second 16-QAM constellation word having the highest reliability are made up of bits of the fourth cyclic block of the respective section.

According to this method, the N cyclic blocks of the codeword based on QC-LDPC codes are appropriately permuted, and then bits of the codeword with the permuted cyclic blocks are appropriately mapped onto two constellation words. Thus, the method further improves the reception performance of a communication system.

(12) According to the twelfth interleaving method, in the third interleaving method, with B=10 and a transmission power ratio of 1/4, wherein the quasi-cyclic low-density parity-check code is a code defined by the DVB-NGH standard with a code rate of one of 1/3, 2/5, 7/15, 8/15, 3/5, 2/3 and 11/15, the bits of each spatial-multiplexing block are divided into a 16-QAM constellation word and a 64-QAM constellation word, and permutation in the first permutation step is applied according to cyclic block permutation shown in Table 10, in accordance with the code rates of the quasi-cyclic low-density parity-check code:

TABLE 10

| | | Code Rate | | | | | | |
|---|---|---|---|---|---|---|---|---|
| | | 1/3 | 2/5 | 7/15 | 8/15 | 3/5 | 2/3 | 11/15 |
| Section 1 | $1^{st}$ | 42 | 44 | 39 | 28 | 35 | 38 | 27 |
| | $2^{nd}$ | 30 | 23 | 32 | 25 | 12 | 30 | 4 |
| | $3^{rd}$ | 27 | 13 | 44 | 44 | 38 | 11 | 28 |
| | $4^{th}$ | 8 | 45 | 31 | 37 | 32 | 27 | 37 |
| | $5^{th}$ | 17 | 1 | 10 | 8 | 24 | 17 | 39 |
| Section 2 | $1^{st}$ | 38 | 2 | 33 | 2 | 28 | 16 | 44 |
| | $2^{nd}$ | 32 | 21 | 19 | 10 | 11 | 22 | 8 |
| | $3^{rd}$ | 36 | 14 | 36 | 38 | 45 | 45 | 1 |
| | $4^{th}$ | 6 | 4 | 11 | 3 | 23 | 21 | 18 |
| | $5^{th}$ | 15 | 25 | 4 | 6 | 33 | 44 | 41 |
| Section 3 | $1^{st}$ | 26 | 41 | 28 | 13 | 42 | 1 | 45 |
| | $2^{nd}$ | 14 | 20 | 7 | 42 | 14 | 23 | 29 |
| | $3^{rd}$ | 40 | 22 | 18 | 39 | 40 | 3 | 42 |
| | $4^{th}$ | 18 | 29 | 22 | 35 | 6 | 2 | 19 |
| | $5^{th}$ | 22 | 19 | 1 | 1 | 31 | 35 | 15 |
| Section 4 | $1^{st}$ | 9 | 30 | 41 | 16 | 3 | 7 | 34 |
| | $2^{nd}$ | 45 | 24 | 35 | 41 | 8 | 8 | 2 |
| | $3^{rd}$ | 23 | 17 | 14 | 18 | 17 | 12 | 40 |
| | $4^{th}$ | 41 | 42 | 13 | 9 | 2 | 39 | 17 |
| | $5^{th}$ | 29 | 33 | 29 | 17 | 15 | 13 | 9 |
| Section 5 | $1^{st}$ | 20 | 27 | 34 | 34 | 19 | 40 | 10 |
| | $2^{nd}$ | 4 | 5 | 2 | 19 | 43 | 6 | 33 |
| | $3^{rd}$ | 44 | 36 | 3 | 27 | 37 | 42 | 31 |
| | $4^{th}$ | 37 | 11 | 24 | 11 | 20 | 36 | 25 |
| | $5^{th}$ | 2 | 3 | 9 | 4 | 22 | 14 | 35 |
| Section 6 | $1^{st}$ | 43 | 40 | 40 | 33 | 5 | 18 | 21 |
| | $2^{nd}$ | 12 | 8 | 25 | 24 | 18 | 34 | 7 |
| | $3^{rd}$ | 11 | 18 | 30 | 30 | 1 | 31 | 30 |
| | $4^{th}$ | 10 | 7 | 6 | 23 | 9 | 28 | 43 |
| | $5^{th}$ | 28 | 35 | 23 | 7 | 4 | 24 | 14 |
| Section 7 | $1^{st}$ | 21 | 16 | 43 | 12 | 10 | 10 | 3 |
| | $2^{nd}$ | 16 | 10 | 16 | 14 | 30 | 5 | 6 |
| | $3^{rd}$ | 5 | 38 | 42 | 45 | 41 | 15 | 20 |
| | $4^{th}$ | 13 | 31 | 37 | 32 | 21 | 26 | 22 |
| | $5^{th}$ | 31 | 28 | 5 | 15 | 13 | 9 | 36 |
| Section 8 | $1^{st}$ | 33 | 43 | 38 | 40 | 44 | 20 | 12 |
| | $2^{nd}$ | 3 | 34 | 21 | 21 | 25 | 19 | 32 |
| | $3^{rd}$ | 1 | 6 | 26 | 36 | 36 | 37 | 38 |
| | $4^{th}$ | 35 | 12 | 17 | 22 | 34 | 32 | 16 |
| | $5^{th}$ | 7 | 9 | 12 | 29 | 26 | 29 | 5 |

TABLE 10-continued

|  |  | Code Rate | | | | | | |
|---|---|---|---|---|---|---|---|---|
|  |  | 1/3 | 2/5 | 7/15 | 8/15 | 3/5 | 2/3 | 11/15 |
| Section 9 | 1st | 24 | 39 | 45 | 43 | 29 | 25 | 13 |
|  | 2nd | 25 | 26 | 20 | 20 | 39 | 33 | 24 |
|  | 3rd | 39 | 37 | 27 | 26 | 16 | 4 | 26 |
|  | 4th | 34 | 15 | 15 | 31 | 27 | 43 | 11 |
|  | 5th | 19 | 32 | 8 | 5 | 7 | 41 | 23 | permutation in the second permutation step is applied such that the two bits of the 16-QAM constellation word having the lowest reliability are made up of bits of the first cyclic block of the respective section, the two bits of the 16-QAM constellation word having the highest reliability are made up of bits of the second cyclic block of the respective section, the two bits of the 64-QAM constellation word having the lowest reliability are made up of bits of the third cyclic block of the respective section, the two bits of the 64-QAM constellation word having the second lowest reliability are made up of bits of the fourth cyclic block of the respective section, and the two bits of the 64-QAM constellation word having the highest reliability are made up of bits of the fifth cyclic block of the respective section.

According to this method, the N cyclic blocks of the codeword based on QC-LDPC codes are appropriately permuted, and then bits of the codeword with the permuted cyclic blocks are appropriately mapped onto two constellation words. Thus, the method further improves the reception performance of a communication system.

INDUSTRIAL APPLICABILITY

The present invention is applicable to bit-interleaved coding and modulation with LDPC codes and spatial multiplexing.

REFERENCE SIGNS LIST

100 transmitter
110 input processing unit
120 BICM encoder
121 LDPC encoder
122 bit interleaver
122-1-122-3 section permutation unit
123 demultiplexer
124-1-124-2 QAM mapper
125 SM encoder
130-1-130-2 modulator
140-1-140-2 amplifier
150-1-150-2 transmit antenna
300 bit interleaver
310 block permutation unit
500 receiver
510-1-510-2 receive antenna
520-1-520-2 RF front end
530-1-530-2 demodulator
540 MIMO decoder
541 SM decoder
545-1-545-2 QAM demapper
550 multiplexer
560 bit deinterleaver
570 LDPC decoder

The invention claimed is:

1. An interleaving method performed by a transmitter for a communication system with quasi-cyclic low-density parity-check codes, spatial multiplexing, and T transmit antennas, T being an integer greater than 1, the interleaving method being used for applying bit permutation to bits of a codeword of a quasi-cyclic low-density parity-check code in order to generate a plurality of constellation words constituting a plurality of spatial-multiplexing blocks from the codeword, the codeword consisting of N cyclic blocks, and each cyclic block consisting of Q bits, each spatial-multiplexing block consisting of B bits and consisting of T constellation words, the interleaving method comprising:

a first permutation step of permuting the N cyclic blocks of the codeword; and a second permutation step of permuting the bits of the codeword, whose N cyclic blocks have been permuted, so as to map the bits to the T constellation words constituting each spatial-multiplexing block, wherein T=2, N=45, Q=360, and B is 6, the N cyclic blocks are divided into a plurality of sections each including B/2 cyclic blocks, a transmission power ratio is 1/1, the quasi-cyclic low-density parity-check code is a code defined by the DVB-NGH standard with a code rate of one of 7/15, 8/15, and 3/5, the bits of each spatial-multiplexing block are divided into a 4-QAM constellation word and a 16-QAM constellation word, and permutation in the first permutation step is applied according to cyclic block permutation shown in Table 1, in accordance with the code rates of the quasi-cyclic low-density parity-check code:

TABLE 1

|  |  | Code Rate | | |
|---|---|---|---|---|
|  |  | 7/15 | 8/15 | 3/5 |
| Section 1 | 1st | 13 | 12 | 32 |
|  | 2nd | 11 | 27 | 38 |
|  | 3rd | 44 | 14 | 25 |
| Section 2 | 1st | 41 | 35 | 18 |
|  | 2nd | 24 | 13 | 28 |
|  | 3rd | 12 | 38 | 34 |
| Section 3 | 1st | 16 | 7 | 7 |
|  | 2nd | 27 | 39 | 39 |
|  | 3rd | 14 | 9 | 15 |
| Section 4 | 1st | 22 | 19 | 20 |
|  | 2nd | 32 | 43 | 40 |
|  | 3rd | 5 | 33 | 44 |
| Section 5 | 1st | 17 | 24 | 19 |
|  | 2nd | 29 | 25 | 12 |
|  | 3rd | 39 | 10 | 29 |
| Section 6 | 1st | 6 | 6 | 14 |
|  | 2nd | 35 | 45 | 17 |
|  | 3rd | 30 | 21 | 21 |
| Section 7 | 1st | 10 | 2 | 33 |
|  | 2nd | 8 | 28 | 5 |
|  | 3rd | 37 | 4 | 24 |
| Section 8 | 1st | 3 | 3 | 36 |
|  | 2nd | 38 | 17 | 41 |
|  | 3rd | 1 | 15 | 31 |
| Section 9 | 1st | 7 | 40 | 10 |
|  | 2nd | 42 | 42 | 6 |
|  | 3rd | 26 | 22 | 27 |
| Section 10 | 1st | 15 | 8 | 45 |
|  | 2nd | 28 | 41 | 42 |
|  | 3rd | 34 | 11 | 37 |
| Section 11 | 1st | 9 | 32 | 13 |
|  | 2nd | 23 | 16 | 43 |
|  | 3rd | 43 | 18 | 11 |
| Section 12 | 1st | 4 | 44 | 26 |
|  | 2nd | 40 | 31 | 16 |
|  | 3rd | 2 | 37 | 22 |

TABLE 1-continued

|  |  | Code Rate | | |
|---|---|---|---|---|
|  |  | 7/15 | 8/15 | 3/5 |
| Section 13 | $1^{st}$ | 20 | 30 | 2 |
|  | $2^{nd}$ | 25 | 26 | 1 |
|  | $3^{rd}$ | 36 | 29 | 3 |
| Section 14 | $1^{st}$ | 21 | 34 | 8 |
|  | $2^{nd}$ | 33 | 36 | 30 |
|  | $3^{rd}$ | 31 | 23 | 9 |
| Section 15 | $1^{st}$ | 18 | 5 | 23 |
|  | $2^{nd}$ | 19 | 20 | 4 |
|  | $3^{rd}$ | 45 | 1 | 35 | permutation in the second permutation step is applied such that,
the two bits of the 4-QAM constellation word are made up of bits of the first cyclic block of the respective section, the two bits of the 16-QAM constellation word having the lowest reliability are made up of bits of the second cyclic block of the respective section, and the two bits of the 16-QAM constellation word having the highest reliability are made up of bits of the third cyclic block of the respective section.

2. An interleaving method performed by a transmitter for a communication system with quasi-cyclic low-density parity-check codes, spatial multiplexing, and T transmit antennas, T being an integer greater than 1, the interleaving method being used for applying bit permutation to bits of a codeword of a quasi-cyclic low-density parity-check code in order to generate a plurality of constellation words constituting a plurality of spatial-multiplexing blocks from the codeword,
the codeword consisting of N cyclic blocks, and each cyclic block consisting of Q bits,
each spatial-multiplexing block consisting of B bits and consisting of T constellation words,
the interleaving method comprising:
a first permutation step of permuting the N cyclic blocks of the codeword; and
a second permutation step of permuting the bits of the codeword, whose N cyclic blocks have been permuted, so as to map the bits to the T constellation words constituting each spatial-multiplexing block, wherein
T=2, N=45, Q=360, and B is 6,
the N cyclic blocks are divided into a plurality of sections each including B/2 cyclic blocks,
a transmission power ratio is 1/2,
the quasi-cyclic low-density parity-check code is a code defined by the DVB-NGH standard with a code rate of one of 7/15, 8/15, and 3/5,
the bits of each spatial-multiplexing block are divided into a 4-QAM constellation word and a 16-QAM constellation word, and
permutation in the first permutation step is applied according to cyclic block permutation shown in Table 4, in accordance with the code rates of the quasi-cyclic low-density parity-check code:

TABLE 4

|  |  | Code Rate | | |
|---|---|---|---|---|
|  |  | 7/15 | 8/15 | 3/5 |
| Section 1 | $1^{st}$ | 34 | 8 | 31 |
|  | $2^{nd}$ | 13 | 25 | 43 |
|  | $3^{rd}$ | 24 | 22 | 26 |

TABLE 4-continued

|  |  | Code Rate | | |
|---|---|---|---|---|
|  |  | 7/15 | 8/15 | 3/5 |
| Section 2 | $1^{st}$ | 16 | 18 | 20 |
|  | $2^{nd}$ | 40 | 28 | 44 |
|  | $3^{rd}$ | 19 | 20 | 39 |
| Section 3 | $1^{st}$ | 23 | 3 | 18 |
|  | $2^{nd}$ | 38 | 23 | 28 |
|  | $3^{rd}$ | 1 | 4 | 11 |
| Section 4 | $1^{st}$ | 28 | 33 | 37 |
|  | $2^{nd}$ | 36 | 38 | 12 |
|  | $3^{rd}$ | 21 | 19 | 36 |
| Section 5 | $1^{st}$ | 9 | 27 | 34 |
|  | $2^{nd}$ | 6 | 31 | 42 |
|  | $3^{rd}$ | 2 | 11 | 40 |
| Section 6 | $1^{st}$ | 42 | 6 | 9 |
|  | $2^{nd}$ | 44 | 45 | 7 |
|  | $3^{rd}$ | 8 | 24 | 21 |
| Section 7 | $1^{st}$ | 43 | 29 | 22 |
|  | $2^{nd}$ | 33 | 39 | 6 |
|  | $3^{rd}$ | 5 | 7 | 16 |
| Section 8 | $1^{st}$ | 22 | 26 | 27 |
|  | $2^{nd}$ | 41 | 41 | 29 |
|  | $3^{rd}$ | 32 | 2 | 13 |
| Section 9 | $1^{st}$ | 29 | 10 | 8 |
|  | $2^{nd}$ | 45 | 40 | 30 |
|  | $3^{rd}$ | 15 | 32 | 19 |
| Section 10 | $1^{st}$ | 18 | 13 | 38 |
|  | $2^{nd}$ | 26 | 14 | 45 |
|  | $3^{rd}$ | 37 | 9 | 32 |
| Section 11 | $1^{st}$ | 27 | 1 | 4 |
|  | $2^{nd}$ | 31 | 34 | 2 |
|  | $3^{rd}$ | 10 | 5 | 10 |
| Section 12 | $1^{st}$ | 17 | 35 | 5 |
|  | $2^{nd}$ | 30 | 36 | 1 |
|  | $3^{rd}$ | 11 | 21 | 14 |
| Section 13 | $1^{st}$ | 14 | 42 | 17 |
|  | $2^{nd}$ | 20 | 37 | 41 |
|  | $3^{rd}$ | 7 | 12 | 24 |
| Section 14 | $1^{st}$ | 3 | 16 | 35 |
|  | $2^{nd}$ | 35 | 30 | 3 |
|  | $3^{rd}$ | 4 | 17 | 23 |
| Section 15 | $1^{st}$ | 39 | 15 | 15 |
|  | $2^{nd}$ | 25 | 44 | 33 |
|  | $3^{rd}$ | 12 | 43 | 25 | permutation in the second permutation step is applied such that
the two bits of the 4-QAM constellation word are made up of bits of the first cyclic block of the respective section, the two bits of the 16-QAM constellation word having the lowest reliability are made up of bits of the second cyclic block of the respective section, and the two bits of the 16-QAM constellation word having the highest reliability are made up of bits of the third cyclic block of the respective section.

3. An interleaving method performed by a transmitter for a communication system with quasi-cyclic low-density parity-check codes, spatial multiplexing, and T transmit antennas, T being an integer greater than 1, the interleaving method being used for applying bit permutation to bits of a codeword of a quasi-cyclic low-density parity-check code in order to generate a plurality of constellation words constituting a plurality of spatial-multiplexing blocks from the codeword,
the codeword consisting of N cyclic blocks, and each cyclic block consisting of Q bits,
each spatial-multiplexing block consisting of B bits and consisting of T constellation words,
the interleaving method comprising:
a first permutation step of permuting the N cyclic blocks of the codeword; and
a second permutation step of permuting the bits of the codeword, whose N cyclic blocks have been permuted, so as to map the bits to the T constellation words constituting each spatial-multiplexing block, wherein
T=2, N=45, Q=360, and B is 6,
the N cyclic blocks are divided into a plurality of sections each including B/2 cyclic blocks,
a transmission power ratio is 1/4,
the quasi-cyclic low-density parity-check code is a code defined by the DVB-NGH standard with a code rate of one of 7/15, 8/15, and 3/5,
the bits of each spatial-multiplexing block are divided into a 4-QAM constellation word and a 16-QAM constellation word, and
permutation in the first permutation step is applied according to cyclic block permutation shown in Table 7, in accordance with the code rates of the quasi-cyclic low-density parity-check code:

TABLE 7

| | | Code Rate | | |
|---|---|---|---|---|
| | | 7/15 | 8/15 | 3/5 |
| Section 1 | $1^{st}$ | 34 | 34 | 23 |
| | $2^{nd}$ | 13 | 13 | 5 |
| | $3^{rd}$ | 24 | 24 | 22 |
| Section 2 | $1^{st}$ | 16 | 16 | 42 |
| | $2^{nd}$ | 40 | 15 | 45 |
| | $3^{rd}$ | 19 | 18 | 20 |
| Section 3 | $1^{st}$ | 23 | 23 | 43 |
| | $2^{nd}$ | 38 | 32 | 18 |
| | $3^{rd}$ | 1 | 1 | 11 |
| Section 4 | $1^{st}$ | 28 | 28 | 27 |
| | $2^{nd}$ | 36 | 36 | 39 |
| | $3^{rd}$ | 21 | 21 | 34 |
| Section 5 | $1^{st}$ | 9 | 9 | 41 |
| | $2^{nd}$ | 6 | 6 | 37 |
| | $3^{rd}$ | 2 | 2 | 6 |
| Section 6 | $1^{st}$ | 42 | 42 | 24 |
| | $2^{nd}$ | 44 | 44 | 16 |
| | $3^{rd}$ | 8 | 8 | 8 |
| Section 7 | $1^{st}$ | 43 | 37 | 30 |
| | $2^{nd}$ | 33 | 33 | 40 |
| | $3^{rd}$ | 5 | 5 | 12 |
| Section 8 | $1^{st}$ | 22 | 22 | 35 |
| | $2^{nd}$ | 41 | 19 | 21 |
| | $3^{rd}$ | 32 | 14 | 31 |
| Section 9 | $1^{st}$ | 29 | 29 | 36 |
| | $2^{nd}$ | 45 | 45 | 10 |
| | $3^{rd}$ | 15 | 40 | 33 |
| Section 10 | $1^{st}$ | 18 | 41 | 44 |
| | $2^{nd}$ | 26 | 26 | 38 |
| | $3^{rd}$ | 37 | 43 | 14 |
| Section 11 | $1^{st}$ | 27 | 27 | 4 |
| | $2^{nd}$ | 31 | 31 | 3 |
| | $3^{rd}$ | 10 | 10 | 13 |
| Section 12 | $1^{st}$ | 17 | 17 | 9 |
| | $2^{nd}$ | 30 | 30 | 29 |
| | $3^{rd}$ | 11 | 11 | 19 |
| Section 13 | $1^{st}$ | 14 | 38 | 32 |
| | $2^{nd}$ | 20 | 20 | 15 |
| | $3^{rd}$ | 7 | 7 | 25 |
| Section 14 | $1^{st}$ | 3 | 3 | 28 |
| | $2^{nd}$ | 35 | 35 | 26 |
| | $3^{rd}$ | 4 | 4 | 17 |
| Section 15 | $1^{st}$ | 39 | 39 | 1 |
| | $2^{nd}$ | 25 | 25 | 2 |
| | $3^{rd}$ | 12 | 12 | 7 | permutation in the second permutation step is applied such that
the two bits of the 4-QAM constellation word are made up of bits of the first cyclic block of the respective section,
the two bits of the 16-QAM constellation word having the lowest reliability are made up of bits of the second cyclic block of the respective section, and the two bits of the 16-QAM constellation word having the highest reliability are made up of bits of the third cyclic block of the respective section.

4. A signal processing method performed by a receiver for a communication system with quasi-cyclic low-density parity-check codes, spatial multiplexing, and T transmit antennas, T being an integer greater than 1,
the signal processing method comprising:
a demodulating step of demodulating signals based on modulation schemes and generating demodulated signals, said signals being transmitted by mapping information generated from T constellation words according to said modulation schemes that each correspond to T constellation words, each T constellation words making up one of a plurality of spatial-multiplexing blocks generated from a codeword at a transmission side, wherein
the codeword is composed of N cyclic blocks and each cyclic block is composed of Q bits, where N=45 and Q=360,
each spatial-multiplexing block is composed of B bits and T constellation words, where B=6 and T=2,
T constellation words are composed of a 4-QAM constellation word and a 16-QAM constellation word, and
a transmission power ratio is 1/1;
an LDPC decoding step of decoding, using an LDPC decoder, the demodulated signals based on a quasi-cyclic low-density parity-check code used at the transmission side among quasi-cyclic low-density parity-check codes having code rates of 7/15, 8/15, and 3/5 as defined by the DVB-NGH standard; and
an output step of outputting the demodulated signal to the LDPC decoder, based on rules used (i) in permutation of the N cyclic blocks of the codeword performed based on Table 1 according to the first permutation step performed by the interleaving method defined in claim 1 and (ii) in bit permutation of the codeword after permutation of the N cyclic blocks performed according to the second permutation step performed by the interleaving method defined in claim 1.

5. An interleaver provided in a transmitter for a communication system with quasi-cyclic low-density parity-check codes, spatial multiplexing, and T transmit antennas, T being an integer greater than 1, the interleaver applying bit permutation to bits of a codeword of a quasi-cyclic low-density parity-check code in order to generate a plurality of constellation words of a plurality of spatial-multiplexing blocks from the codeword,
the codeword consisting of N cyclic blocks, each cyclic block consisting of Q bits,
each spatial-multiplexing block consisting of B bits and consisting of T constellation words,
the interleaver comprising:
a first permutation unit that permutes the N cyclic blocks to obtain a permuted codeword in which a sequence of the N cyclic blocks is permuted; and
a second permutation unit that permutes the bits of the permuted codeword to map the bits to the T constellation words constituting the spatial-multiplexing block, wherein
T=2, N=45, Q=360, and B is 6,
the N cyclic blocks are divided into a plurality of sections each including B/2 cyclic blocks,
a transmission power ratio is 1/1,
the quasi-cyclic low-density parity-check code is a code defined by the DVB-NGH standard with a code rate of one of 7/15, 8/15, and 3/5, the bits of each spatial-multiplexing block are divided into a 4-QAM constellation word and a 16-QAM constellation word, and permutation by the first interleaving unit is applied according to cyclic block permutation shown in Table 1, in accordance with the code rates of the quasi-cyclic low-density parity-check code:

TABLE 1

|  |  | Code Rate | | |
|---|---|---|---|---|
|  |  | 7/15 | 8/15 | 3/5 |
| Section 1 | 1st | 13 | 12 | 32 |
|  | 2nd | 11 | 27 | 38 |
|  | 3rd | 44 | 14 | 25 |
| Section 2 | 1st | 41 | 35 | 18 |
|  | 2nd | 24 | 13 | 28 |
|  | 3rd | 12 | 38 | 34 |
| Section 3 | 1st | 16 | 7 | 7 |
|  | 2nd | 27 | 39 | 39 |
|  | 3rd | 14 | 9 | 15 |
| Section 4 | 1st | 22 | 19 | 20 |
|  | 2nd | 32 | 43 | 40 |
|  | 3rd | 5 | 33 | 44 |
| Section 5 | 1st | 17 | 24 | 19 |
|  | 2nd | 29 | 25 | 12 |
|  | 3rd | 39 | 10 | 29 |
| Section 6 | 1st | 6 | 6 | 14 |
|  | 2nd | 35 | 45 | 17 |
|  | 3rd | 30 | 21 | 21 |
| Section 7 | 1st | 10 | 2 | 33 |
|  | 2nd | 8 | 28 | 5 |
|  | 3rd | 37 | 4 | 24 |
| Section 8 | 1st | 3 | 3 | 36 |
|  | 2nd | 38 | 17 | 41 |
|  | 3rd | 1 | 15 | 31 |
| Section 9 | 1st | 7 | 40 | 10 |
|  | 2nd | 42 | 42 | 6 |
|  | 3rd | 26 | 22 | 27 |
| Section 10 | 1st | 15 | 8 | 45 |
|  | 2nd | 28 | 41 | 42 |
|  | 3rd | 34 | 11 | 37 |
| Section 11 | 1st | 9 | 32 | 13 |
|  | 2nd | 23 | 16 | 43 |
|  | 3rd | 43 | 18 | 11 |
| Section 12 | 1st | 4 | 44 | 26 |
|  | 2nd | 40 | 31 | 16 |
|  | 3rd | 2 | 37 | 22 |
| Section 13 | 1st | 20 | 30 | 2 |
|  | 2nd | 25 | 26 | 1 |
|  | 3rd | 36 | 29 | 3 |
| Section 14 | 1st | 21 | 34 | 8 |
|  | 2nd | 33 | 36 | 30 |
|  | 3rd | 31 | 23 | 9 |
| Section 15 | 1st | 18 | 5 | 23 |
|  | 2nd | 19 | 20 | 4 |
|  | 3rd | 45 | 1 | 35 | permutation by the second permutation unit is applied such that, the two bits of the 4-QAM constellation word are made up of bits of the first cyclic block of the respective section, the two bits of the 16-QAM constellation word having the lowest reliability are made up of bits of the second cyclic block of the respective section, and the two bits of the 16-QAM constellation word having the highest reliability are made up of bits of the third cyclic block of the respective section.

6. A signal processor provided in a receiver for a communication system with quasi-cyclic low-density parity-check codes, spatial multiplexing, and T transmit antennas, T being an integer greater than 1, wherein the signal processor comprising:

a demodulator configured to demodulate signals based on modulation schemes and generate demodulated signals, said signals being transmitted by mapping information generated from T constellation words according to said modulation schemes that each correspond to T constellation words, each T constellation words making up one of a plurality of spatial-multiplexing blocks generated from a codeword at a transmission side, wherein the codeword is composed of N cyclic blocks and each cyclic block is composed of Q bits, where N=45 and Q=360, each spatial-multiplexing block is composed of B bits and T constellation words, where B=6 and T=2, T constellation words are composed of a 4-QAM constellation word and a 16-QAM constellation word, and a transmission power ratio is 1/1;

an LDPC decoder configured to decode the demodulated signals based on a quasi-cyclic low-density parity-check code used at the transmission side among quasi-cyclic low-density parity-check codes having code rates of 7/15, 8/15, and 3/5 as defined by the DVB-NGH standard; and an outputter configured to output the demodulated signal to the LDPC decoder, based on rules used (i) in permutation of the N cyclic blocks of the codeword performed based on Table 1 according to the first permutation unit of the interleaver defined in claim 5 and (ii) in bit permutation of the codeword after permutation of the N cyclic blocks performed according to the second permutation unit of the interleaver defined in claim 5.

7. A signal processing method performed by a receiver for a communication system with quasi-cyclic low-density parity-check codes, spatial multiplexing, and T transmit antennas, T being an integer greater than 1, the signal processing method comprising:

a demodulating step of demodulating signals based on modulation schemes and generating demodulated signals, said signals being transmitted by mapping information generated from T constellation words according to said modulation schemes that each correspond to T constellation words, each T constellation words making up one of a plurality of spatial-multiplexing blocks generated from a codeword at a transmission side, wherein the codeword is composed of N cyclic blocks and each cyclic block is composed of Q bits, where N=45 and Q=360, each spatial-multiplexing block is composed of B bits and T constellation words, where B=6 and T=2, T constellation words are composed of a 4-QAM constellation word and a 16-QAM constellation word, and a transmission power ratio is 1/2;

an LDPC decoding step of decoding, using an LDPC decoder, the demodulated signals based on a quasi-cyclic low-density parity-check code used at the transmission side among quasi-cyclic low-density parity-check codes having code rates of 7/15, 8/15, and 3/5 as defined by the DVB-NGH standard; and an output step of outputting the demodulated signal to the LDPC decoder, based on rules used (i) in permutation of the N cyclic blocks of the codeword performed based on Table 4 according to the first permutation step performed by the interleaving method defined in claim 2 and (ii) in bit permutation of the codeword after permutation of the N cyclic blocks performed according to the second permutation step performed by the interleaving method defined in claim 2.

8. A signal processing method performed by a receiver for a communication system with quasi-cyclic low-density parity-check codes, spatial multiplexing, and T transmit antennas, T being an integer greater than 1, the signal processing method comprising:

a demodulating step of demodulating signals based on modulation schemes and generating demodulated signals, said signals being transmitted by mapping information generated from T constellation words according to said modulation schemes that each correspond to T constellation words, each T constellation words making up one of a plurality of spatial-multiplexing blocks generated from a codeword at a transmission side, wherein the codeword is composed of N cyclic blocks and each cyclic block is composed of Q bits, where N=45 and Q=360, each spatial-multiplexing block is composed of B bits and T constellation words, where B=6 and T=2, T constellation words are composed of a 4-QAM constellation word and a 16-QAM constellation word, and a transmission power ratio is 1/4;

an LDPC decoding step of decoding, using an LDPC decoder, the demodulated signals based on a quasi-cyclic low-density parity-check code used at the transmission side among quasi-cyclic low-density parity-check codes having code rates of 7/15, 8/15, and 3/5 as defined by the DVB-NGH standard; and an output step of outputting the demodulated signal to the LDPC decoder, based on rules used (i) in permutation of the N cyclic blocks of the codeword performed based on Table 7 according to the first permutation step performed by the interleaving method defined in claim 3 and (ii) in bit permutation of the codeword after permutation of the N cyclic blocks performed according to the second permutation step performed by the interleaving method defined in claim 3.

9. An interleaver provided in a transmitter for a communication system with quasi-cyclic low-density parity-check codes, spatial multiplexing, and T transmit antennas, T being an integer greater than 1, the interleaver applying bit permutation to bits of a codeword of a quasi-cyclic low-density parity-check code in order to generate a plurality of constellation words of a plurality of spatial-multiplexing blocks from the codeword, the codeword consisting of N cyclic blocks, each cyclic block consisting of Q bits, each spatial-multiplexing block consisting of B bits and consisting of T constellation words, the interleaver comprising:

a first permutation unit that permutes the N cyclic blocks to obtain a permuted codeword in which a sequence of the N cyclic blocks is permuted; and a second permutation unit that permutes the bits of the permuted codeword to map the bits to the T constellation words constituting the spatial-multiplexing block, wherein T=2, N=45, Q=360, and B is 6, the N cyclic blocks are divided into a plurality of sections each including B/2 cyclic blocks, a transmission power ratio is 1/2, the quasi-cyclic low-density parity-check code is a code defined by the DVB-NGH standard with a code rate of one of 7/15, 8/15, and 3/5, the bits of each spatial-multiplexing block are divided into a 4-QAM constellation word and a 16-QAM constellation word, and permutation by the first permutation unit is applied according to cyclic block permutation shown in Table 4, in accordance with the code rates of the quasi-cyclic low-density parity-check code:

TABLE 4

| | | Code Rate | | |
|---|---|---|---|---|
| | | 7/15 | 8/15 | 3/5 |
| Section 1 | $1^{st}$ | 34 | 8 | 31 |
| | $2^{nd}$ | 13 | 25 | 43 |
| | $3^{rd}$ | 24 | 22 | 26 |
| Section 2 | $1^{st}$ | 16 | 18 | 20 |
| | $2^{nd}$ | 40 | 28 | 44 |
| | $3^{rd}$ | 19 | 20 | 39 |
| Section 3 | $1^{st}$ | 23 | 3 | 18 |
| | $2^{nd}$ | 38 | 23 | 28 |
| | $3^{rd}$ | 1 | 4 | 11 |
| Section 4 | $1^{st}$ | 28 | 33 | 37 |
| | $2^{nd}$ | 36 | 38 | 12 |
| | $3^{rd}$ | 21 | 19 | 36 |
| Section 5 | $1^{st}$ | 9 | 27 | 34 |
| | $2^{nd}$ | 6 | 31 | 42 |
| | $3^{rd}$ | 2 | 11 | 40 |
| Section 6 | $1^{st}$ | 42 | 6 | 9 |
| | $2^{nd}$ | 44 | 45 | 7 |
| | $3^{rd}$ | 8 | 24 | 21 |
| Section 7 | $1^{st}$ | 43 | 29 | 22 |
| | $2^{nd}$ | 33 | 39 | 6 |
| | $3^{rd}$ | 5 | 7 | 16 |
| Section 8 | $1^{st}$ | 22 | 26 | 27 |
| | $2^{nd}$ | 41 | 41 | 29 |
| | $3^{rd}$ | 32 | 2 | 13 |
| Section 9 | $1^{st}$ | 29 | 10 | 8 |
| | $2^{nd}$ | 45 | 40 | 30 |
| | $3^{rd}$ | 15 | 32 | 19 |
| Section 10 | $1^{st}$ | 18 | 13 | 38 |
| | $2^{nd}$ | 26 | 14 | 45 |
| | $3^{rd}$ | 37 | 9 | 32 |
| Section 11 | $1^{st}$ | 27 | 1 | 4 |
| | $2^{nd}$ | 31 | 34 | 2 |
| | $3^{rd}$ | 10 | 5 | 10 |
| Section 12 | $1^{st}$ | 17 | 35 | 5 |
| | $2^{nd}$ | 30 | 36 | 1 |
| | $3^{rd}$ | 11 | 21 | 14 |
| Section 13 | $1^{st}$ | 14 | 42 | 17 |
| | $2^{nd}$ | 20 | 37 | 41 |
| | $3^{rd}$ | 7 | 12 | 24 |
| Section 14 | $1^{st}$ | 3 | 16 | 35 |
| | $2^{nd}$ | 35 | 30 | 3 |
| | $3^{rd}$ | 4 | 17 | 23 |
| Section 15 | $1^{st}$ | 39 | 15 | 15 |
| | $2^{nd}$ | 25 | 44 | 33 |
| | $3^{rd}$ | 12 | 43 | 25 | permutation by the second permutation unit is applied such that the two bits of the 4-QAM constellation word are made up of bits of the first cyclic block of the respective section, the two bits of the 16-QAM constellation word having the lowest reliability are made up of bits of the second cyclic block of the respective section, and the two bits of the 16-QAM constellation word having the highest reliability are made up of bits of the third cyclic block of the respective section.

10. An interleaver provided in a transmitter for a communication system with quasi-cyclic low-density parity-check codes, spatial multiplexing, and T transmit antennas, T being an integer greater than 1, the interleaver applying bit permutation to bits of a codeword of a quasi-cyclic low-density parity-check code in order to generate a plurality of constellation words of a plurality of spatial-multiplexing blocks from the codeword, the codeword consisting of N cyclic blocks, each cyclic block consisting of Q bits, each spatial-multiplexing block consisting of B bits and consisting of T constellation words, the interleaver comprising:
a first permutation unit that permutes the N cyclic blocks to obtain a permuted codeword in which a sequence of the N cyclic blocks is permuted; and
a second permutation unit that permutes the bits of the permuted codeword to map the bits to the T constellation words constituting the spatial-multiplexing block, wherein
T=2, N=45, Q=360, and B is 6,
the N cyclic blocks are divided into a plurality of sections each including B/2 cyclic blocks,
a transmission power ratio is 1/4,
the quasi-cyclic low-density parity-check code is a code defined by the DVB-NGH standard with a code rate of one of 7/15, 8/15, and 3/5,
the bits of each spatial-multiplexing block are divided into a 4-QAM constellation word and a 16-QAM constellation word, and
permutation by the first permutation unit is applied according to cyclic block permutation shown in Table 7, in accordance with the code rates of the quasi-cyclic low-density parity-check code:

TABLE 7

| | | Code Rate | | |
|---|---|---|---|---|
| | | 7/15 | 8/15 | 3/5 |
| Section 1 | $1^{st}$ | 34 | 34 | 23 |
| | $2^{nd}$ | 13 | 13 | 5 |
| | $3^{rd}$ | 24 | 24 | 22 |
| Section 2 | $1^{st}$ | 16 | 16 | 42 |
| | $2^{nd}$ | 40 | 15 | 45 |
| | $3^{rd}$ | 19 | 18 | 20 |
| Section 3 | $1^{st}$ | 23 | 23 | 43 |
| | $2^{nd}$ | 38 | 32 | 18 |
| | $3^{rd}$ | 1 | 1 | 11 |
| Section 4 | $1^{st}$ | 28 | 28 | 27 |
| | $2^{nd}$ | 36 | 36 | 39 |
| | $3^{rd}$ | 21 | 21 | 34 |
| Section 5 | $1^{st}$ | 9 | 9 | 41 |
| | $2^{nd}$ | 6 | 6 | 37 |
| | $3^{rd}$ | 2 | 2 | 6 |
| Section 6 | $1^{st}$ | 42 | 42 | 24 |
| | $2^{nd}$ | 44 | 44 | 16 |
| | $3^{rd}$ | 8 | 8 | 8 |
| Section 7 | $1^{st}$ | 43 | 37 | 30 |
| | $2^{nd}$ | 33 | 33 | 40 |
| | $3^{rd}$ | 5 | 5 | 12 |
| Section 8 | $1^{st}$ | 22 | 22 | 35 |
| | $2^{nd}$ | 41 | 19 | 21 |
| | $3^{rd}$ | 32 | 14 | 31 |
| Section 9 | $1^{st}$ | 29 | 29 | 36 |
| | $2^{nd}$ | 45 | 45 | 10 |
| | $3^{rd}$ | 15 | 40 | 33 |
| Section 10 | $1^{st}$ | 18 | 41 | 44 |
| | $2^{nd}$ | 26 | 26 | 38 |
| | $3^{rd}$ | 37 | 43 | 14 |
| Section 11 | $1^{st}$ | 27 | 27 | 4 |
| | $2^{nd}$ | 31 | 31 | 3 |
| | $3^{rd}$ | 10 | 10 | 13 |
| Section 12 | $1^{st}$ | 17 | 17 | 9 |
| | $2^{nd}$ | 30 | 30 | 29 |
| | $3^{rd}$ | 11 | 11 | 19 |
| Section 13 | $1^{st}$ | 14 | 38 | 32 |
| | $2^{nd}$ | 20 | 20 | 15 |
| | $3^{rd}$ | 7 | 7 | 25 |
| Section 14 | $1^{st}$ | 3 | 3 | 28 |
| | $2^{nd}$ | 35 | 35 | 26 |
| | $3^{rd}$ | 4 | 4 | 17 |
| Section 15 | $1^{st}$ | 39 | 39 | 1 |
| | $2^{nd}$ | 25 | 25 | 2 |
| | $3^{rd}$ | 12 | 12 | 7 | permutation by the second permutation unit is applied such that the two bits of the 4-QAM constellation word are made up of bits of the first cyclic block of the respective section, the two bits of the 16-QAM constellation word having the lowest reliability are made up of bits of the second cyclic block of the respective section, and the two bits of the 16-QAM constellation word having the highest reliability are made up of bits of the third cyclic block of the respective section.

11. A signal processor provided in a receiver for a communication system with quasi-cyclic low-density parity-check codes, spatial multiplexing, and T transmit antennas, T being an integer greater than 1, wherein
the signal processor comprising:
a demodulator configured to demodulate signals based on modulation schemes and generate demodulated signals, said signals being transmitted by mapping information generated from T constellation words according to said modulation schemes that each correspond to T constellation words, each T constellation words making up one of a plurality of spatial-multiplexing blocks generated from a codeword at a transmission side, wherein
the codeword is composed of N cyclic blocks and each cyclic block is composed of Q bits, where N=45 and Q=360,
each spatial-multiplexing block is composed of B bits and T constellation words, where B=6 and T=2,
T constellation words are composed of a 4-QAM constellation word and a 16-QAM constellation word, and
a transmission power ratio is 1/2;
an LDPC decoder configured to decode the demodulated signals based on a quasi-cyclic low-density parity-check code used at the transmission side among quasi-cyclic low-density parity-check codes having code rates of 7/15, 8/15, and 3/5 as defined by the DVB-NGH standard; and
an outputter configured to output the demodulated signal to the LDPC decoder, based on rules used (i) in permutation of the N cyclic blocks of the codeword performed based on Table 4 according to the first permutation unit of the interleaver defined in claim 9 and (ii) in bit permutation of the codeword after permutation of the N cyclic blocks performed according to the second permutation unit of the interleaver defined in claim 9.

12. A signal processor provided in a receiver for a communication system with quasi-cyclic low-density parity-check codes, spatial multiplexing, and T transmit antennas, T being an integer greater than 1, wherein
the signal processing comprising:
a demodulator configured to demodulate signals based on modulation schemes and generate demodulated signals, said signals being transmitted by mapping information generated from T constellation words according to said modulation schemes that each correspond to T constellation words, each T constellation words making up one of a plurality of spatial-multiplexing blocks generated from a codeword at a transmission side, wherein
the codeword is composed of N cyclic blocks and each cyclic block is composed of Q bits, where N=45 and Q=360,
each spatial-multiplexing block is composed of B bits and T constellation words, where B=6 and T=2,
T constellation words are composed of a 4-QAM constellation word and a 16-QAM constellation word, and
a transmission power ratio is 1/4;
an LDPC decoder configured to decode the demodulated signals based on a quasi-cyclic low-density parity-check code used at the transmission side among quasi-cyclic low-density parity-check codes having code rates of 7/15, 8/15, and 3/5 as defined by the DVB-NGH standard; and an outputter configured to output the demodulated signal to the LDPC decoder, based on rules used (i) in permutation of the N cyclic blocks of the codeword performed based on Table 7 according to the first permutation unit of the interleaver defined in claim 10 and (ii) in bit permutation of the codeword after permutation of the N cyclic blocks performed according to the second permutation unit of the interleaver defined in claim 10.

* * * * *